(12) United States Patent  
Miura et al.

(10) Patent No.: US 12,128,772 B2  
(45) Date of Patent: Oct. 29, 2024

(54) SEMICONDUCTOR UNIT, BATTERY UNIT, AND VEHICLE

(71) Applicant: ROHM CO., LTD., Kyoto (JP)

(72) Inventors: Mineo Miura, Kyoto (JP); Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 653 days.

(21) Appl. No.: 17/288,825

(22) PCT Filed: Oct. 30, 2019

(86) PCT No.: PCT/JP2019/042652  
§ 371 (c)(1),  
(2) Date: Apr. 26, 2021

(87) PCT Pub. No.: WO2020/090924  
PCT Pub. Date: May 7, 2020

(65) Prior Publication Data  
US 2021/0354563 A1  Nov. 18, 2021

(30) Foreign Application Priority Data  
Nov. 2, 2018 (JP) ................................ 2018-207434

(51) Int. Cl.  
*B60L 3/00* (2019.01)  
*B60L 50/51* (2019.01)  
(Continued)

(52) U.S. Cl.  
CPC .............. *B60L 3/003* (2013.01); *B60L 50/51* (2019.02); *H02H 9/02* (2013.01); *H02M 1/08* (2013.01);  
(Continued)

(58) Field of Classification Search  
None  
See application file for complete search history.

(56) References Cited

U.S. PATENT DOCUMENTS

| 4,954,917 A | 9/1990 | Wirth |
| 5,859,772 A | 1/1999 | Hilpert |
| | (Continued) | |

FOREIGN PATENT DOCUMENTS

| CN | 1453918 A | 11/2003 |
| DE | 196 39 279 A1 | 4/1998 |
| | (Continued) | |

OTHER PUBLICATIONS

Office Action issued in corresponding German Patent Application No. 11 2019 005 478.3, Jul. 14, 2023, and machine translation (18 pages).

(Continued)

*Primary Examiner* — Leigh M Garbowski  
(74) *Attorney, Agent, or Firm* — HSML P.C.

(57) ABSTRACT

A semiconductor unit is arranged between a motor and an inverter circuit that controls the motor. The semiconductor unit includes a transistor and a controller. The transistor is arranged between the inverter circuit and a positive electrode of a battery that supplies power to the inverter circuit, and controls supplying of power from the battery to the inverter circuit. The controller is connected to a control terminal of the transistor, and controls a control voltage that is a voltage applied to the control terminal. When power starts to be supplied from the battery to the inverter circuit, the controller controls the control voltage to intermittently operate the transistor and also decreases the control voltage, which is applied to the control terminal of the transistor, to be lower than the control voltage at which the transistor is fully activated.

21 Claims, 47 Drawing Sheets

(51) Int. Cl.
*H02H 9/02* (2006.01)
*H02M 1/08* (2006.01)
*H02M 1/32* (2007.01)
*H03K 3/53* (2006.01)

(52) U.S. Cl.
CPC ............. *H02M 1/32* (2013.01); *H03K 3/53* (2013.01); *B60L 2270/20* (2013.01)

(56) References Cited

U.S. PATENT DOCUMENTS

| | | | |
|---|---|---|---|
| 6,323,717 B1 | 11/2001 | Omura et al. | |
| 6,934,141 B2* | 8/2005 | Hamano | H01H 9/542 361/160 |
| 7,688,606 B2* | 3/2010 | Amano | H02H 9/001 363/49 |
| 8,884,309 B2* | 11/2014 | Miura | H01L 25/072 257/77 |
| 10,128,651 B2* | 11/2018 | Matsushita | H02H 9/001 |
| 11,121,570 B2* | 9/2021 | Kube | H03K 17/122 |
| 11,909,329 B2* | 2/2024 | Miura | H02H 7/008 |
| 2003/0202296 A1 | 10/2003 | Hamano et al. | |
| 2005/0083097 A1 | 4/2005 | Bayerer | |
| 2006/0187604 A1 | 8/2006 | Ohshima | |
| 2006/0279890 A1 | 12/2006 | Lott | |
| 2007/0108959 A1 | 5/2007 | Amano | |
| 2009/0066404 A1 | 3/2009 | Heppenstall et al. | |
| 2010/0163922 A1 | 7/2010 | Yoneda et al. | |
| 2011/0234177 A1 | 9/2011 | Kohara et al. | |
| 2011/0278918 A1 | 11/2011 | Shindo et al. | |
| 2011/0297964 A1 | 12/2011 | Miura | |
| 2013/0009624 A1 | 1/2013 | Tagome | |
| 2014/0111171 A1 | 4/2014 | Kosugi | |
| 2015/0035464 A1 | 2/2015 | Maekawa et al. | |
| 2016/0181794 A1 | 6/2016 | Kimura et al. | |
| 2016/0226238 A1 | 8/2016 | Matsushita et al. | |
| 2017/0162662 A1* | 6/2017 | Naito | H01L 29/41708 |
| 2018/0097390 A1 | 4/2018 | Kube | |

FOREIGN PATENT DOCUMENTS

| | | |
|---|---|---|
| DE | 102 55 602 A1 | 6/2004 |
| DE | 10 2005 027 013 A1 | 12/2006 |
| DE | 112014003904 T5 | 6/2016 |
| DE | 102016201506 A1 | 8/2016 |
| DE | 10 2016 209 354 A1 | 11/2017 |
| DE | 10 2016 219 098 A1 | 4/2018 |
| EP | 2368749 A2 | 9/2011 |
| EP | 2 593 949 B1 | 9/2016 |
| JP | H04354156 | 12/1992 |
| JP | H05111240 A | 4/1993 |
| JP | H05-235722 A | 9/1993 |
| JP | H06222845 A | 8/1994 |
| JP | 2003324843 | 11/2003 |
| JP | 2005065459 | 3/2005 |
| JP | 2005137060 | 5/2005 |
| JP | 2006340390 A | 12/2006 |
| JP | 2007143221 A | 6/2007 |
| JP | 2008235405 A | 10/2008 |
| JP | 2010161009 | 7/2010 |
| JP | 2010259241 | 11/2010 |
| JP | 2011055695 A | 3/2011 |
| JP | 2011211761 | 10/2011 |
| JP | 2011254387 | 12/2011 |
| JP | 2012064677 | 3/2012 |
| JP | 2013027095 A | 2/2013 |
| JP | 2013045847 | 3/2013 |
| JP | 2013198202 | 9/2013 |
| JP | 2014087180 A | 5/2014 |
| JP | 2015065802 | 4/2015 |
| JP | 2015138824 A | 7/2015 |
| JP | 2017017839 A | 1/2017 |
| JP | 2018011411 | 1/2018 |
| JP | 2018046647 A | 3/2018 |

OTHER PUBLICATIONS

Notice of Reasons for Refusal issued for Japanese Patent Application No. 2020-553997, Dispatch date: Jun. 6, 2023, 12 pages including English machine translation.
Notice of Reasons for Refusal issued for Japanese Patent Application No. 2020-553998, Dispatch date: Jun. 6, 2023, 10 pages including English machine translation.
Office Action issued for U.S. Appl. No. 17/288,833, dated Dec. 6, 2022, 17 pages.
Notice of Reasons for Refusal issued for Japanese Patent Application No. 2020-553999, Dispatch Date: Jun. 27, 2023, 8 pages including English machine translation.
Office Action issued for Chinese Patent Application No. 201980070740.3, dated Feb. 8, 2023, 26 pages including partial English machine translation.
International Search Report and Written Opinion issued for International Patent Application No. PCT/JP2019/042652, Date of mailing: Nov. 26, 2019, 10 pages including English translation of Search Report.
International Preliminary Report on Patentability issued for International Patent Application No. PCT/JP2019/042651, Date of issuance: Apr. 27, 2021, 14 pages including English translation.
International Preliminary Report on Patentability issued for International Patent Application No. PCT/JP2019/042652, Date of issuance: Apr. 27, 2021, 14 pages including English translation.
International Preliminary Report on Patentability issued for International Patent Application No. PCT/JP2019/042653, Date of issuance: Apr. 27, 2021, 16 pages including English translation.
Office Action issued for U.S. Appl. No. 17/288,827, dated Aug. 10, 2023, 46 pages.
Office Action issued for German Patent Application No. 11 2019 005 495.3, dated May 11, 2023, 13 pages including English machine translation.
Office Action issued for German Patent Application No. 11 2019 005 468.6, dated May 11, 2023, 12 pages including English machine translation.
Notice of Reasons for Refusal issued for Japanese Patent Application No. 2020-553997, Dispatch Date: Oct. 24, 2023, 10 pages including English machine translation.
Notice of Reasons for Refusal issued for Japanese Patent Application No. 2020-553998, Dispatch Date: Oct. 31, 2023, 10 pages including English machine translation.
Office Action issued for Chinese Patent Application No. 201980070751.1, dated Sep. 27, 2023, 11 pages including partial English machine translation.
Decision of Refusal issued for Japanese Patent Application No. 2020-553999, Dispatch Date: Nov. 14, 2023, 4 pages including English machine translation.
Reconsideration Report by Examiner before Appeal issued for Japanese Patent Application No. 2020-553999, dated May 20, 2024, 4 pages including English machine translation.

* cited by examiner

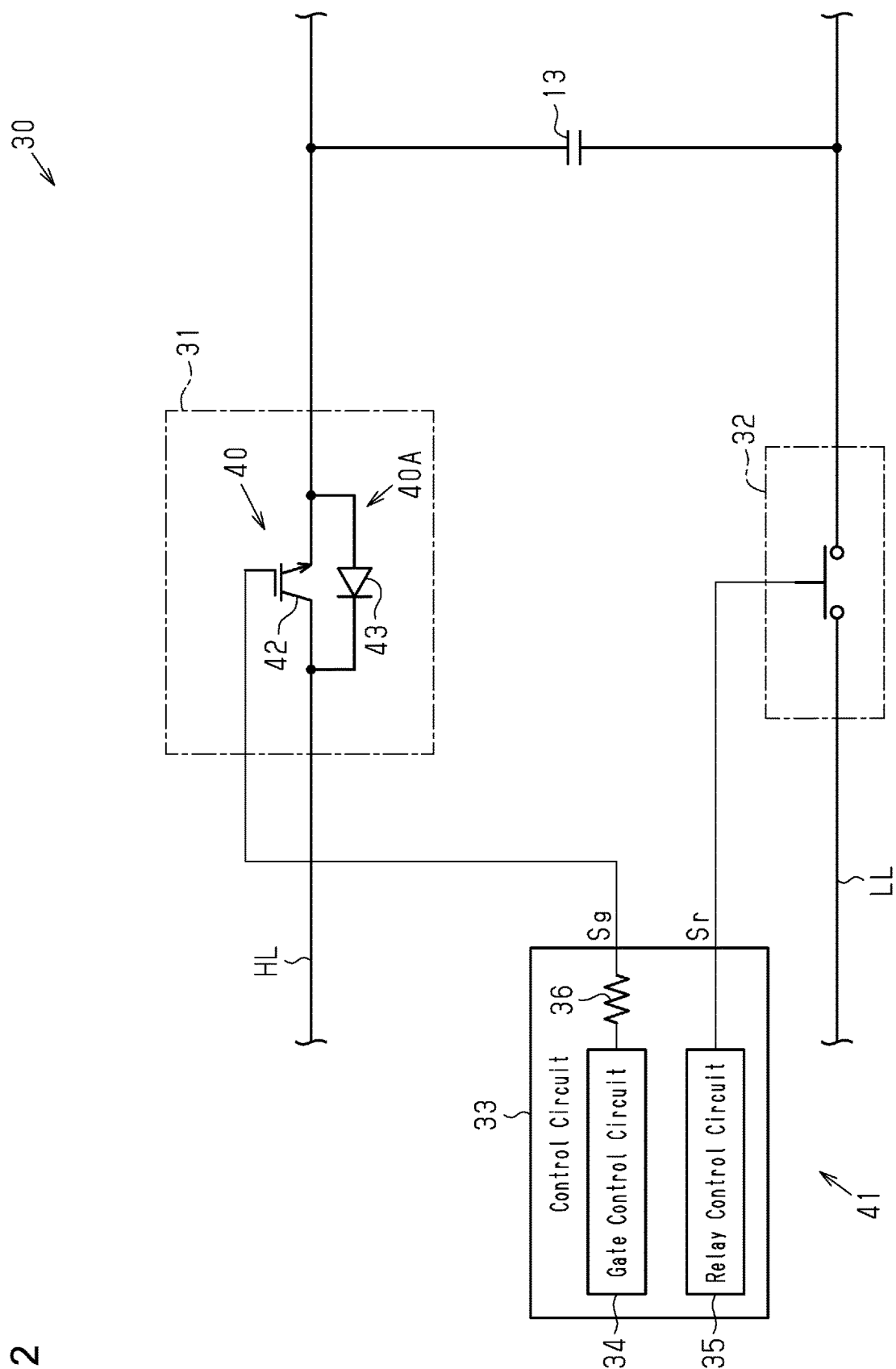

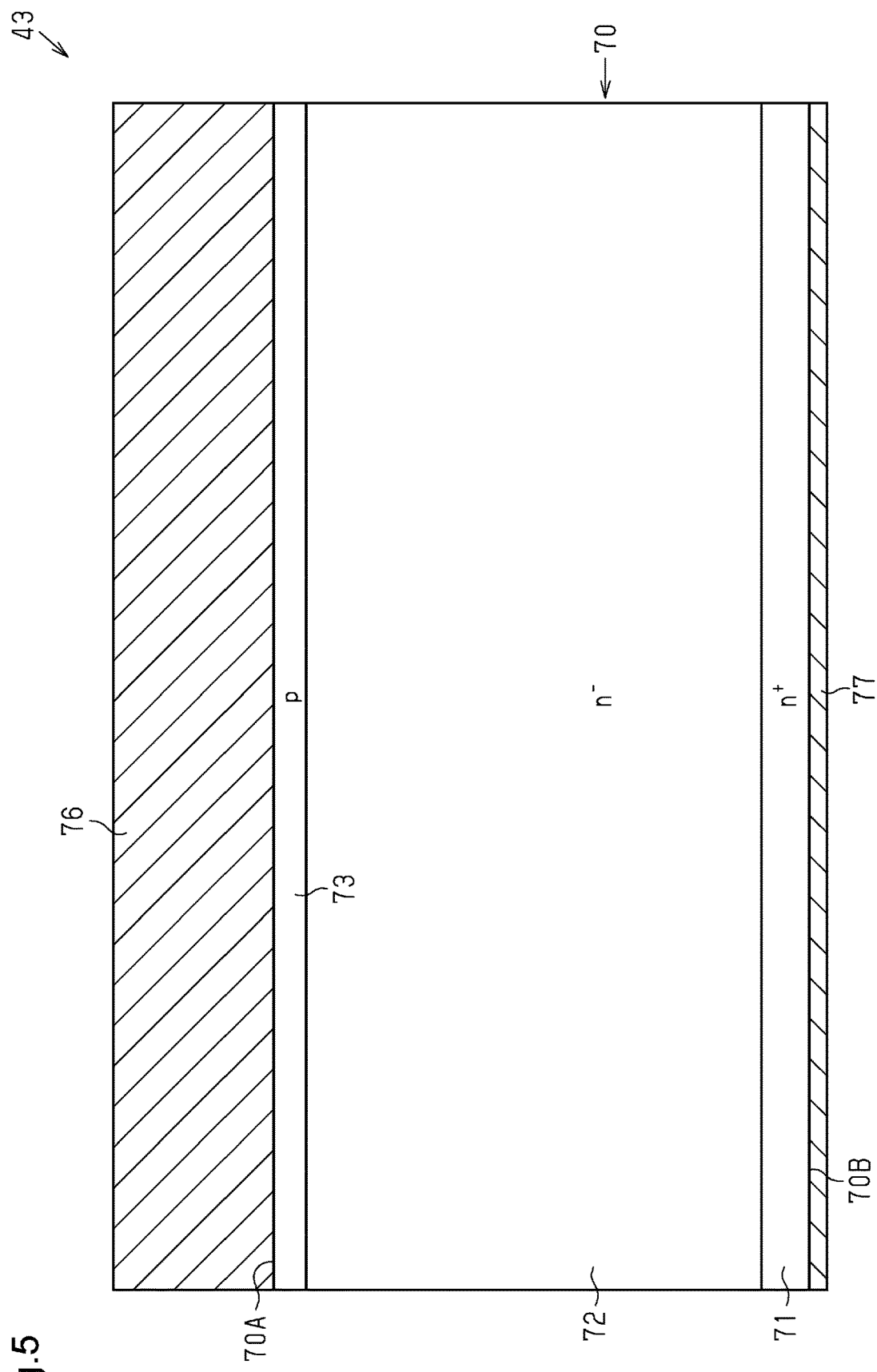

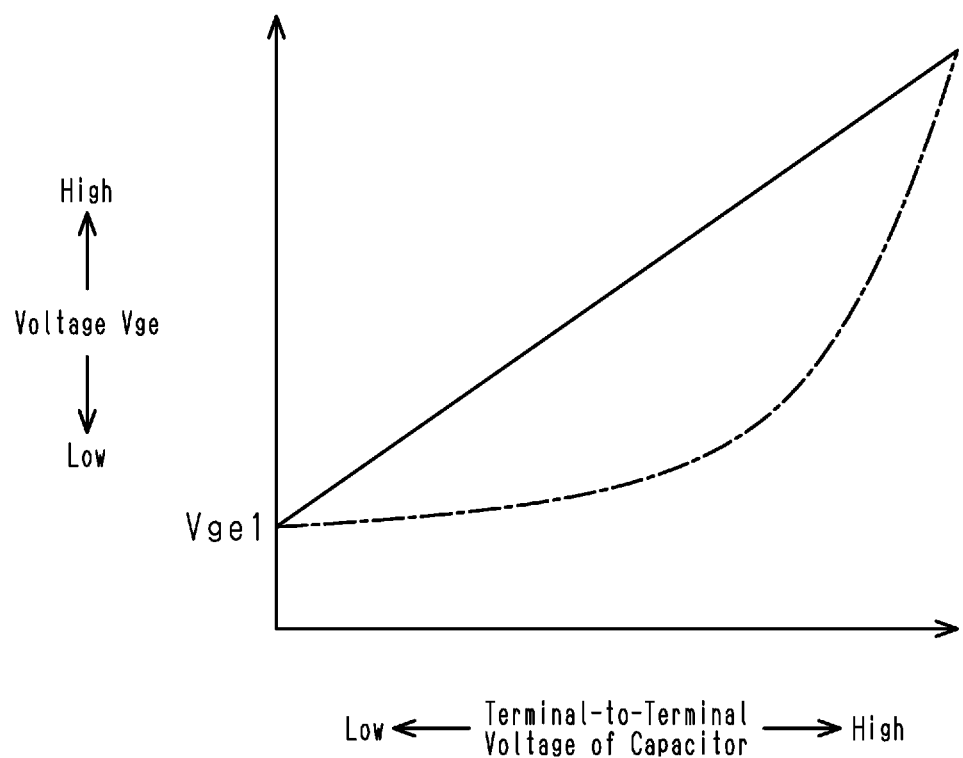

- Prior Art -

SEMICONDUCTOR UNIT, BATTERY UNIT, AND VEHICLE

TECHNICAL FIELD

The present disclosure relates to a semiconductor unit, a battery unit, and a vehicle.

BACKGROUND ART

As shown in FIG. 53, for example, a motor-driven vehicle such as a hybrid car or an electric car includes a battery 210, an inverter circuit 230 that controls a motor 220 driving the motor-driven vehicle, and a relay unit 200 arranged between a positive electrode of the battery 210 and the inverter circuit 230. The relay unit 200 includes a main relay 201, which is a mechanical contact type relay, and a relay circuit 202 connected in parallel to the main relay 201 and used for pre-charging (refer to, for example, Patent Document 1). A capacitor 240 is arranged between the relay unit 200 and the inverter circuit 230. The pre-charging relay circuit 202 is configured to avoid a flow of an inrush current into the inverter circuit from the battery and includes a mechanical contact type relay 203 and a current limiting resistor 204 that are connected in series.

PRIOR ART DOCUMENT

Patent Document

Patent Document 1: Japanese Laid-Open Patent Publication No. 2010-161009

SUMMARY OF THE INVENTION

Problems that the Invention is to Solve

When the pre-charging relay circuit 202 limits the inrush current flowing from the battery 210 to the capacitor 240, the current limiting resistor 204 consumes most of the power. The current limiting resistor 204 needs to have a large resistance value in order to limit inrush currents. Since the power is consumed by the current limiting resistor 204, the resistor needs to be increased in size.

It is an object of the present disclosure to provide a semiconductor unit, a battery unit, and a vehicle that achieve reduction in the size and weight of a relay unit.

Means for Solving the Problems

To achieve the above object, a semiconductor unit a is arranged between a motor and an inverter circuit that controls the motor. The semiconductor unit includes a transistor and a controller. The transistor is arranged between the inverter circuit and a positive electrode of a battery that supplies power to the inverter circuit. The transistor is configured to control supply of power from the battery to the inverter circuit. The controller is connected to a control terminal of the transistor. The controller controls a control voltage that is a voltage applied to the control terminal. When power starts to be supplied from the battery to the inverter circuit, the controller controls the control voltage to intermittently operate the transistor and also decreases the control voltage, which is applied to the control terminal of the transistor, to be lower than the control voltage at which the transistor is fully activated.

In this configuration, the transistor is used as a pre-charging relay circuit. That is, the relay unit does not have to include a current limiting resistor that limits an inrush current from the battery. Thus, the relay unit is reduced in size and weight.

Effects of the Invention

As described above, the semiconductor unit, the battery unit, and the vehicle achieve reduction in the size and weight of the relay unit.

BRIEF DESCRIPTION OF THE DRAWINGS

FIG. 2 is a circuit diagram schematically showing an electrical configuration of the relay unit shown in FIG. 1 and its surroundings.

FIG. 5 is a schematic cross-sectional view of a diode.

FIG. 8 is a cross-sectional view of the semiconductor module taken along line 8-8 in

FIG. 7.

Figure 46A:
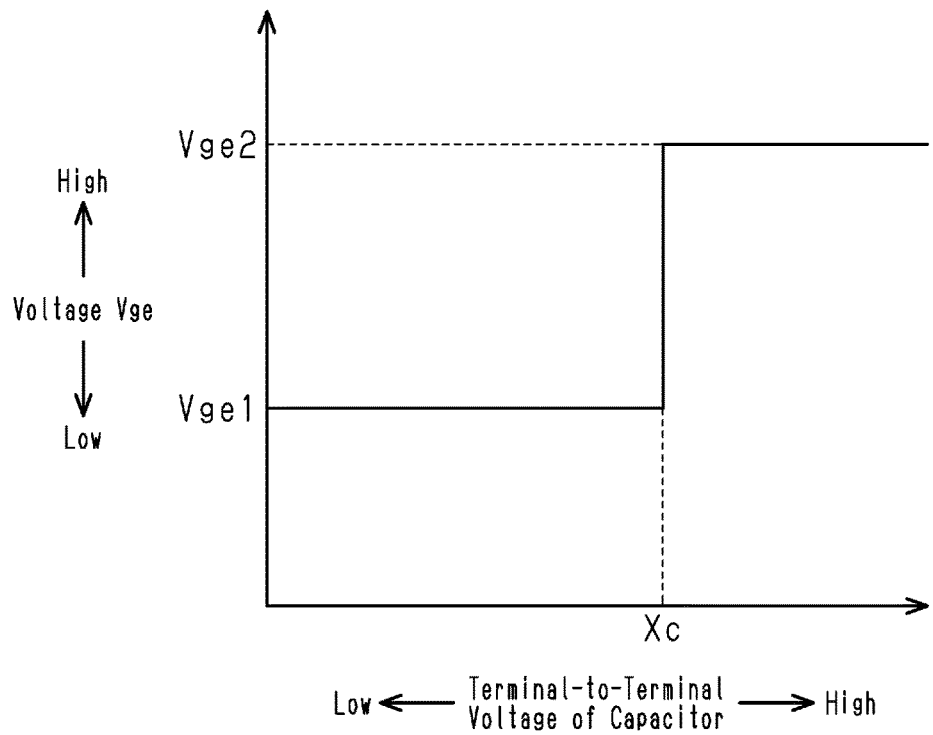
Figure 46B:
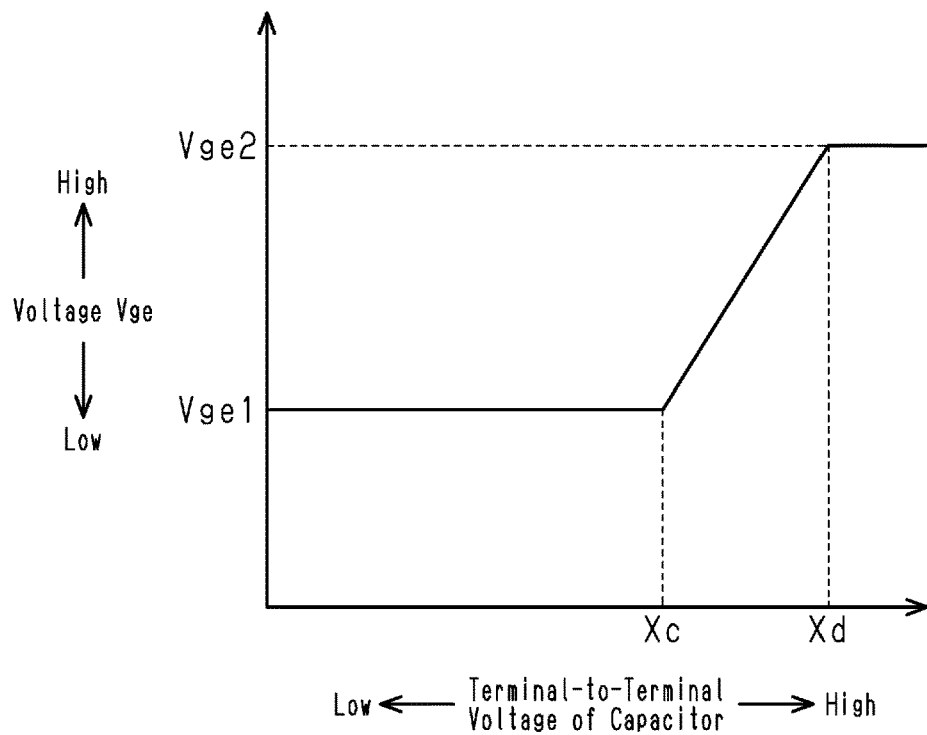

Each of FIGS. 46A and 46B is a map showing a relationship between a terminal-to-terminal voltage of a capacitor and a gate-emitter voltage in a modified example of a semiconductor unit.

FIG. 47 is a map showing a relationship between a terminal-to-terminal voltage of a capacitor and a gate-emitter voltage in a modified example of a semiconductor unit.

Figure 48A:
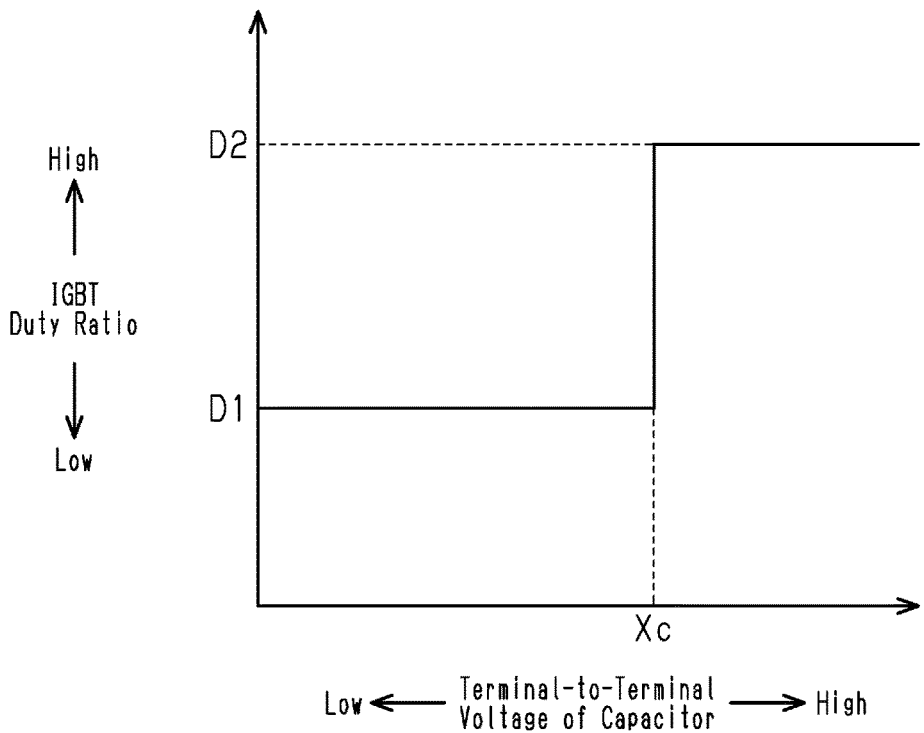
Figure 48B:
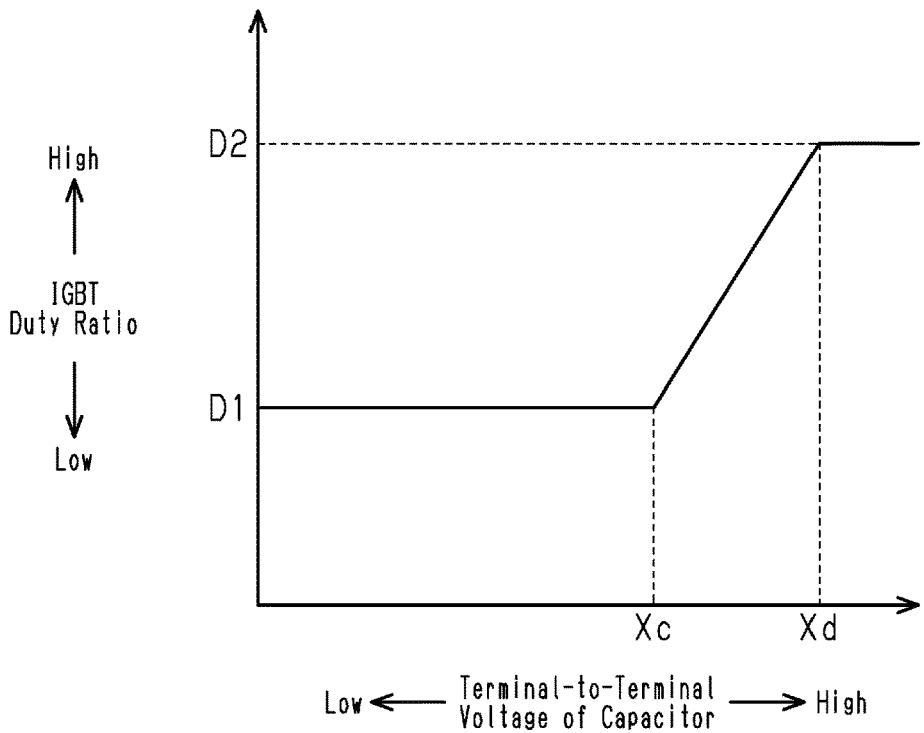

Each of FIGS. 48A and 48B is a map showing a relationship between a terminal-to-terminal voltage of a capacitor and a duty ratio of an IGBT in a modified example of a semiconductor unit.

Figure 49:
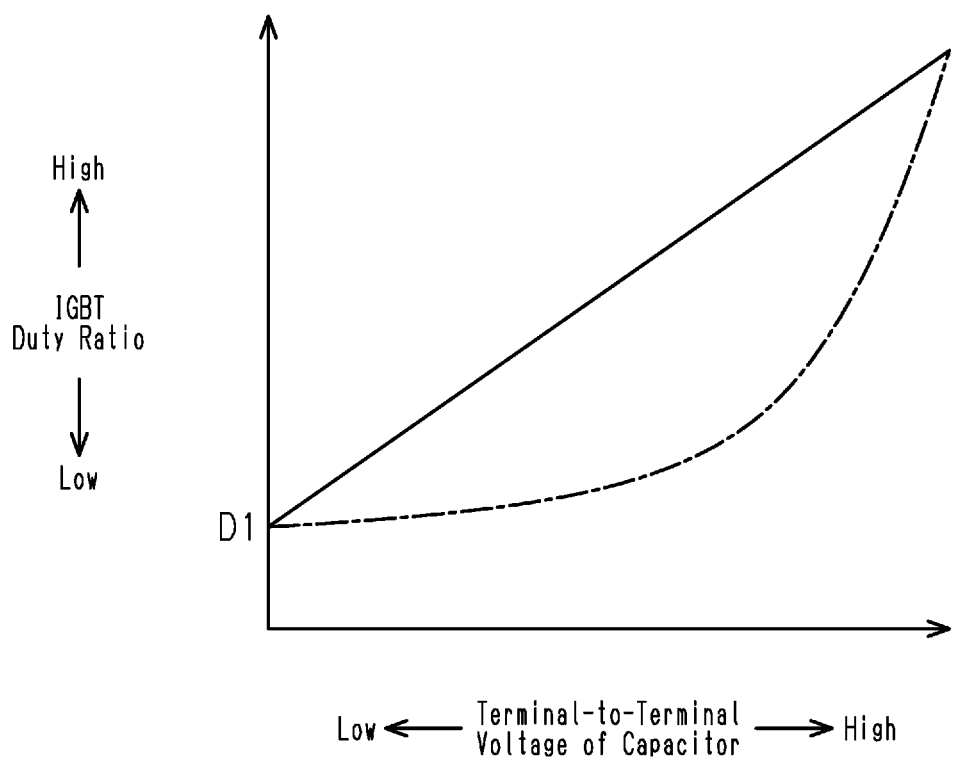

FIG. 49 is a map showing a relationship between a terminal-to-terminal voltage of a capacitor and a duty ratio of an IGBT in a modified example of a semiconductor unit.

Figure 50:
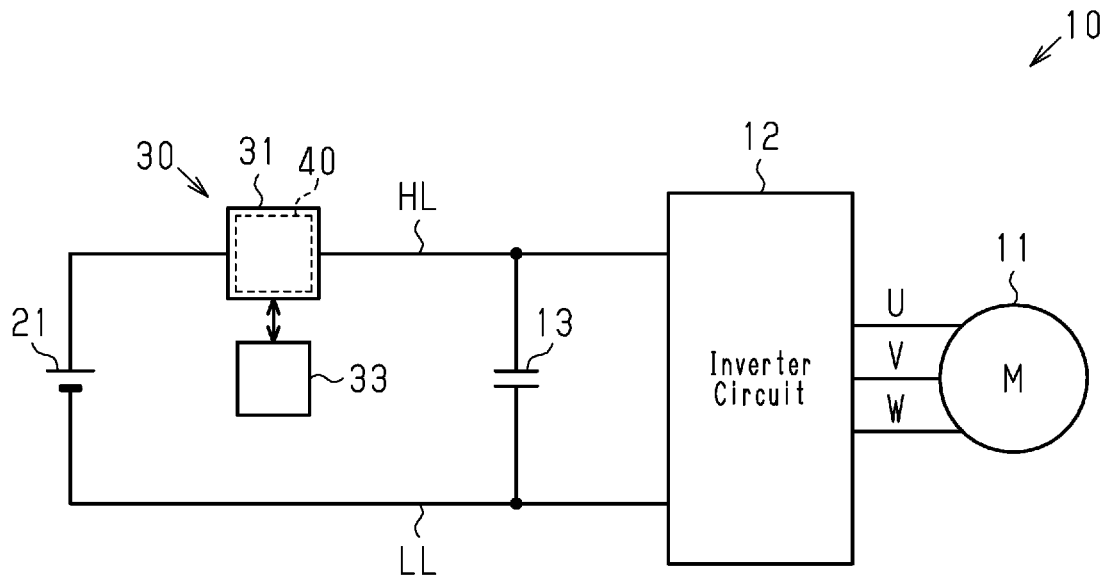

FIG. 50 is a circuit diagram schematically showing a modified example of a relay unit and its surroundings.

Figure 51:
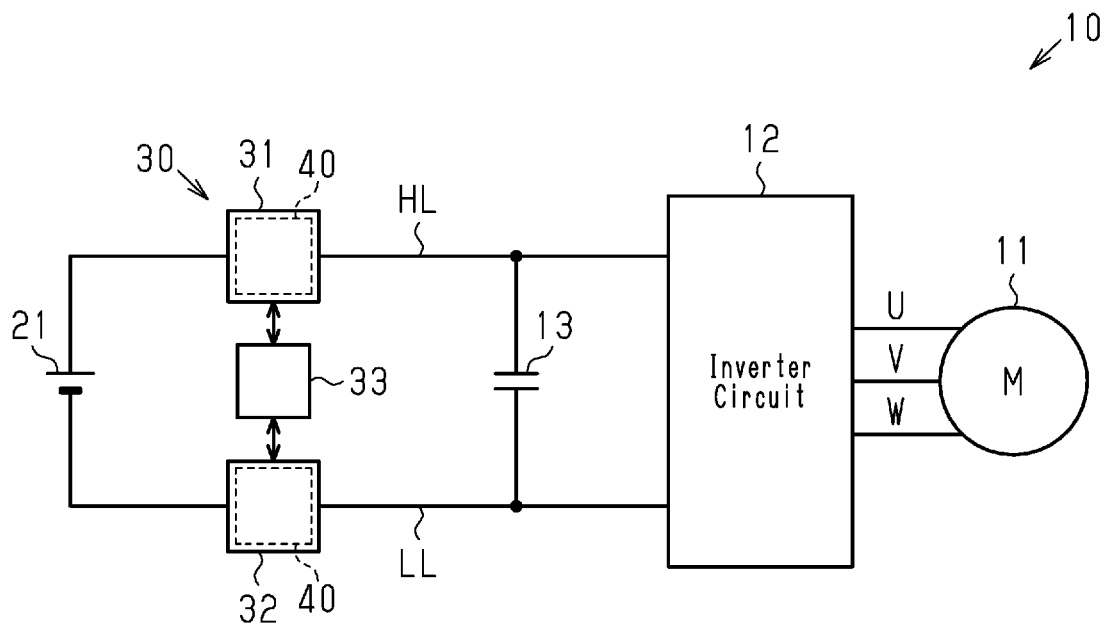

FIG. 51 is a circuit diagram schematically showing a modified example of a relay unit and its surroundings.

Figure 52:
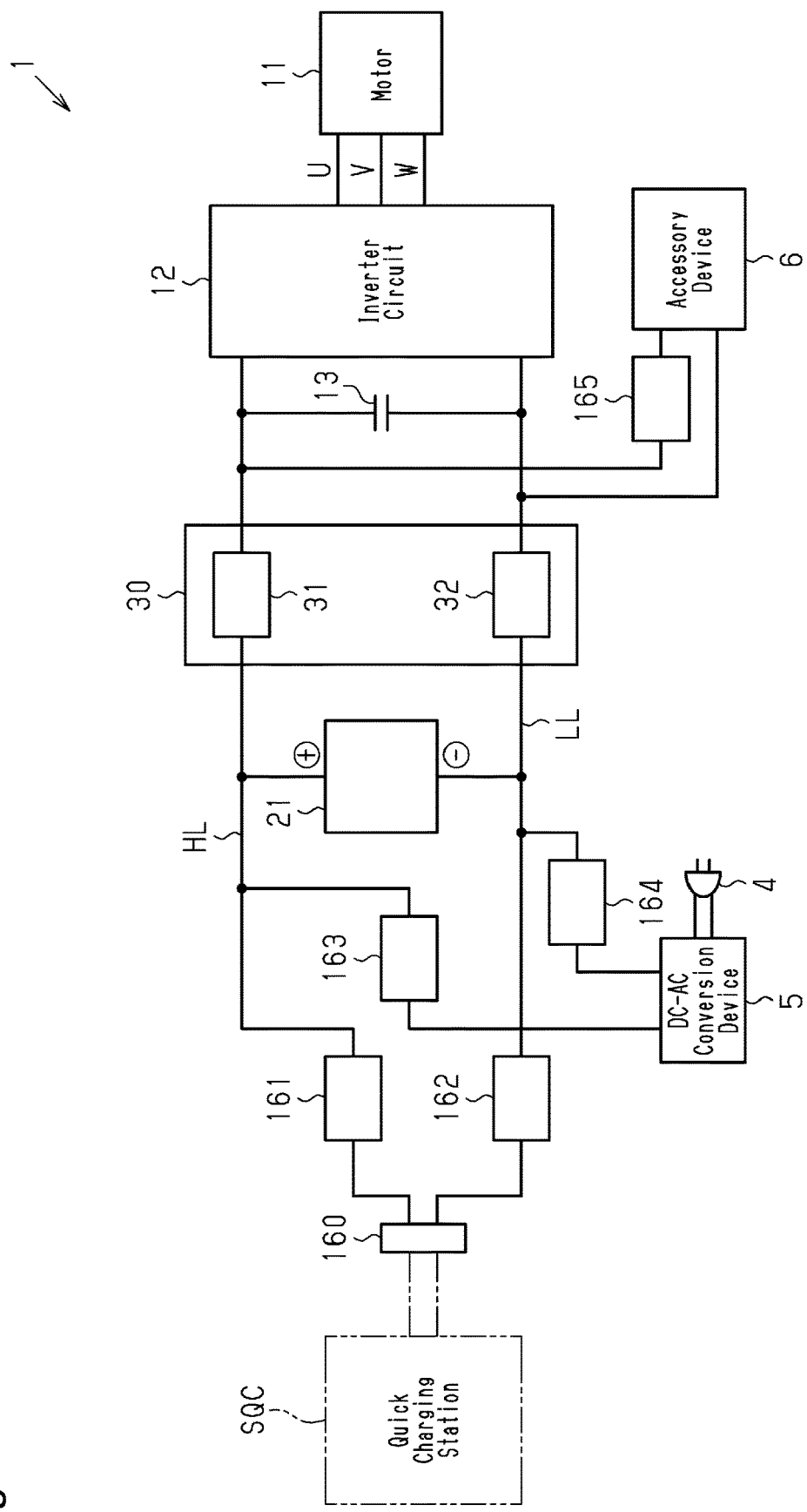

FIG. 52 is a block diagram schematically showing an electrical configuration of part of a modified example of a vehicle.

Figure 53:
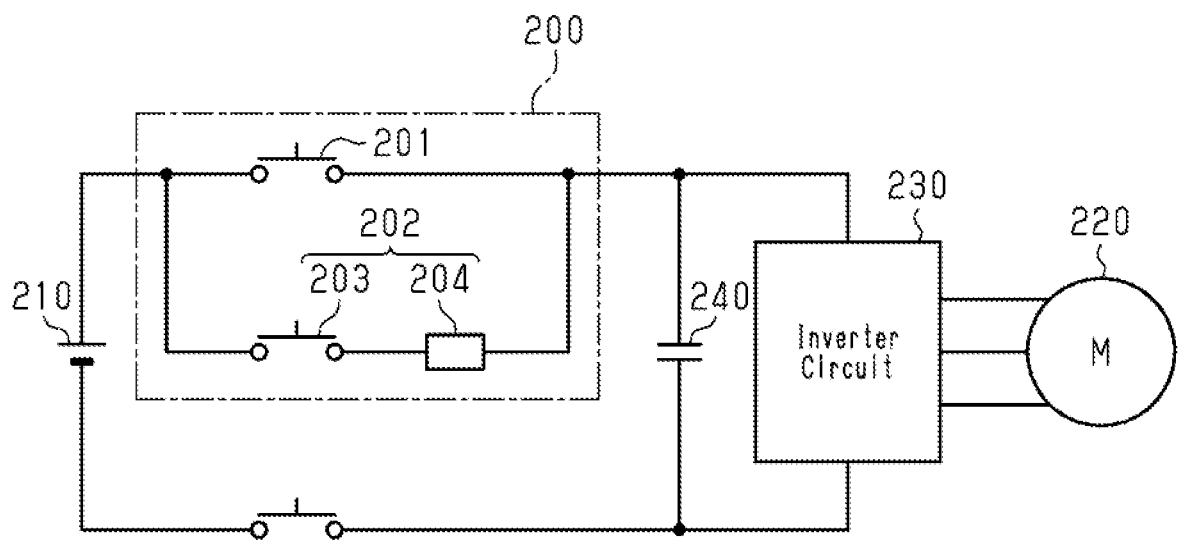

FIG. 53 is a circuit diagram schematically showing a conventional relay unit and its surroundings.

MODES FOR CARRYING OUT THE INVENTION

Embodiments of a semiconductor device, a semiconductor module, a semiconductor unit, a relay unit, a battery unit, and a vehicle will be described below with reference to the drawings. The embodiments described below exemplify configurations and methods for embodying a technical concept and are not intended to limit the material, shape, structure, arrangement, dimensions, and the like of each component to the description. The embodiments described below may undergo various modifications.

In the present specification, "a state in which member A is connected to member B" includes a case in which member A and member B are directly connected physically and a case in which member A and member B are indirectly connected by another member that does not affect the electric connection state.

Similarly, "a state in which member C is arranged between member A and member B" includes a case in which member A is directly connected to member C or member B is directly connected to member C and a case in which member A is indirectly connected to member C by another member that does not affect the electric connection state or member B is indirectly connected to member C by another member that does not affect the electric connection state.

First Embodiment

Figure 1:
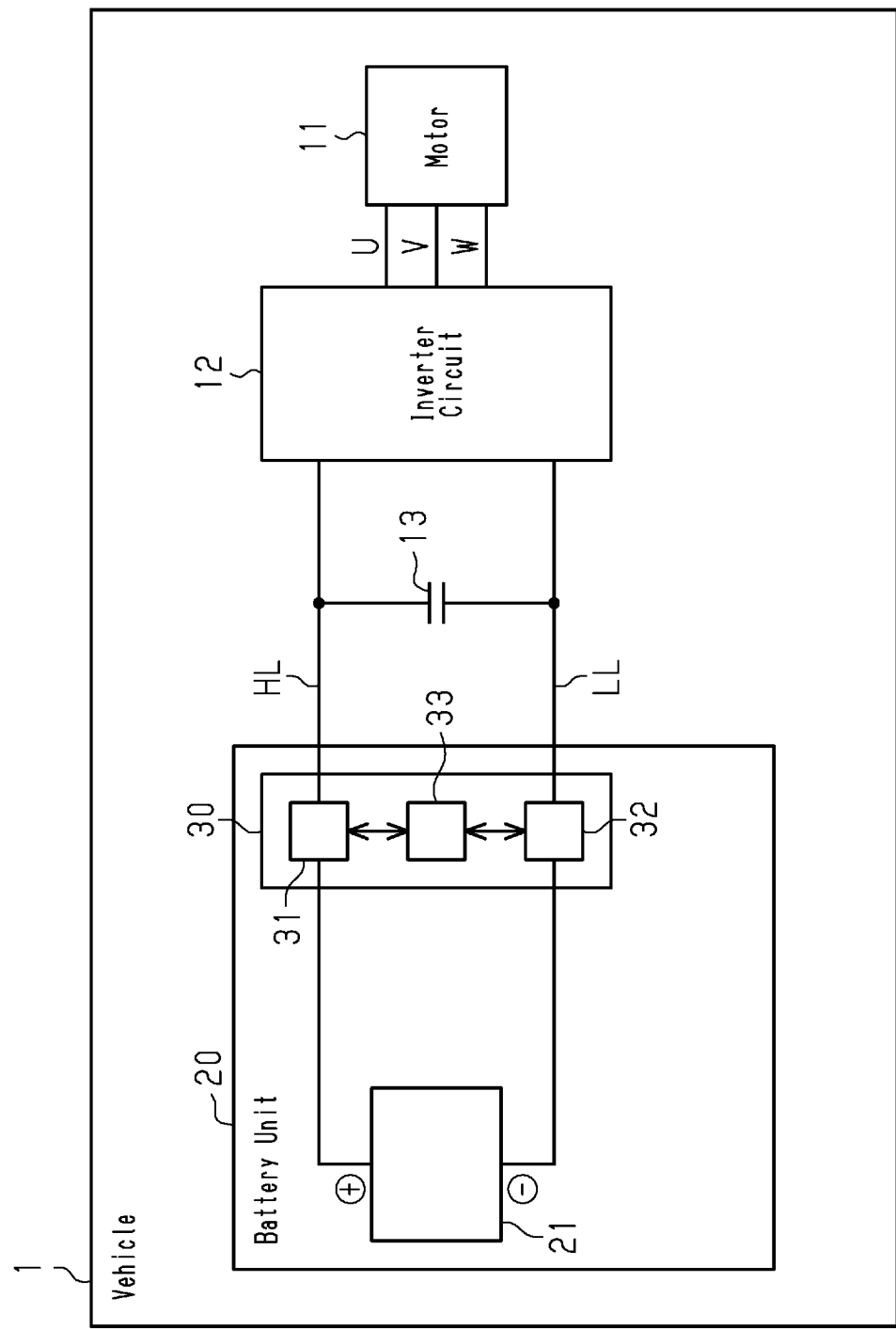
FIG. 1 is a block diagram schematically showing an electrical configuration of part of a vehicle including a first embodiment of a semiconductor device.

As shown in FIG. 1, a vehicle 1 is a motor-driven vehicle such as a hybrid car or an electric car and includes a battery unit 20, a motor 11, an inverter circuit 12, and a capacitor 13. The motor 11 is connected to the inverter circuit 12. In an example, the motor 11 is a three-phase alternating current (AC) motor. For example, a three-phase induction motor may be used as the three-phase AC motor. The inverter circuit 12 is electrically connected to the battery unit 20 by a high-voltage line HL and a low-voltage line LL. The inverter circuit 12 converts output power of the battery unit 20 into AC power (e.g., U-phase, V-phase, and W-phase AC power) that drives the motor 11. The capacitor 13 is arranged between the battery unit 20 and the inverter circuit 12. The capacitor 13 is connected in parallel to the inverter circuit 12. An example of the capacitor 13 is a film capacitor or an electrolytic capacitor.

The battery unit 20 includes a battery module 21, which is an example of a battery including battery cells, and a relay unit 30 that controls a flow state of current from the battery module 21. The battery module 21 and the relay unit 30 are accommodated in a case (not shown), so that the battery unit 20 is integrated. An example of a battery cell is a lithium-ion battery. The battery module 21 has a positive electrode and a negative electrode connected to the relay unit 30. The relay unit 30 is arranged between the battery module 21 and the inverter circuit 12. More specifically, the relay unit 30 is arranged on the high-voltage line HL and the low-voltage line LL between the battery module 21 and the capacitor 13. No boost circuit is arranged between the relay unit 30 and the capacitor 13.

The relay unit 30 includes a first relay 31, a second relay 32, and a control circuit 33, which is an example of a controller. The first relay 31 is arranged on the high-voltage line HL between the positive electrode of the battery module 21 and the inverter circuit 12. The second relay 32 is arranged on the low-voltage line LL between the negative electrode of the battery module 21 and the inverter circuit 12.

The control circuit 33 controls the first relay 31 and the second relay 32. The control circuit 33, for example, activates the first relay 31 and the second relay 32 when a start switch (main switch) of the vehicle 1 is switched on, and deactivates the first relay 31 and the second relay 32 when the start switch is switched off. Activation and deactivation of the first relay 31 and the second relay 32 control the supply of current and interruption of the supply from the battery module 21 to the inverter circuit 12 and the supply of current and interruption of the supply from the inverter circuit 12 to the battery module 21.

During driving operation of the vehicle 1, which supplies power to the motor 11 from the battery module 21 through the inverter circuit 12, the value of current supplied from the battery module 21 to the inverter circuit 12 is, for example, 400 A. During regenerative operation such as braking, which supplies kinetic energy of the motor 11 to the battery module 21 through the inverter circuit 12 as electric power, the value of current supplied from the inverter circuit 12 to the battery module 21 is, for example, 400 A. Thus, the first relay 31 allows the current to flow from the battery module 21 to the inverter circuit 12 and flow from the inverter circuit 12 to the battery module 21.

FIG. 2 is a circuit diagram of the relay unit 30.

The first relay 31 arranged on the high-voltage line HL includes a semiconductor module 40. The second relay 32 arranged on the low-voltage line LL is a mechanical contact type relay. The relay unit 30 includes a semiconductor unit 41 including the semiconductor module 40 and a gate control circuit 34.

The semiconductor module 40 includes a semiconductor device 40A. The semiconductor device 40A is arranged between the positive electrode of the battery module 21 (refer to FIG. 1) and the inverter circuit 12 (refer to FIG. 1), which is electrically connected to the battery module 21.

The semiconductor device 40A includes an insulated gate bipolar transistor 42 (IGBT), which is an example of a transistor, and a diode 43 connected in antiparallel to the IGBT 42. More specifically, the emitter of the IGBT 42 is connected to an anode of the diode 43, and the collector of the IGBT 42 is connected to a cathode of the diode 43.

The collector of the IGBT 42 is connected to the positive electrode of the battery module 21. More specifically, the collector of the IGBT 42 is an example of a first terminal of the semiconductor device 40A connected to the positive electrode of the battery module 21. The emitter of the IGBT 42 is connected to an upper switching element of the inverter circuit 12. More specifically, the emitter of the IGBT 42 is an example of a second terminal of the semiconductor device 40A connected to the inverter circuit 12. The emitter of the IGBT 42 is also connected to a first terminal of the capacitor 13. The second relay 32 is connected to a second terminal of the capacitor 13.

The IGBT 42 is formed from a silicon (Si) device and is configured to have a collector-emitter withstand voltage of 600 V in the deactivation state. The diode 43 is formed from a silicon (Si) device and is configured to have a withstand voltage (reverse voltage VR) of 600 V. That is, in the present embodiment, the collector-emitter withstand voltage of the IGBT 42 is equal to the withstand voltage of the diode 43.

The control circuit 33 includes the gate control circuit 34 and a relay control circuit 35.

The gate control circuit 34 is electrically connected to the gate of the IGBT 42. The gate control circuit 34 generates a gate drive signal Sg, which is a voltage signal applied to the gate of the IGBT 42, and outputs the gate drive signal Sg to the gate of the IGBT 42. The IGBT 42 is operated based on the gate drive signal Sg.

The relay control circuit 35 is electrically connected to the second relay 32. The relay control circuit 35 generates a control signal Sr, which controls activation and deactivation of the second relay 32, and outputs the control signal Sr to the second relay 32. The second relay 32 is activated and deactivated based on the control signal Sr.

A current limiting resistor 36 is arranged between the gate control circuit 34 and the semiconductor module 40. More specifically, the current limiting resistor 36 is arranged between the gate control circuit 34 and the gate of the IGBT 42. Preferably, the current limiting resistor 36 is greater than or equal to 100Ω. In the present embodiment, the current limiting resistor 36 is 500Ω.

Figure 3A:
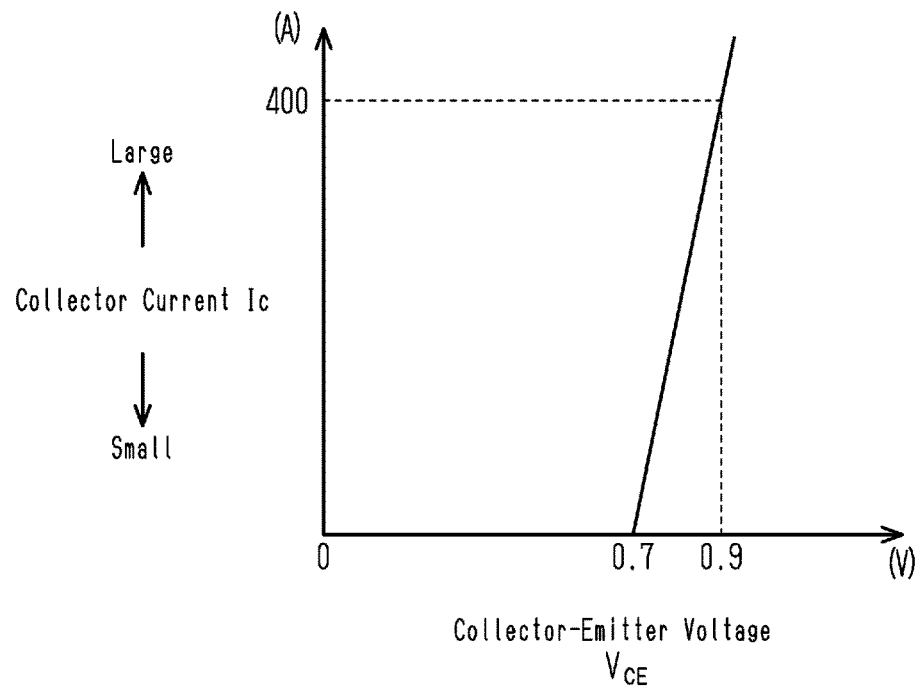
FIG. 3A is a graph showing a relationship between a collector current flowing to an IGBT of the semiconductor device and a collector-emitter voltage during driving operation of the vehicle.
Figure 3B:
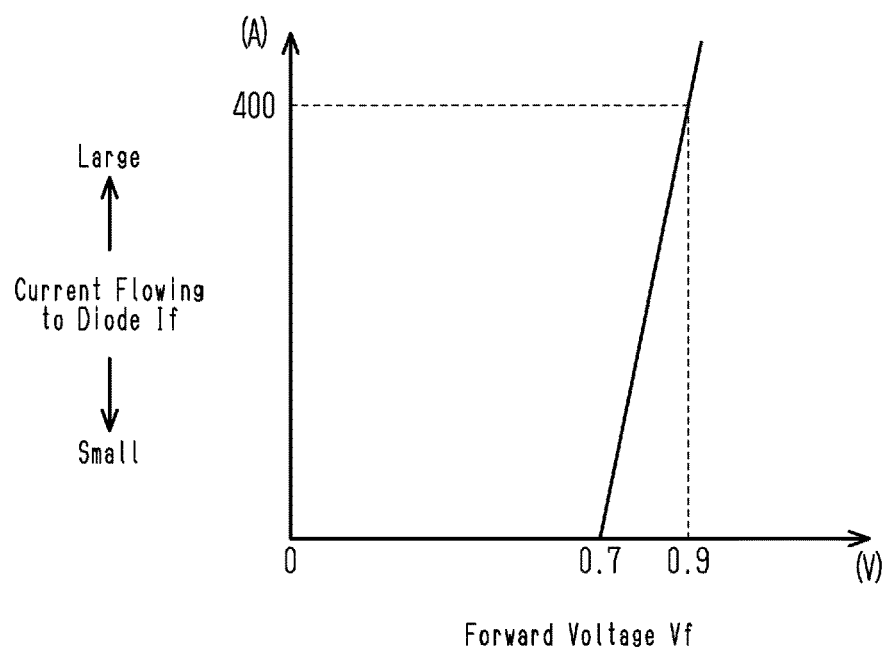
FIG. 3B is a graph showing a relationship between a current flowing to a diode of the semiconductor device and a forward voltage during regenerative operation of the vehicle.

In the semiconductor module 40 configured as described above, a current flows through the IGBT 42 during driving operation of the vehicle 1, and a current flows through the diode 43 during regenerative operation of the vehicle 1. FIG. 3A shows an example of the relationship between a total collector current Ic flowing to the IGBT 42 and a collector-emitter voltage $V_{CE}$ of the IGBT 42 during driving operation of the vehicle 1. FIG. 3B shows an example of the relationship between current If flowing to the diode 43 and a forward voltage Vf of the diode 43 during driving operation of the vehicle 1.

IGBT Structure

The structure of the IGBT 42 will be described with reference to FIGS. 4A and 4B.

Figure 4A:
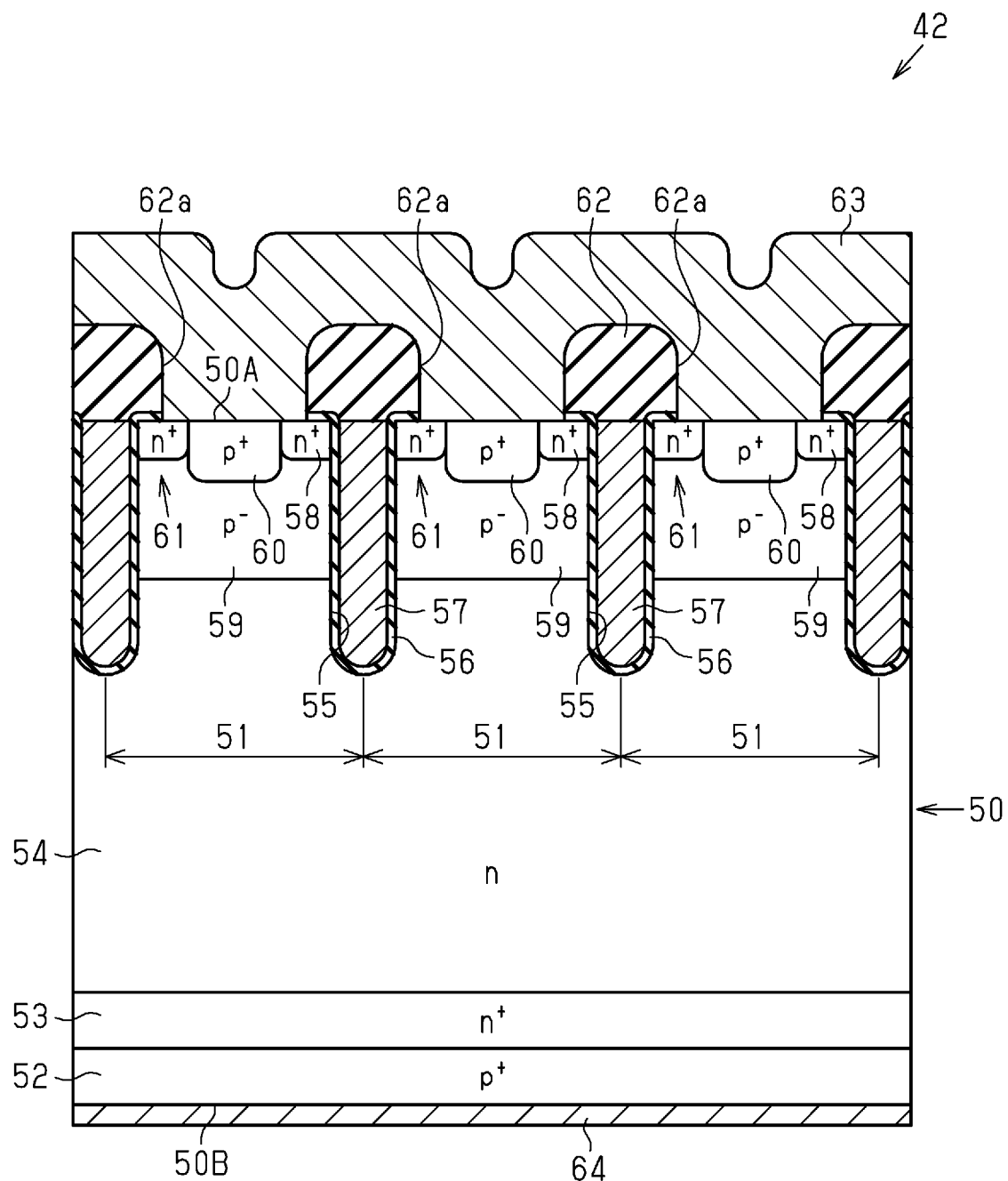
FIG. 4A is a schematic cross-sectional view of the IGBT of the first embodiment.

As shown in FIG. 4A, the IGBT 42 is a trench gate IGBT. The IGBT 42 includes an n type semiconductor substrate 50. The semiconductor substrate 50 is, for example, a silicon substrate and includes a front surface 50A and a rear surface 50B, which are located at opposite sides of the semiconductor substrate 50. The semiconductor substrate 50 has a front region in which unit cells 51 are formed as part of the IGBT 42.

The semiconductor substrate 50 includes a p$^+$ type collector region 52, an n$^+$ type buffer region 53, and an n type drift region 54 in the order from the side of the rear surface 50B. The collector region 52 and the buffer region 53 are formed in the rear region of the semiconductor substrate 50.

The collector region 52 is exposed from the rear surface 50B of the semiconductor substrate 50. The collector region 52 includes boron (B) as a p type impurity. The buffer region 53 is formed on the collector region 52 and is in contact with the collector region 52. The drift region 54 is formed using part of the semiconductor substrate 50. Part of the drift region 54 (not shown) is exposed from the front surface 50A of the semiconductor substrate 50. Each of the buffer region 53 and the drift region 54 includes one of phosphorus (P), arsenic (As), and antimony (Sb) as an n type impurity.

Gate trenches 55 are formed in the front region of the semiconductor substrate 50 at intervals. Each gate trench 55 extends through a base region 59 and has a bottom located in the drift region 54. A gate electrode 57 is embedded in the gate trench 55 with a gate insulation film 56 disposed between the gate electrode 57 and a wall of the gate trench 55. Along the gate trenches 55, $n^+$ type emitter regions 58, $p^-$ type base regions 59, and the drift region 54 are formed in order from the side of the front surface 50A of the semiconductor substrate 50 toward the rear surface 50B.

Each base region 59 is shared by two gate trenches 55 located at opposite sides of the base region 59. The emitter regions 58 are formed along opposite side surfaces of each gate trench 55 and are exposed from the front surface 50A of the semiconductor substrate 50. The emitter regions 58 include one of phosphorus (P), arsenic (As), and antimony (Sb) as an n type impurity. A $p^+$ type contact region 60 is formed in the front region of each base region 59 between the emitter regions 58. The base region 59 and the contact region 60 include boron (B) as a p type impurity.

The base region 59 includes a region between the drift region 54 and the emitter regions 58 defining a channel region 61. Thus, the unit cells 51 are formed as part of the IGBT 42. In the cross-sectional view in FIG. 4A, each unit cell 51 is defined as a region extending between the centerlines of two gate trenches 55 located at opposite sides of the unit cell 51.

An insulation film 62 is formed from, for example, silicon oxide ($SiO_2$) and is formed on the front surface 50A of the semiconductor substrate 50 to cover the gate trenches 55. Contact holes 62a are formed in the insulation film 62 and expose the contact regions 60 and part of the emitter regions 58. An emitter electrode 63 is formed from, for example, aluminum (e.g., AlSiCu, AlCu) and is formed on the insulation film 62. The emitter electrode 63 extends into the contact holes 62a from the insulation film 62 and is electrically connected to the emitter regions 58 and the contact regions 60 in the contact holes 62a.

A collector electrode 64 is formed from, for example, aluminum (e.g., AlSiCu, AlCu) and is formed on the rear surface 50B of the semiconductor substrate 50. The collector electrode 64 is electrically connected to the collector region 52.

As described above, when the start switch is switched on, the IGBT 42 is activated. Therefore, the IGBT 42 switches less frequently than, for example, the switching elements of the inverter circuit 12. The IGBT 42 having such a usage application does not have to operate at a high speed. The IGBT 42 maintains the activation state from when the start switch (main switch) of the vehicle 1 is switched on until the start switch is switched off. Therefore, it is preferred that the IGBT 42 has a small conduction loss.

In this regard, the IGBT 42 has a structure that reduces the operation speed, thereby reducing the conduction loss. The structure for reducing the conduction loss of the IGBT 42 will be described with reference to FIGS. 4A and 4B.

Figure 4B:
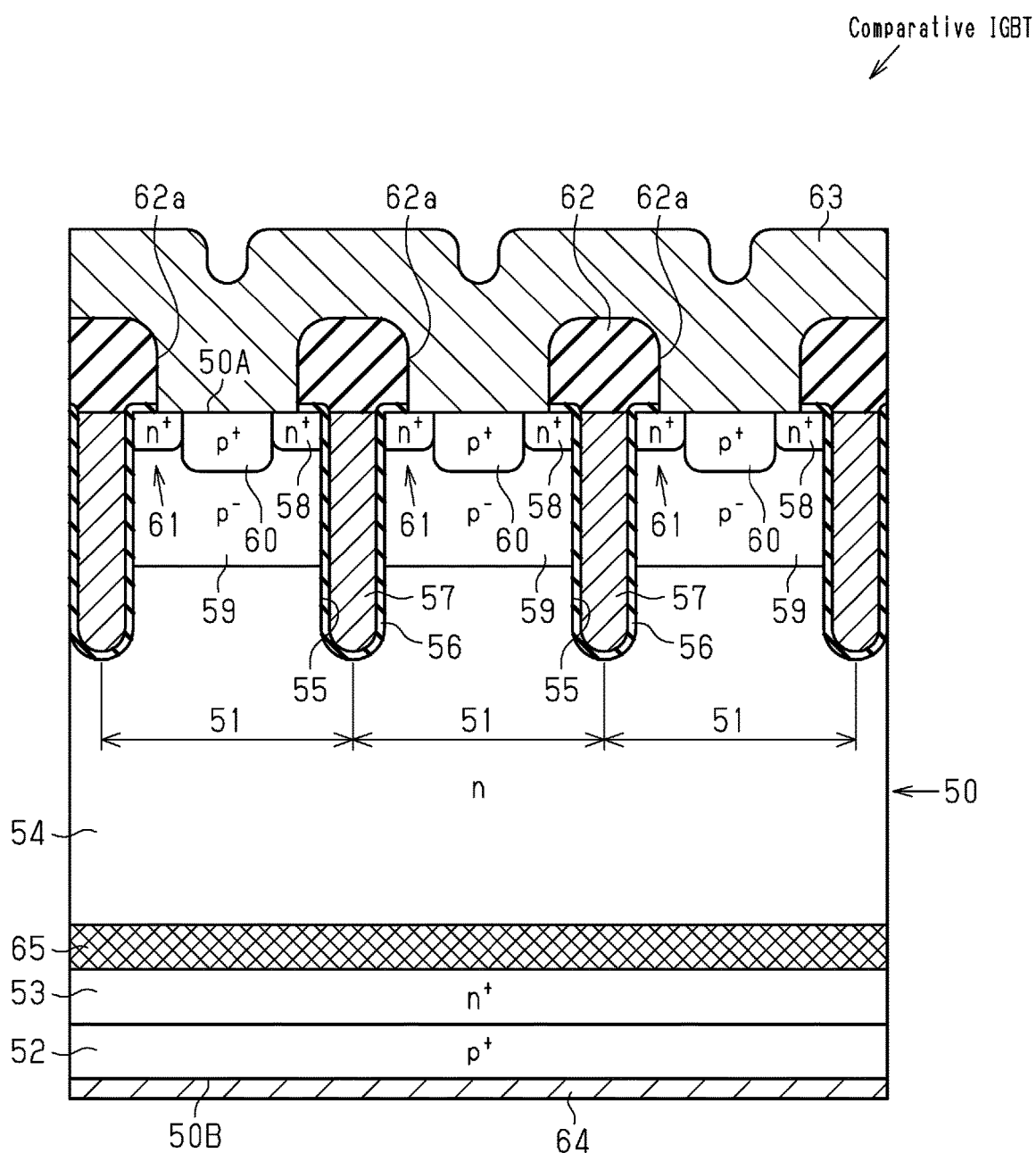
FIG. 4B is a schematic cross-sectional view of a comparative example of an IGBT.

FIG. 4B shows a configuration of a comparative IGBT used for a comparison with the configuration of the IGBT 42. The comparative IGBT differs in that a lattice defect layer 65 is formed and the collector region 52 has a different impurity concentration.

The lattice defect layer 65 is located between the drift region 54 and the buffer region 53. The lattice defect layer 65 is in contact with the drift region 54 and the buffer region 53. The lattice defect layer 65 is a high resistance layer to which lattice defects are introduced by a charged particle to have a higher specific electrical resistance (resistance value) than the collector region 52 and the buffer region 53. The charged particle is, for example, an n type impurity and argon (Ar).

When the charged particle is an n type impurity, the n type impurity exists in the lattice defect layer 65 without acting as a donor. That is, when the n type impurity is added, the lattice defect layer 65 remains inactive and the lattice defects are unrepaired. Thus, the lattice defect layer 65 is a high resistance layer having an increased specific electrical resistance (resistance value). When the charged particle is argon (Ar), the lattice defect concentration of the lattice defect layer 65 is increased from the lattice defect concentration of the buffer region 53. Thus, the lattice defect layer 65 is a high resistance layer having an increased specific electrical resistance (resistance value). The charged particle may be proton (W) or helium (He) instead of argon (Ar).

Since the lattice defect layer 65 controls the lifetime of minority carriers, the comparative IGBT is capable of high-speed switching. However, the conduction loss is increased due to the presence of the lattice defect layer 65 in the semiconductor substrate 50. The IGBT 42 of the present embodiment, which does not include the lattice defect layer 65, is not capable of high-speed switching but decreases the conduction loss.

In addition, the impurity concentration in the collector region 52 of the IGBT 42 is higher than the impurity concentration in the collector region 52 of the comparative IGBT. In an example, the impurity concentration of the comparative IGBT in the collector region 52 is 1E+16 $cm^{-3}$. Preferably, the impurity concentration in the collector region 52 of the IGBT 42 is greater than or equal to 1E+18 $cm^{-3}$. In the present embodiment, the impurity concentration in the collector region 52 of the IGBT 42 is 1E+18 $cm^{-3}$.

Diode Structure

The configuration of the diode 43 will now be described. FIG. 5 shows a cross-sectional structure of the diode 43.

The diode 43 includes an n type semiconductor substrate 70. The semiconductor substrate 70 is, for example, a silicon substrate and includes a front surface 70A and a rear surface 70B, which are located at opposite sides of the semiconductor substrate 70. The semiconductor substrate 70 includes an $n^+$ type region 71 and an $n^-$ type region 72 as a base substrate. The semiconductor substrate 70 is formed, for example, by epitaxially growing the $n^-$ type region 72 on the $n^+$ type region 71. The $n^+$ type region 71 and the $n^-$ type region 72 are semiconductor regions containing an n type impurity. The contained n type impurity may be, for example, nitrogen (N), phosphorus (P), or arsenic (As). The impurity concentration of the $n^+$ type region 71 is higher than the impurity concentration of the $n^-$ type region 72. In the present embodiment, the thickness of the $n^+$ type region 71 is less than the thickness of the n" type region 72. However, the thickness of the $n^+$ type region 71 may be greater than or equal to the thickness of the $n^-$ type region 72.

The n⁻ type region 72 has a front region in which a p type region 73 is formed. The p type region 73 is a semiconductor region containing a p type impurity. The contained p type impurity may be, for example, boron (B). In the present embodiment, the impurity concentration of the p type region 73 is increased to reduce the conduction loss of the diode 43. In an example, it is preferred that the impurity concentration of the p type region 73 is greater than or equal to $1E+17$ $cm^{-3}$. In the present embodiment, the impurity concentration of the p type region 73 is $1E+17$ $cm^{-3}$. The semiconductor substrate 70 includes a p-n junction between the p type region 73 and the n⁻ type region 72.

An anode electrode pad 76 is formed on the front surface 70A of the semiconductor substrate 70. The anode electrode pad 76 is connected to the p type region 73. A cathode electrode pad 77 is formed on the rear surface 70B of the semiconductor substrate 70. The cathode electrode pad 77 is connected to the n⁺ type region 71 on the rear surface 70B of the semiconductor substrate 70.

Configuration of Semiconductor Module 40

The configuration of the semiconductor module 40 will be described with reference to FIGS. 6 to 10.

Figure 6:
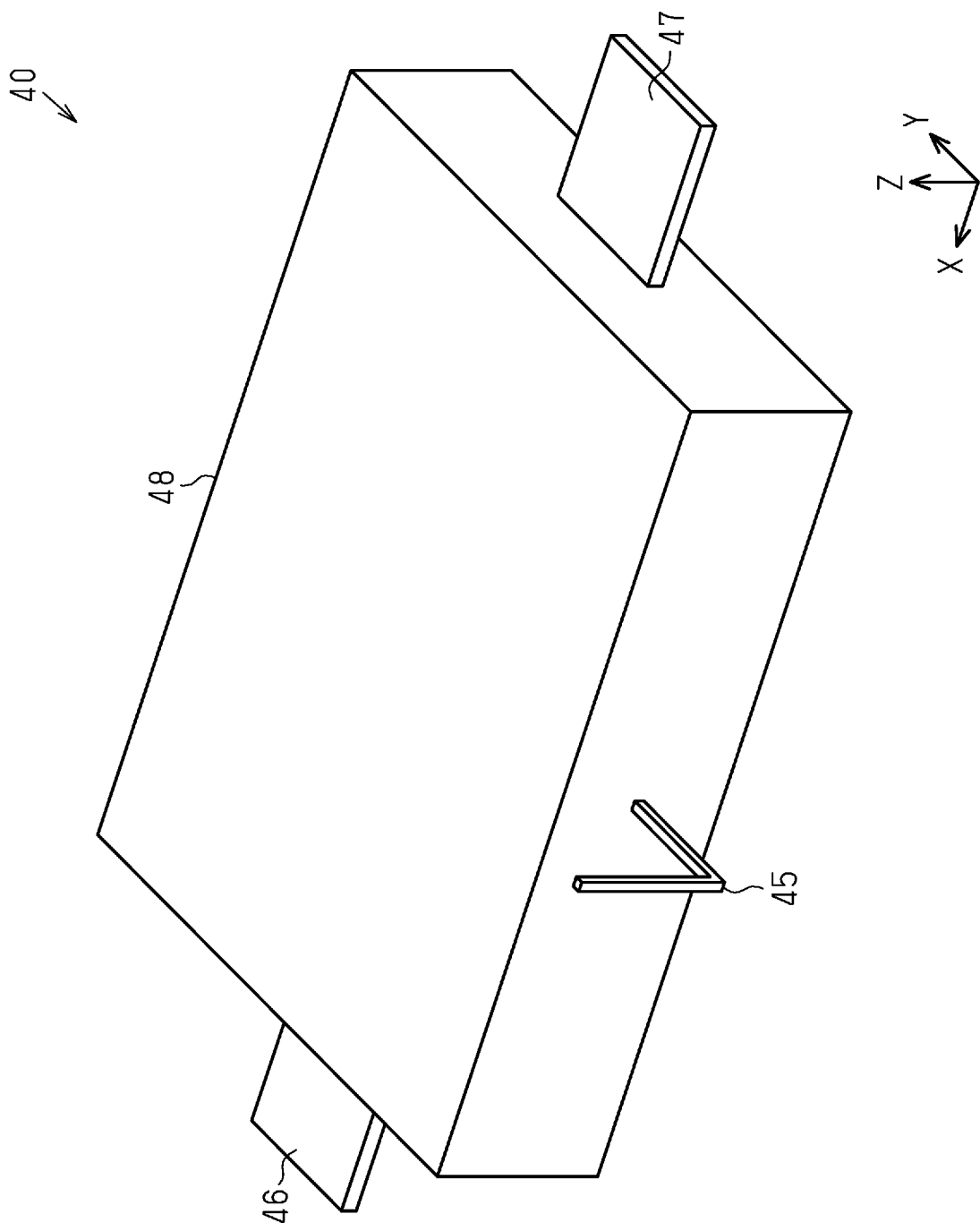
FIG. 6 is a perspective view of a semiconductor module including a semiconductor device.
Figure 7:
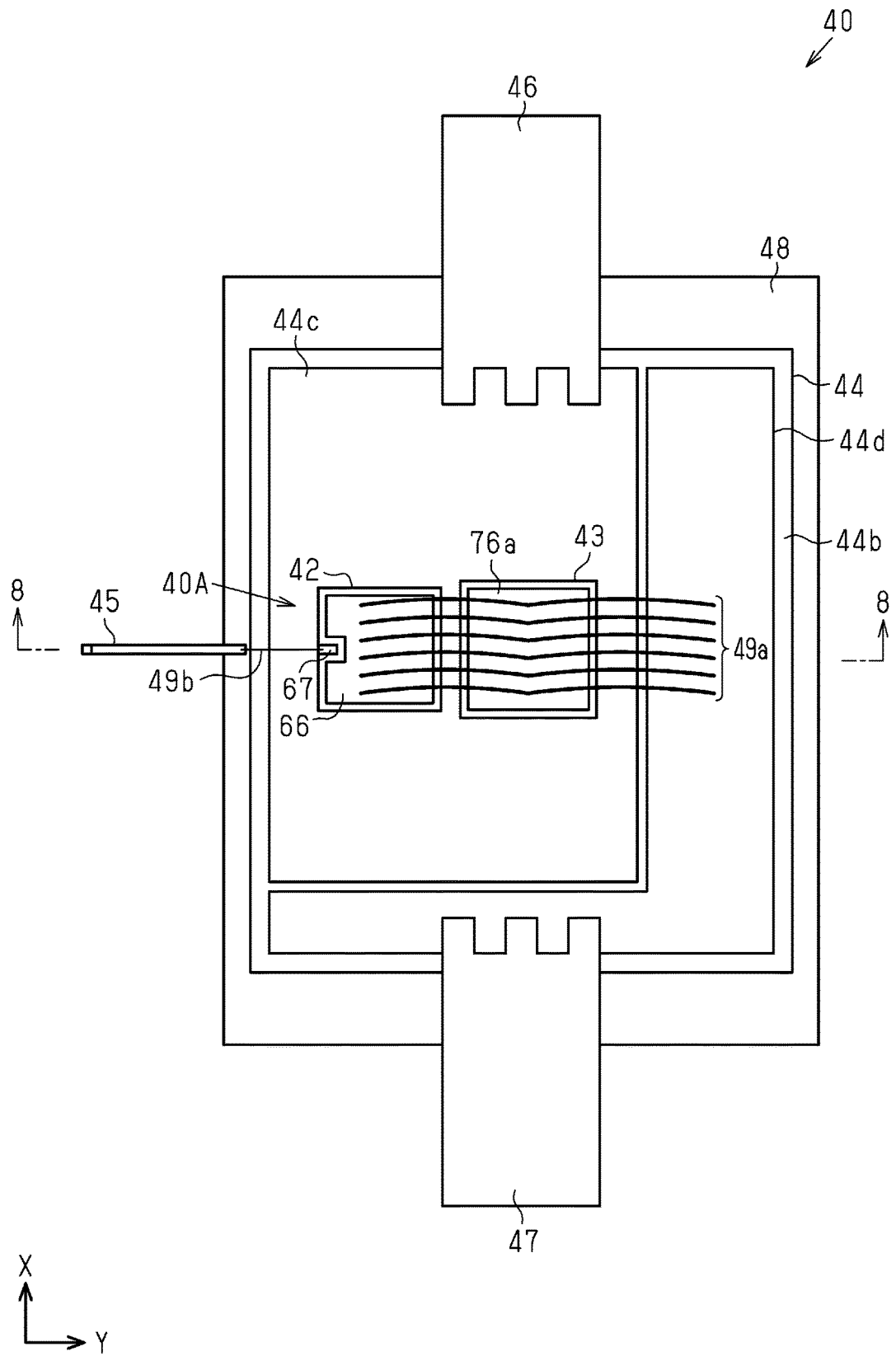
FIG. 7 is a schematic plan view of the semiconductor module showing a layout of the semiconductor device.

As shown in FIGS. 6 and 7, the semiconductor module 40 includes a control terminal 45, a connection terminal 46 for the battery unit 20 (refer to FIG. 1), and a connection terminal 47 for the inverter circuit 12 (refer to FIG. 1), which are projecting from an encapsulation resin 48 as external terminals. As shown in FIG. 7, the semiconductor module 40 includes the IGBT 42 and the diode 43 that are modularized in a single package. The semiconductor module 40 includes a metal substrate 44. The semiconductor module 40 is rectangular in plan view. In the description hereafter, the longitudinal direction of the semiconductor module 40 in plan view is defined as "the first direction X," a direction orthogonal to the first direction X in plan view is defined as "the second direction Y," and a direction orthogonal to the first direction X and the second direction Y is defined as "the third direction Z."

Figure 8:
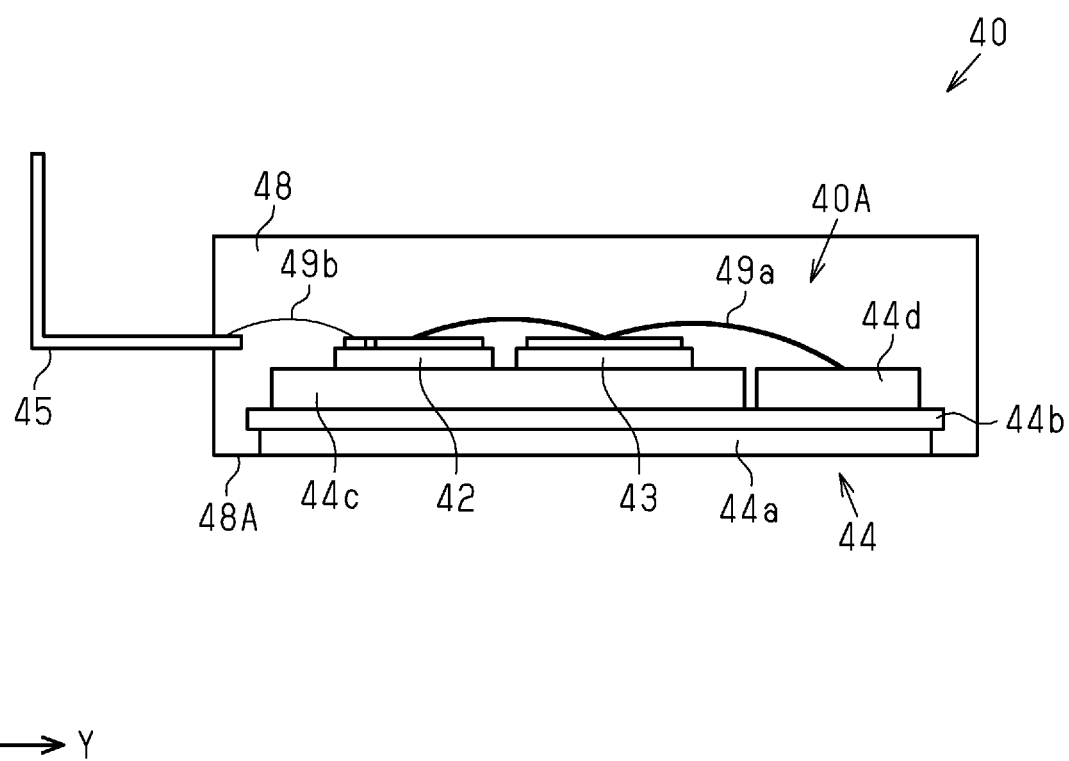

As shown in FIG. 8, the metal substrate 44 has a configuration in which a heat dissipation plate 44a, an insulation substrate 44b, a first wiring portion 44c, and a second wiring portion 44d are stacked.

Figure 9:
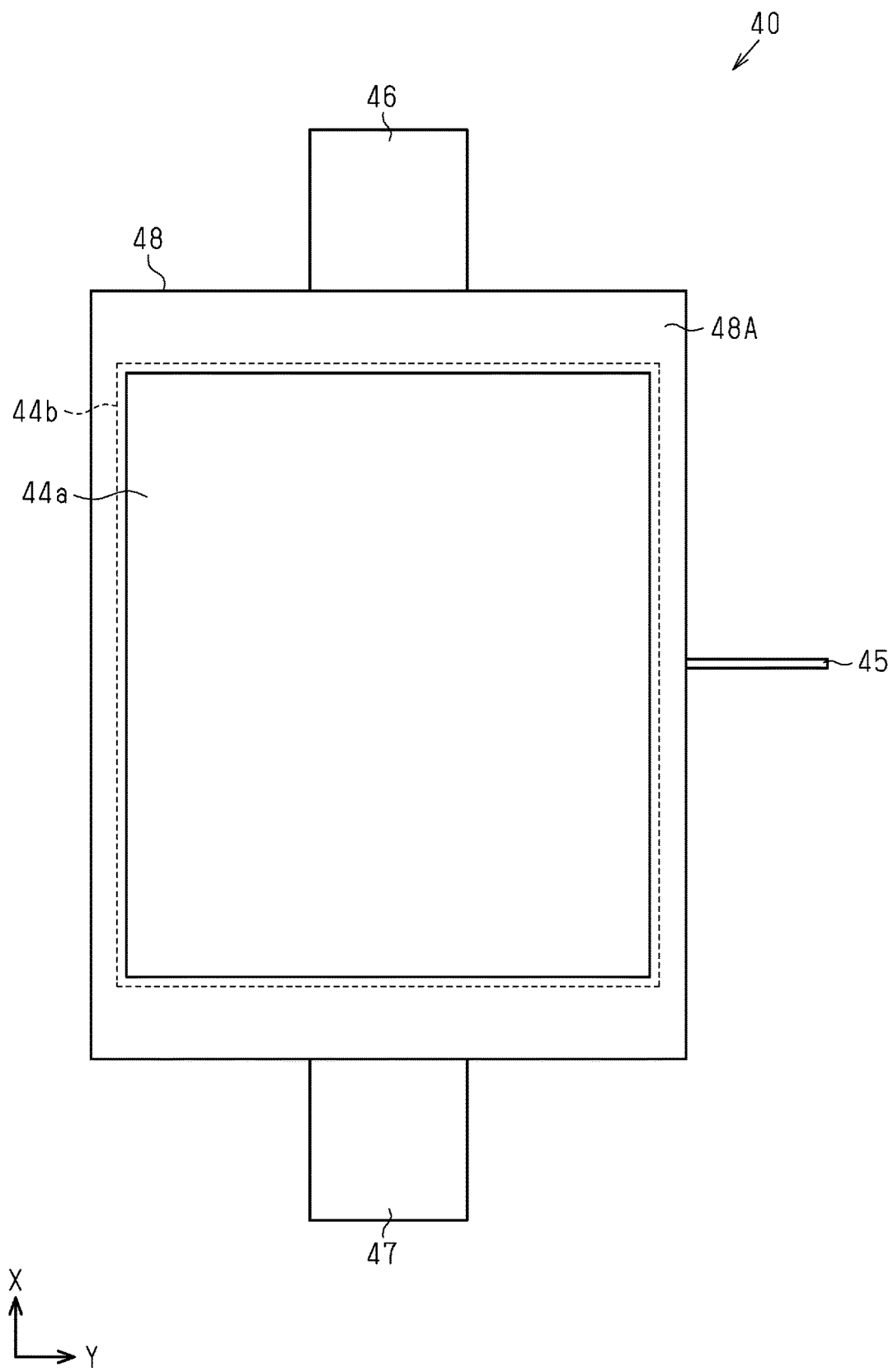
FIG. 9 is a bottom view of the semiconductor module.

The heat dissipation plate 44a is formed from copper (Cu). As shown in FIGS. 8 and 9, the heat dissipation plate 44a is exposed from a bottom surface 48A of the encapsulation resin 48. In plan view, the heat dissipation plate 44a is rectangular so that the long sides of the heat dissipation plate 44a extend in the first direction X. The heat dissipation plate 44a may be formed from, for example, aluminum (Al). The heat dissipation plate 44a may be omitted, and the insulation substrate 44b may be exposed directly.

The insulation substrate 44b is fixed to the heat dissipation plate 44a. The insulation substrate 44b is formed from, for example, $Si_3N_4$. As shown in FIGS. 8 and 9, in plan view, the insulation substrate 44b is rectangular so that the long sides of the insulation substrate 44b extend in the first direction X. In plan view, the insulation substrate 44b has a greater area than the heat dissipation plate 44a. That is, the insulation substrate 44b projects from the heat dissipation plate 44a in at least one of the first direction X or the second direction Y. In the present embodiment, the insulation substrate 44b projects from the heat dissipation plate 44a in the first direction X and the second direction Y.

As shown in FIG. 8, the first wiring portion 44c and the second wiring portion 44d are fixed to the insulation substrate 44b. The first wiring portion 44c and the second wiring portion 44d are formed from copper (Cu). The first wiring portion 44c is electrically insulated from the second wiring portion 44d. As shown in FIG. 7, in plan view, the first wiring portion 44c is rectangular so that the long sides of the first wiring portion 44c extend in the first direction X.

The connection terminal 46 is connected to an end of the first wiring portion 44c located at the opposite side from the second wiring portion 44d in the first direction X. The connection terminal 46 is connected to the high-voltage line HL for the battery module 21. More specifically, the connection terminal 46 is electrically connected the positive electrode of the battery module 21. The connection terminal 46 is formed from, for example, copper (Cu). In plan view, the connection terminal 46 is rectangular so that the long sides of the connection terminal 46 extend in the first direction X.

The connection terminal 47 is connected to the second wiring portion 44d. The connection terminal 47 is connected to the high-voltage line HL for the inverter circuit 12. More specifically, the connection terminal 47 is electrically connected to the inverter circuit 12. The connection terminal 47 is formed from, for example, copper (Cu). The connection terminal 47 and connection terminal 46 are located at the same position in the second direction Y. In plan view, the connection terminal 47 is the same in shape as the connection terminal 46 and is rectangular so that the long sides of the connection terminal 47 extend in the first direction X.

The IGBT 42 and the diode 43 are mounted on the first wiring portion 44c of the metal substrate 44. The IGBT 42 and the diode 43 are provided as separate semiconductor chips. The diode 43 is located closer to the second wiring portion 44d than the IGBT 42 is in the second direction Y. The collector electrode 64 (refer to FIG. 4A) of the IGBT 42 is electrically connected to the first wiring portion 44c by a conductive material such as solder. The cathode electrode pad 77 of the diode 43 is electrically connected to the first wiring portion 44c by a conductive material such as solder.

The IGBT 42 has a front surface on which an emitter electrode pad 66 and a gate electrode pad 67 are formed. The diode 43 has a front surface on which an anode electrode pad 76a is formed. The emitter electrode pad 66 of the IGBT 42, the anode electrode pad 76a of the diode 43, and the second wiring portion 44d are electrically connected by multiple (in FIG. 7, six) power wires 49a. In plan view, the power wires 49a extend in the second direction Y. The power wires 49a are, for example, bonding wires formed from aluminum (Al).

The emitter electrode pad 66, the gate electrode pad 67, and the anode electrode pad 76a are formed from, for example, aluminum (Al) or nickel (Ni).

A first metal electrode layer (not shown) is formed on the emitter electrode pad 66. A second metal electrode layer (not shown) is formed on the gate electrode pad 67. A third metal electrode layer (not shown) is formed on the anode electrode pad 76a.

In the present embodiment, the control terminal 45 is a gate terminal. The control terminal 45 and the diode 43 are located at opposite sides of the IGBT 42 in the second direction Y. The control terminal 45 is located at a position separate from the first wiring portion 44c in the second direction Y. The control terminal 45 is electrically connected to the gate control circuit 34 (refer to FIG. 2).

The gate electrode pad 67 is formed on the front surface of the IGBT 42 at a position close to the control terminal 45. The gate electrode pad 67 of the IGBT 42 and the control terminal 45 are electrically connected by a control wire 49b. The control wire 49b is, for example, a bonding wire formed from aluminum (Al).

Figure 10:
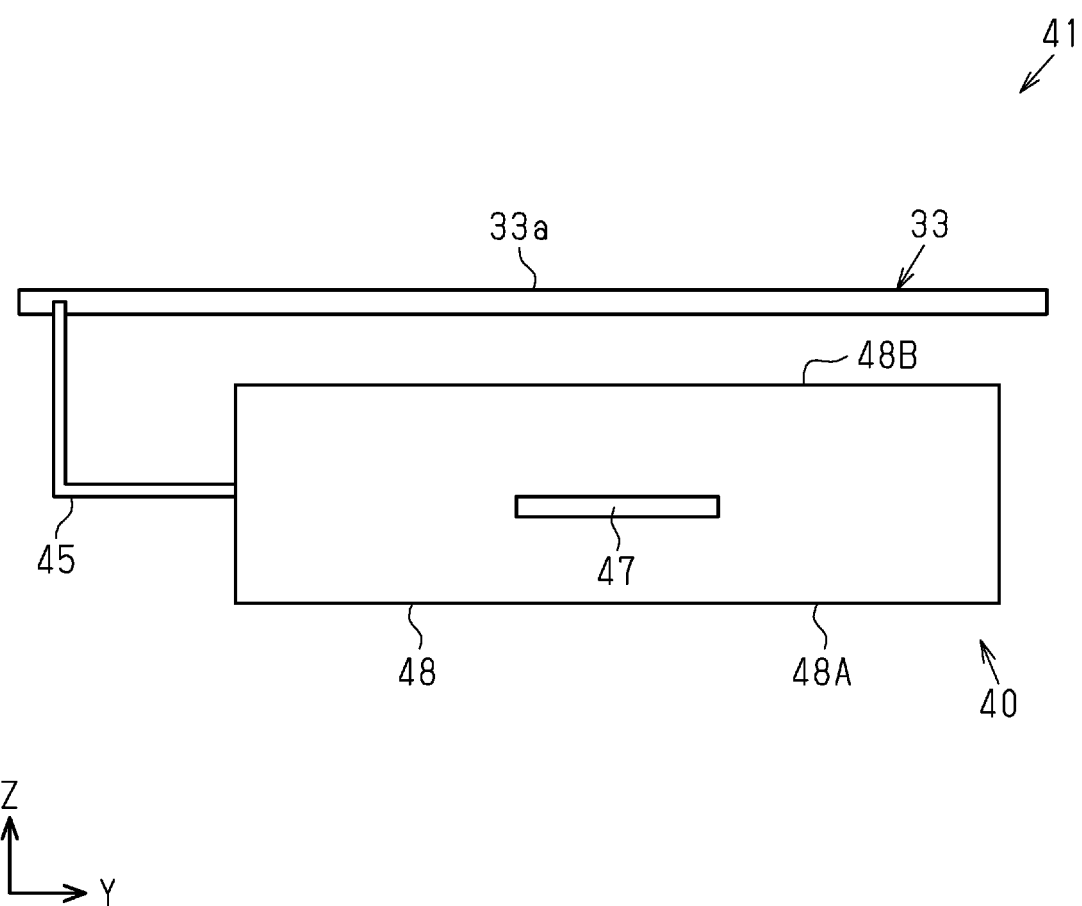
FIG. 10 is a side view of a semiconductor unit.

As shown in FIGS. 6 and 10, each control terminal 45 is L-shaped. As shown in FIG. 10, the control circuit 33 includes a control substrate 33a on which at least the gate control circuit 34 (refer to FIG. 2) is formed. The relay control circuit 35 (refer to FIG. 2) may be formed on the control substrate 33a. The control substrate 33a is connected to the control terminal 45. The control substrate 33a is spaced apart from and opposed to the semiconductor module 40 in the third direction Z. More specifically, the encapsulation resin 48 of the semiconductor module 40 has an upper surface 48B located at the opposite side from the bottom surface 48A, and the control substrate 33a is opposed to the upper surface 48B. As described above, when the semiconductor module 40 is coupled to the control circuit 33 (control substrate 33a), the semiconductor unit 41 is formed.

Pre-Charge

Control that is performed on the semiconductor module 40 when the start switch is switched on will be described with reference to FIGS. 1, 2, and 11 to 16.

When the state of charge of the capacitor 13 is zero or close to zero and the start switch is switched on, as power is supplied from the battery module 21 to the inverter circuit 12, an inrush current may flow to the semiconductor module 40 due to the difference in potential between the battery module 21 and the capacitor 13. To limit the inrush current flowing to the semiconductor module 40, pre-charge control is executed. In pre-charge control, when the battery module 21 starts supplying power to the inverter circuit 12, the gate control circuit 34 limits current flowing from the battery module 21 to the semiconductor module 40 so that the capacitor 13 is gradually charged. Pre-charge control starts when the start switch (main switch) of the vehicle 1 is switched on, and ends when the terminal-to-terminal voltage of the capacitor 13 becomes greater than or equal to a threshold value. The threshold value is a voltage value used to determine that the capacitor 13 is fully charged. An example of the threshold value is a voltage that is greater than or equal to 80% of the voltage of the battery module 21 (hereafter, referred to as "the battery voltage VB").

When the start switch (main switch) of the vehicle 1 is switched on, the control circuit 33 causes the gate control circuit 34 to generate a gate drive signal Sg and outputs the gate drive signal Sg to the IGBT 42.

During pre-charge control, the gate control circuit 34 controls the IGBT 42 so that the capacitor 13 is charged gradually. More specifically, the gate control circuit 34 controls a voltage applied to the gate of the IGBT 42 to be less than a voltage applied to the gate of the IGBT 42 when the IGBT 42 is fully activated. During pre-charge control, it is preferred that the voltage applied to the gate of the IGBT 42 is slightly higher than a threshold voltage Vth of the IGBT 42. That is, during pre-charge control, the voltage applied to the gate of the IGBT 42 is set so that current flows to the IGBT 42 but the current is substantially smaller than a current that flows to the IGBT 42 when the IGBT 42 is fully activated. In the present embodiment, the voltage applied to the gate when the IGBT 42 is fully activated is 20 V. During pre-charge control, the voltage applied to the gate of the IGBT 42 is 8 to 10 V. In addition, the gate control circuit 34 executes intermittent control to intermittently operate the IGBT 42. Preferably, the frequency of the intermittent operation of the IGBT 42 is less than or equal to 1000 Hz. In the present embodiment, the frequency of the intermittent operation of the IGBT 42 is 200 Hz. Preferably, the duty ratio of the IGBT 42 is less than 50%. In the present embodiment, the duty ratio of the IGBT 42 is 5%.

When pre-charge control is completed, the terminal-to-terminal voltage of the capacitor 13 is greater than or equal to the threshold value and is adequately high. The gate control circuit 34 generates a gate drive signal Sg such that the IGBT 42 is fully activated and outputs the gate drive signal Sg to the IGBT 42.

The condition for completing pre-charge control may be changed in any manner. Pre-charge control may be completed, for example, when a predetermined time has elapsed since execution of pre-charge control has started. The predetermined time is a time taken for pre-charge control to charge the capacitor 13 from zero to the fully charged state and is determined in advance by tests or the like.

The terminal-to-terminal voltage of the capacitor 13, the voltage of the IGBT 42, and the current flowing to the semiconductor module 40 during pre-charge control will now be described. In a first comparative example, a first comparative pre-charge control constantly maintains the IGBT 42 in the activation state while applying a voltage of 10 V to the gate of the IGBT 42. In a second comparative example, a second comparative pre-charge control applies a voltage of 20 V to the gate of the IGBT 42 and intermittently operates the IGBT 42. In the second comparative pre-charge control, the IGBT 42 is intermittently operated by the intermittent control. The frequency at which the IGBT 42 intermittently operates is 10 kHz, and the duty ratio is 50%. In the first comparative pre-charge control and the second comparative pre-charge control, the current limiting resistor 36 arranged between the gate control circuit 34 and the semiconductor module 40 is 50Ω.

Figure 11:
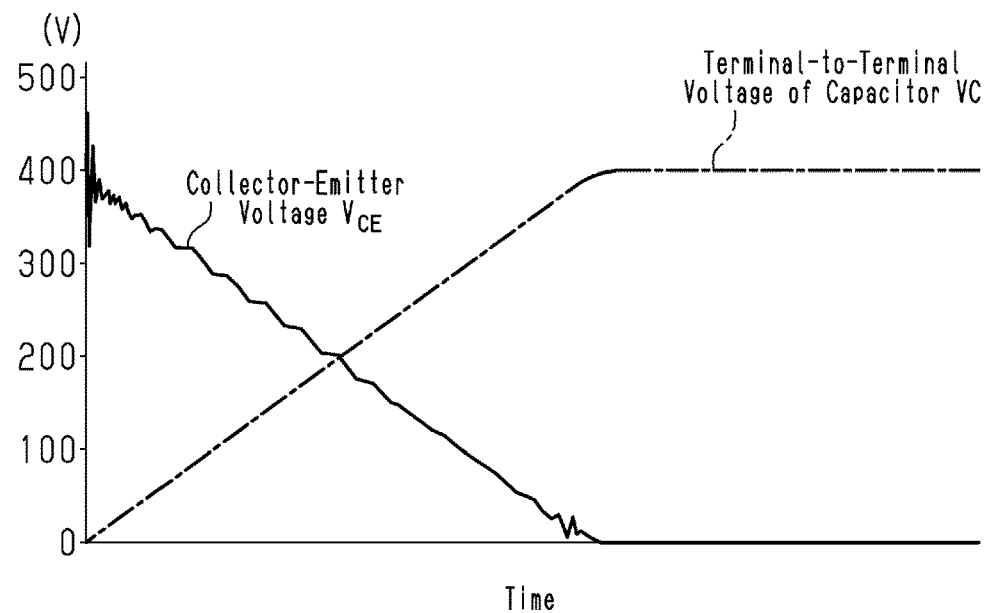
FIG. 11 is a graph showing a collector-emitter voltage and a terminal-to-terminal voltage of a capacitor in a first comparative example of pre-charge control.

As shown in FIG. 11, in the first comparative pre-charge control, as time elapses from the time of starting the control, the collector-emitter voltage $V_{CE}$ of the IGBT 42 gradually decreases, and the terminal-to-terminal voltage VC of the capacitor 13 increases. The collector-emitter voltage $V_{CE}$ and the terminal-to-terminal voltage VC of the capacitor 13 change like a linear function.

Figure 12:
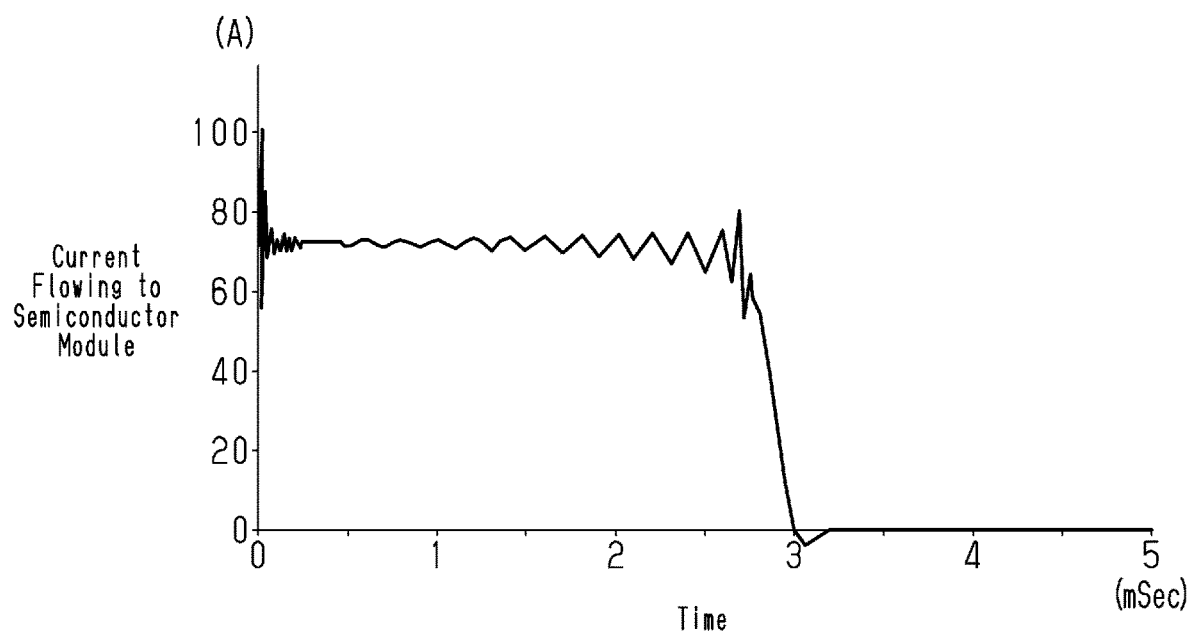
FIG. 12 is a graph showing a current flowing to the semiconductor module during pre-charge control of the first comparative example.

As shown in FIG. 12, in the first comparative pre-charge control, a high current constantly flows to the semiconductor module 40 from the time of starting the control until the capacitor 13 is fully charged. In FIG. 11, a current of approximately 70 A flows to the semiconductor module 40 at 400 V for 3 msec. As a result, the temperature of the IGBT 42 becomes excessively high.

Figure 13:
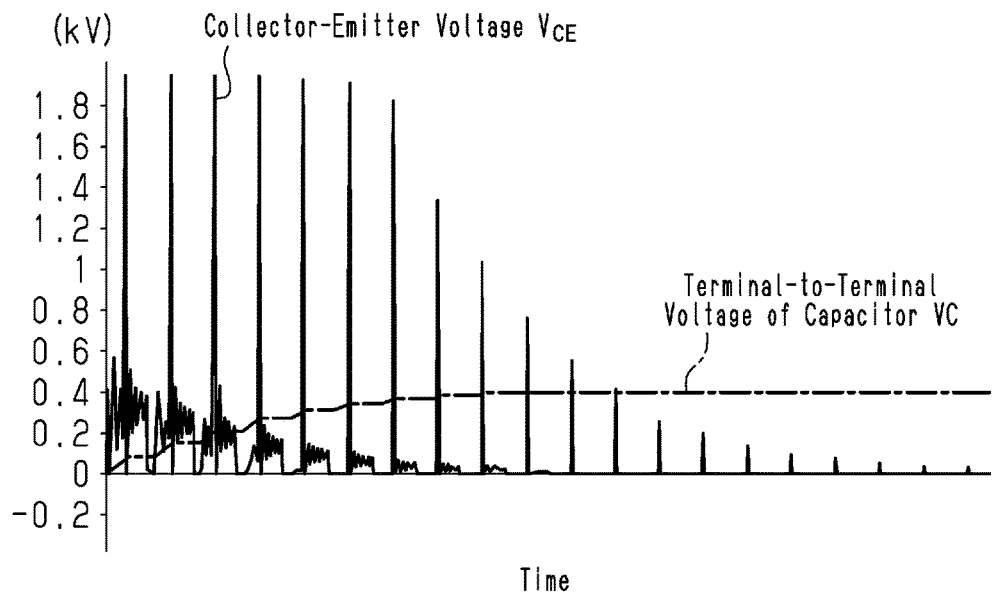
FIG. 13 is a graph showing a collector-emitter voltage and a terminal-to-terminal voltage of a capacitor in a second comparative example of pre-charge control.

As shown in FIG. 13, the second comparative pre-charge control intermittently operates the IGBT 42 at a high speed, so that a surge voltage is generated in the collector-emitter voltage $V_{CE}$ of the IGBT 42. The peak of the collector-emitter voltage $V_{CE}$ gradually falls as time elapses from the time of starting the second comparative pre-charge control. By contrast, the terminal-to-terminal voltage VC of the capacitor 13 increases as time elapses from the time of starting the second comparative pre-charge control.

Figure 14:
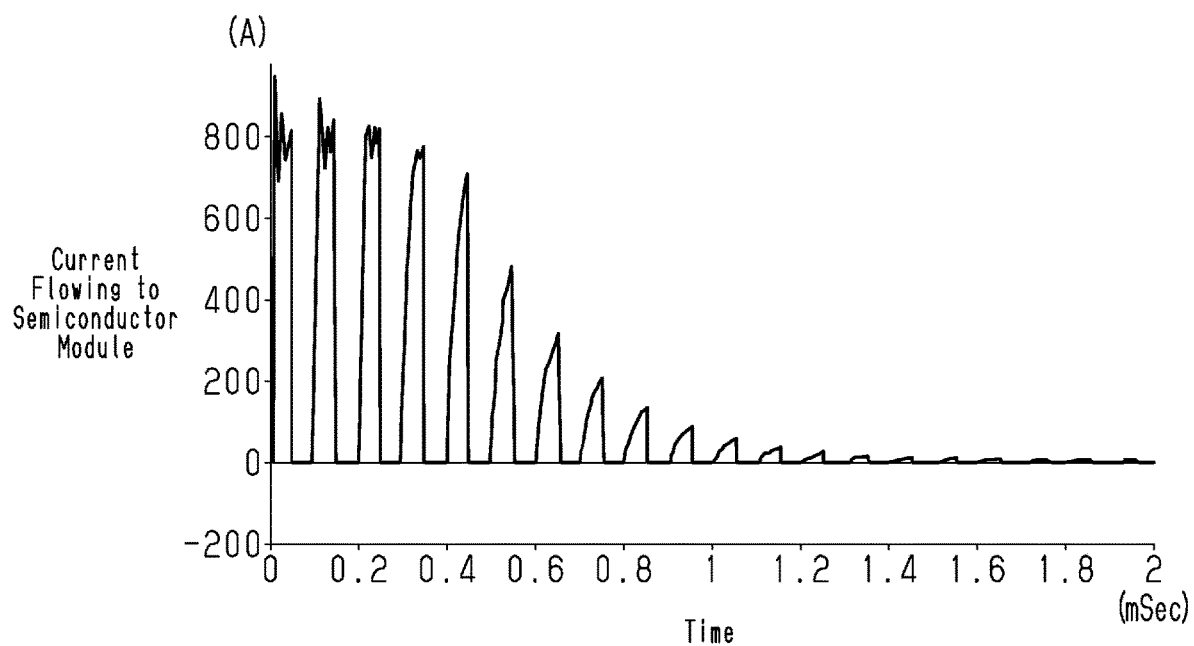
FIG. 14 is a graph showing a current flowing to the semiconductor module during pre-charge control of the second comparative example.

As shown in FIG. 14, in the second comparative pre-charge control, a large current intermittently flows to the semiconductor module 40 from the time of starting the control until the capacitor 13 is fully charged. The peak of the second comparative pre-charge control gradually falls as time elapses. At the time of starting the second comparative pre-charge control, a current greater than 800 A flows to the high-voltage line HL. Such a large current intermittently flows to the semiconductor module 40 and the current changes quickly. This increases a surge voltage generated by parasitic inductance on the circuit and the quick current changes. In addition, because periods during which current does not flow to the IGBT 42 are short, the temperature of the IGBT 42 becomes excessively high.

Figure 15:
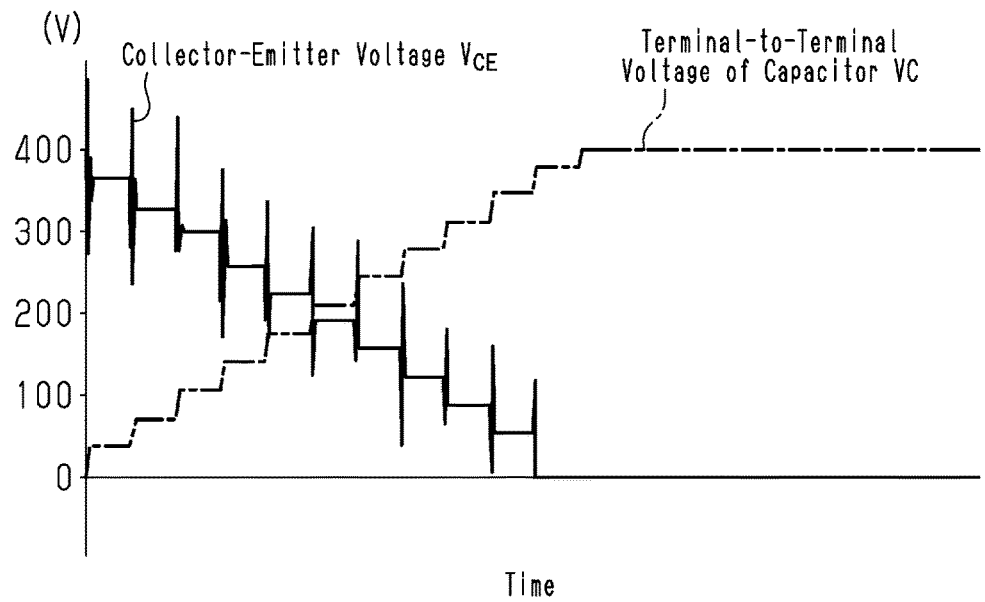
FIG. 15 is a graph showing a collector-emitter voltage and a terminal-to-terminal voltage of a capacitor during pre-charge control of the first embodiment.

In this regard, in the present embodiment, the voltage applied to the gate of the IGBT 42 is decreased, and the IGBT 42 intermittently operates more slowly than the second comparative pre-charge control. In this case, as shown in FIG. 15, the collector-emitter voltage $V_{CE}$ of the IGBT 42 decreases in a stepped manner as time elapses from the time of starting pre-charge control. On contrary, the terminal-to-terminal voltage VC of the capacitor 13 increases in a stepped manner as time elapses from the time of starting pre-charge control of the present embodiment.

Figure 16:
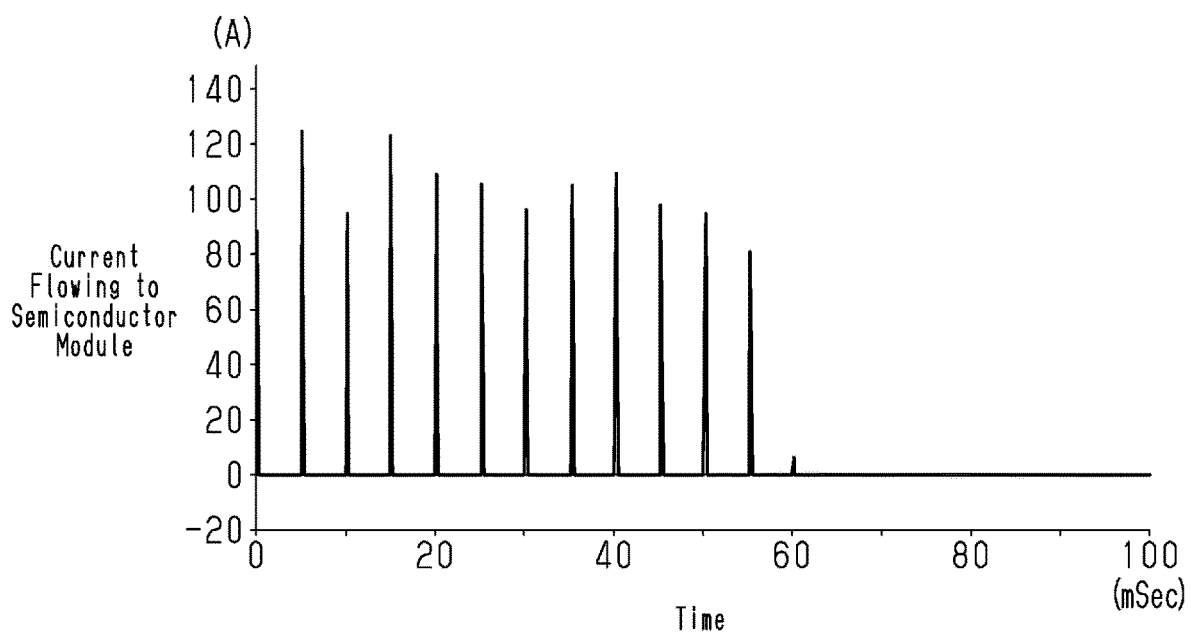
FIG. 16 is a graph showing a current flowing to the semiconductor module during pre-charge control of the first embodiment.

As shown in FIG. 16, during pre-charge control of the present embodiment, a current intermittently flows to the semiconductor module 40 from the time of starting the control until the capacitor 13 is fully charged. The current flowing to the semiconductor module 40 is approximately 80 A to 100 A. More specifically, during pre-charge control of the present embodiment, the current flowing to the semiconductor module 40 is substantially smaller than the current flowing to the semiconductor module 40 in the second comparative pre-charge control. In addition, periods during which current does not flow to the IGBT 42 are long, and the IGBT 42 is cooled in the periods during which a current does not flow. This limits an excessive increase in the temperature of the IGBT 42.

Figure 17:
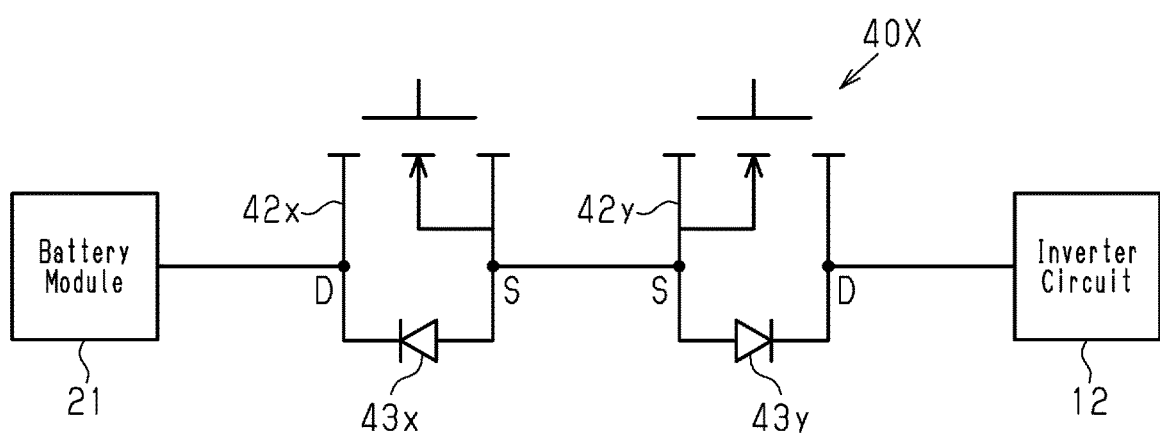
FIG. 17 is a circuit diagram showing a comparative example of a semiconductor device.

The first operation of the present embodiment will be described. FIG. 17 is a semiconductor device 40X, which is a comparative example of a first relay compared to the semiconductor device 40A of the present embodiment. The configuration of the semiconductor device 40X of the comparative example will now be described.

The semiconductor device 40X includes metal-oxide-semiconductor field-effect transistors (MOSFETs) 42x and 42y that are connected in series to each other. More specifically, the drain of the MOSFET 42x is connected to the battery module 21, and the source of the MOSFET 42x is connected to the source of the MOSFET 42y. The drain of the MOSFET 42y is connected to the inverter circuit 12. The MOSFET 42x includes a body diode 43x. The MOSFET 42y includes a body diode 43y. The body diode 43x has an anode for the source of the MOSFET 42x and a cathode for the drain of the MOSFET 42x. The body diode 43y has an anode for the source of the MOSFET 42y and a cathode for the drain of the MOSFET 42y. When a current flows from the battery module 21 to the inverter circuit 12 or when a current flows from the inverter circuit 12 to the battery module 21, the MOSFET 42x and the MOSFET 42y are activated simultaneously so that the current flows through the MOSFET 42x and the MOSFET 42y. That is, the semiconductor device 40X is conductive in two directions.

Each of the MOSFETs 42x and 42y is formed of a silicon carbide (SiC) device to simultaneously achieve a high withstand voltage and a low on-resistance. However, the configuration of the semiconductor device 40X, in which the MOSFET 42x and the MOSFET 42y are connected in series, increases the on-resistance and increases the cost of the semiconductor device 40X.

In this regard, in the present embodiment, the semiconductor device 40A includes the IGBT 42 and the diode 43 inversely connected to the IGBT 42. Thus, the number of transistor elements is decreased as compared to the semiconductor device 40X. Accordingly, the cost is reduced.

The second operation of the present embodiment will now be described.

When the inverter circuit 12 forms a short circuit, a large current flows from the battery module 21 toward the inverter circuit 12. The large current also flows to the semiconductor module 40, which is arranged between the battery module 21 and the inverter circuit 12.

When a large current flows from the battery module 21 to the inverter circuit 12, the IGBT 42 of the semiconductor module 40 is deactivated to limit the large current flowing from the battery module 21 to the inverter circuit 12. When deactivating the IGBT 42, if the IGBT 42 quickly changes from the activation state to the deactivation state, the amount of current flowing to the IGBT 42 will greatly change, and a surge voltage will be generated.

In this regard, in the present embodiment, the current limiting resistor 36, which is arranged between the gate of the IGBT 42 and the gate control circuit 34, has a greater resistance value than, for example, a current limiting resistor arranged between the gate of a switching element (e.g., IGBT) of the inverter circuit 12 and a gate control circuit that controls the switching element. More specifically, the current limiting resistor 36 is greater than or equal to 100Ω. In the present embodiment, the current limiting resistor 36 is 500Ω. This reduces the speed at which the IGBT 42 changes from the activation state to the deactivation state. As a result, the speed at which the current flowing to the IGBT 42 changes is reduced, so that the occurrence of a surge voltage is limited.

Further, the present embodiment has the following advantages.

(1-1) The semiconductor device 40A is arranged between the battery module 21 and the inverter circuit 12 and includes the IGBT 42 and the diode 43 inversely connected to the IGBT 42. The collector of the IGBT 42 is connected to the positive electrode of the battery module 21. The emitter of the IGBT 42 is connected to the inverter circuit 12. The withstand voltage of the semiconductor device 40A is greater than or equal to the battery voltage VB. In this configuration, the semiconductor device 40A is used as a main relay and a pre-charging relay circuit. More specifically, the relay unit does not have to include a current limiting resistor for limiting an inrush current from the battery module 21, a mechanical contact type relay of a pre-charging relay circuit, and a mechanical contact type main relay. This eliminates the shortcomings including the low reliability of relays, that is, a failure to block a current caused by a welded contact of the mechanical contact type main relay, generation of an electric arc, and the limited number of times a relay can open and close, and noise produced when the main relay and the pre-charge relay circuit open and close. Accordingly, while limiting the lowering of the reliability and production of noise, the relay unit 30 is reduced in size and weight.

If a mechanical contact type relay is arranged on the high-voltage line HL, through which a current of 400 A flows from the battery module 21 to the inverter circuit 12, the relay has a body such that the length is greater than or equal to 100 mm, the width is greater than 60 mm, and the height is greater than 70 mm in plan view of the relay. In an example, the relay has a length of 111 mm, a width of 63 mm, and a height of 75 mm.

The semiconductor module 40 including the semiconductor device 40A has a dimension in the first direction X that is less than or equal to 60 mm, a dimension in the second direction Y that is less than or equal to 60 mm, and a height that is less than or equal to 12 mm. The first relay 31 is reduced in size as compared to a mechanical contact type relay.

(1-2) During pre-charge control, in the semiconductor device 40A, the IGBT 42 intermittently operates, and the voltage applied to the gate of the IGBT 42 is less than a voltage that is applied to the gate of the IGBT 42 when the IGBT 42 is fully activated. This configuration limits the current flowing from the battery module 21 toward the capacitor 13, thereby limiting a large current flowing from the battery module 21 to the capacitor 13.

(1-3) In the semiconductor device 40A, when the IGBT 42 intermittently operates during pre-charge control, the frequency is less than or equal to 1000 Hz, and the duty ratio is less than 50%. This configuration further limits the current flowing from the battery module 21 toward the capacitor 13, thereby further limiting a large current flowing from the battery module 21 toward the capacitor 13. As a result, increases in the temperature of the IGBT 42 are limited. In the semiconductor device 40A of the present embodiment, when the IGBT 42 intermittently operates during pre-charge control, the duty ratio is 5%. This further limits a large current flowing from the battery module 21 toward the capacitor 13.

(1-4) The current limiting resistor 36 arranged between the gate of the IGBT 42 of the semiconductor device 40A and the gate control circuit 34 is greater than or equal to 100Ω. This configuration reduces the speed at which the IGBT 42 changes from the activation state to the deactivation state when turned off. Thus, occurrence of a surge voltage is limited. In the present embodiment, the current limiting resistor 36 is 500Ω. Thus, occurrence of a surge voltage is further limited.

(1-5) The IGBT 42 of the semiconductor device 40A has a structure that does not include the lattice defect layer 65 between the buffer region 53 and the drift region 54. The conduction loss of the IGBT 42 is reduced as compared to an IGBT 42 that includes the lattice defect layer 65.

(1-6) The impurity concentration in the collector region 52 of the IGBT 42 is increased to reduce the conduction loss of the IGBT 42. Thus, when a driving current flows from the battery module 21 to the inverter circuit 12 or the capacitor 13, loss in the IGBT 42 is reduced.

(1-7) The impurity concentration in the p type region 73, which is an anode region of the diode 43, is increased to reduce the conduction loss of the diode 43. Thus, when a regenerative current flows from the inverter circuit 12 to the battery module 21, loss in the diode 43 is reduced.

Second Embodiment

A second embodiment of a semiconductor unit 41 will be described with reference to FIGS. 18 to 22. The semiconductor unit 41 of the present embodiment differs from the semiconductor unit 41 of the first embodiment in the temperature of the IGBT 42 and an overcurrent being detected. In the description hereafter, the same reference numerals are given to those components that are the same as the corresponding components of the semiconductor unit 41 of the first embodiment. Such components may not be described in detail.

Figure 18:
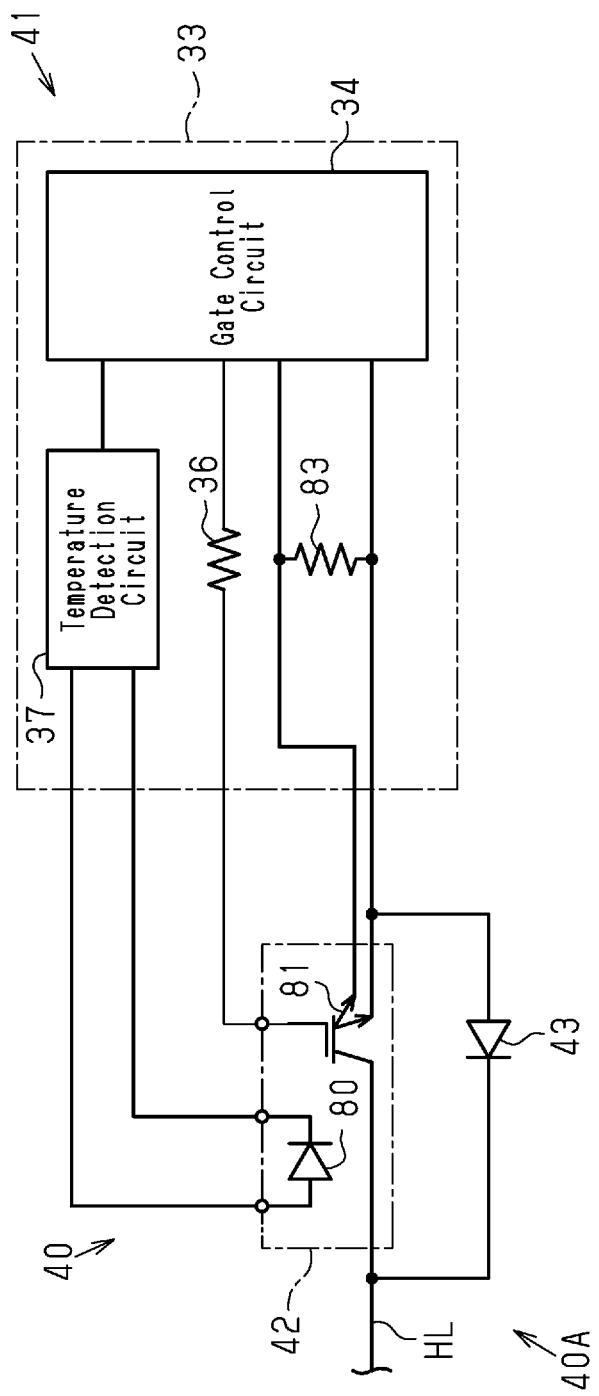
FIG. 18 is a circuit diagram showing a second embodiment of a semiconductor unit.

As shown in FIG. 18, the IGBT 42 includes a temperature-sensing diode 80 configured to detect a temperature of the IGBT 42 and a current sense element 81 configured to detect a current flowing to the IGBT 42. The current sense element 81 is arranged so that a current sense ratio, which is a ratio of a current flowing from the current sense element 81 to a current flowing from the emitter of the IGBT 42, equals, for example, 1/1000. A sense resistor 83 is arranged between the gate control circuit 34 and the current sense element 81. The gate control circuit 34 is connected to opposite ends of the sense resistor 83 to detect a current flowing from the emitter of the IGBT 42 based on a current flowing to the sense resistor 83. When the current flowing to the sense resistor 83 is greater than or equal to a threshold value, the gate control circuit 34 deactivates the IGBT 42.

The control circuit 33 includes a temperature detection circuit 37. The temperature detection circuit 37 is connected to an anode and a cathode of the temperature-sensing diode 80. More specifically, the temperature detection circuit 37 supplies a predetermined current to the temperature-sensing diode 80 to measure a voltage between opposite ends of the temperature-sensing diode 80. The temperature-sensing diode 80 has a characteristic such that the threshold voltage decreases as the temperature increases. The temperature detection circuit 37, for example, outputs a signal to the gate control circuit 34 when the voltage between opposite ends of the temperature-sensing diode 80 becomes greater than or equal to a threshold value that corresponds to a temperature threshold value of the IGBT 42. The temperature threshold value is a temperature that may lead the IGBT 42 to break and is determined in advance through tests or the like.

Figure 19:
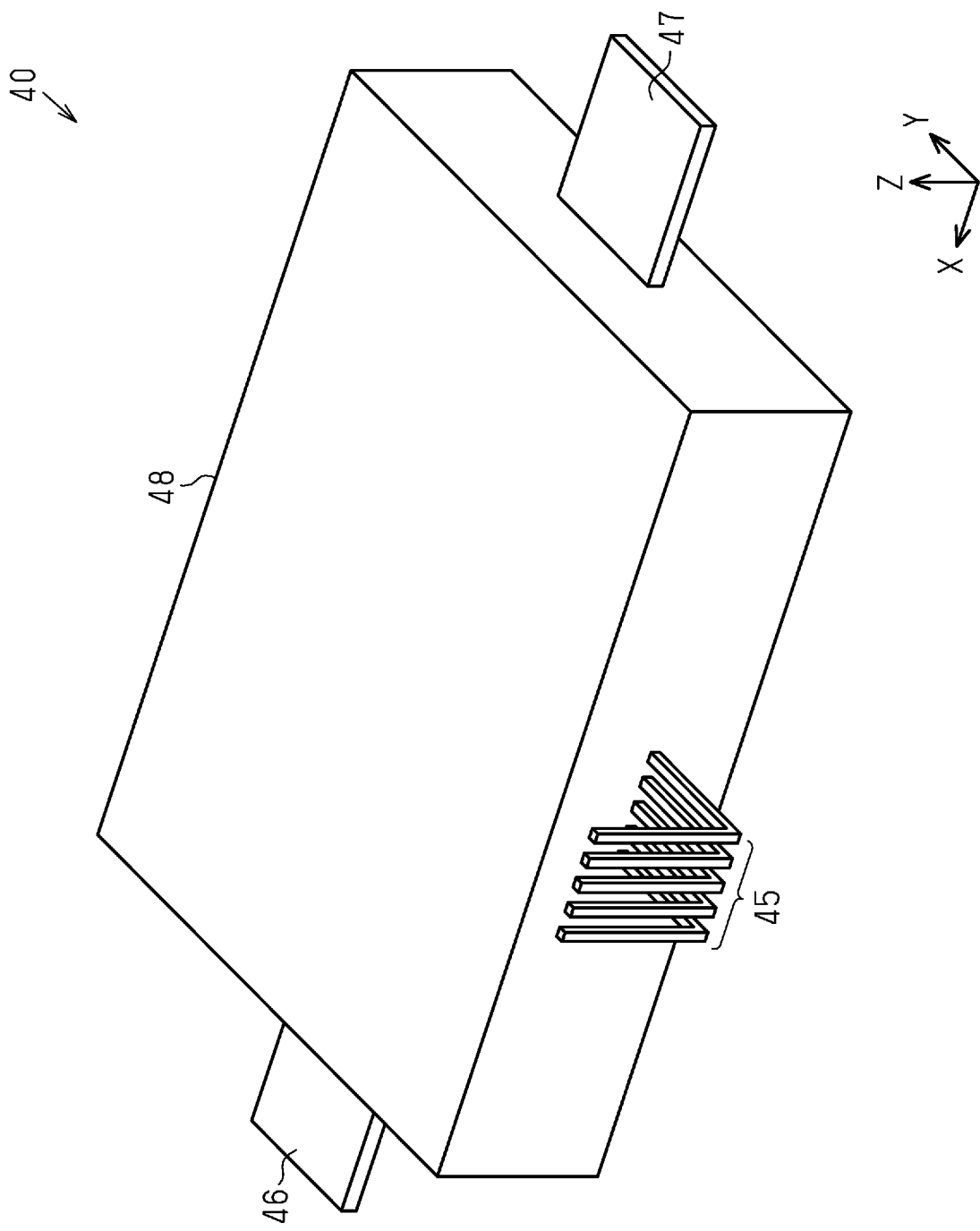
FIG. 19 is a perspective view of a semiconductor module.
Figure 20:
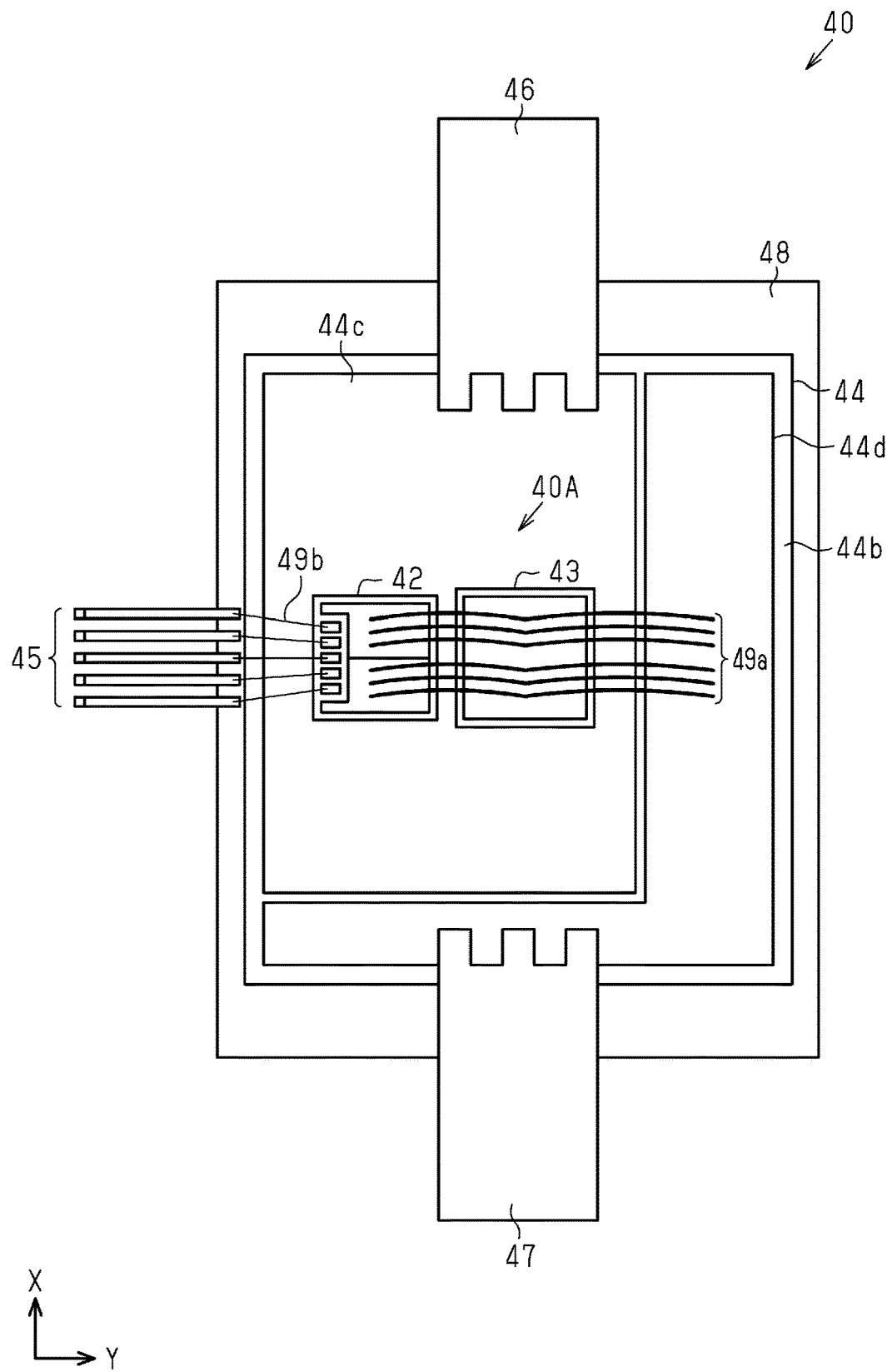
FIG. 20 is a schematic plan view of the semiconductor module showing a layout of a semiconductor device.

As shown in FIGS. 19 and 20, the semiconductor module 40 includes five control terminals 45 connected to the IGBT 42. As shown in FIG. 19, each control terminal 45 is L-shaped. The control terminals 45 are electrically connected to the control circuit 33 (refer to FIG. 18).

As shown in FIG. 20, the IGBT 42 and the diode 43 are connected by six power wires 49a. The power wires 49a are connected to the second wiring portion 44d. The IGBT 42 is connected to the five control terminals 45 by five control wires 49b.

Figure 21:
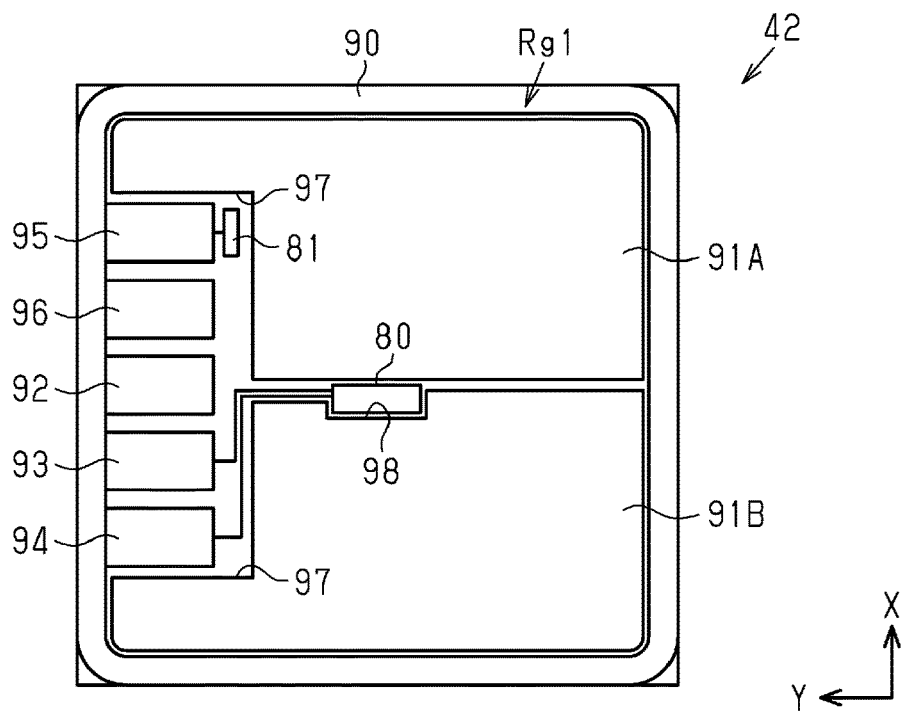
FIG. 21 is a plan view of an IGBT showing a layout of electrode pads of the IGBT.

FIG. 21 shows the configuration of electrodes of the IGBT 42.

A guard ring 90 is formed on a peripheral portion of the front surface of the IGBT 42, which is located at the opposite side from the metal substrate 44 (refer to FIG. 20). The guard ring 90 includes a region Rg1 in which two emitter electrode pads 91A and 91B, a gate electrode pad 92, the temperature-sensing diode 80, an anode electrode pad 93, a cathode electrode pad 94, the current sense element 81, a current sense pad 95, and an emitter potential pad 96 are formed. A collector electrode (not shown) is formed on the rear surface of the IGBT 42 located at the side of the metal substrate 44. The emitter electrode pads 91A and 91B, the gate electrode pad 92, the anode electrode pad 93, the cathode electrode pad 94, the current sense pad 95, and the emitter potential pad 96 include a metal electrode layer similar to the first metal electrode layer of the emitter electrode pad 66 or the second metal electrode layer of the gate electrode pad 67 in the first embodiment.

The emitter electrode pads 91A and 91B are electrically connected by the emitter electrode 63 (refer to FIG. 4A). The emitter electrode pads 91A and 91B are connected to the respective power wires 49a (refer to FIG. 20). The emitter electrode pads 91A and 91B are spaced apart from each other by a slight gap in the first direction X. The emitter electrode pads 91A and 91B include cutaway portions 97 formed by cutting the emitter electrode pads 91A and 91B in the second direction Y from one side, more specifically, a side at which the control terminals 45 (refer to FIG. 20) are arranged on the IGBT 42. The cutaway portions 97 define a recessed region that is recessed in a direction (second direction Y) orthogonal to an arrangement direction. In a region surrounded by this region and the guard ring 90, the gate electrode pad 92, the anode electrode pad 93, the cathode electrode pad 94, the current sense pad 95, and the emitter potential pad 96 are arranged in the first direction X. The gate electrode pad 92, the anode electrode pad 93, the cathode electrode pad 94, and the current sense pad 95 are respectively connected to the control terminals 45 by the control wires 49b (refer to FIG. 20).

The gate electrode pad 92 is electrically connected to the gate electrode 57 (refer to FIG. 4A) and is electrically connected to the gate control circuit (refer to FIG. 18) by the control terminal 45 (refer to FIG. 20). The anode electrode pad 93 and the cathode electrode pad 94 are electrically connected to the temperature detection circuit 37 (refer to FIG. 18) by the control terminals 45. The current sense element 81 is formed of a pattern that is separated from the emitter electrode 63 (refer to FIG. 4A) connected to the emitter electrode pads 91A and 91B. The current sense element 81 is electrically connected to the current sense pad 95. The current sense pad 95 is electrically connected to the gate control circuit 34 by the control terminal 45. The emitter potential pad 96 is used as a reference voltage when generating the gate drive signal Sg. The emitter potential pad 96 is electrically connected to the gate control circuit 34 by the control terminal 45.

A portion of the emitter electrode pad 91B corresponding to a central portion of the front surface of the IGBT 42 is recessed away from the emitter electrode pad 91A in the first direction X, defining a recess 98. The temperature-sensing diode 80 is arranged in the recess 98. That is, the temperature-sensing diode 80 is arranged in the central portion of the front surface of the IGBT 42. The temperature-sensing diode 80 is arranged between the emitter electrode pads 91A and 91B. The area of the temperature-sensing diode 80 is smaller than the area of each of the gate electrode pad 92, the anode electrode pad 93, the cathode electrode pad 94, the current sense pad 95, and the emitter potential pad 96. The temperature-sensing diode 80 is electrically connected to the anode electrode pad 93 and the cathode electrode pad 94. More specifically, a wiring pattern is formed on the front surface of the IGBT 42. The wiring pattern connects the temperature-sensing diode 80, the anode electrode pad 93, and the cathode electrode pad 94 in series. Thus, the temperature-sensing diode 80 is electrically connected to the temperature detection circuit 37 (refer to FIG. 18).

Figure 22:
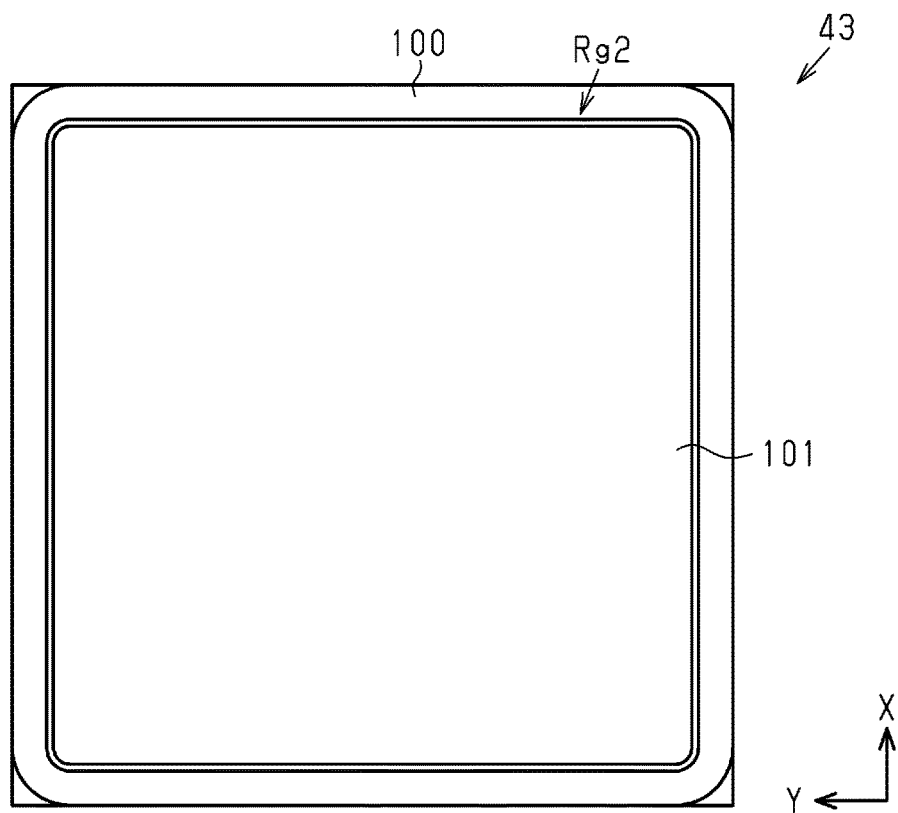
FIG. 22 is a plan view of a diode showing a layout of an electrode pad of the diode.

FIG. 22 shows the configuration of electrodes of the diode 43.

A guard ring 100 is formed on a peripheral portion of the front surface of the diode 43, which is located at the opposite side from the metal substrate 44 (refer to FIG. 20). The guard ring 100 includes a region Rg2 in which an anode electrode pad 101 is formed. A cathode electrode (not shown) is formed on the rear surface of the diode 43 located at the side of the metal substrate 44. In the same manner as the anode electrode pad 76 of the first embodiment, the third metal electrode layer is formed on the anode electrode pad 101.

When the inverter circuit 12 forms a short circuit, a large current flows from the battery module 21 toward the inverter circuit 12. The large current also may flow to the semiconductor module 40, which is arranged between the battery module 21 and the inverter circuit 12.

When a large current flows from the battery module 21 to the inverter circuit 12, the control circuit 33 switches the IGBT 42 of the semiconductor module 40 from the activation state to the deactivation state to limit the large current flowing from the battery module 21 to the inverter circuit 12. In an example, when the temperature of the IGBT 42 becomes greater than or equal to the temperature threshold value, that is, when a signal is received from the temperature detection circuit 37, the control circuit 33 switches the IGBT 42 from the activation state to the deactivation state. More specifically, the control circuit 33 outputs a gate drive signal Sg (current decrease signal) that deactivates the IGBT 42 through the gate control circuit 34 to the gate of the IGBT 42.

When deactivating the IGBT 42, if the IGBT 42 quickly changes from the activation state to the deactivation state, the amount of current flowing to the IGBT 42 will greatly change, and a surge voltage will be generated. In the present embodiment, the current limiting resistor 36, which is arranged between the gate of the IGBT 42 and the gate control circuit 34, has a greater resistance value than, for example, a current limiting resistor arranged between the gate of a switching element (e.g., IGBT) of the inverter circuit 12 and a gate control circuit that controls activation and deactivation of the switching element. More specifically, the current limiting resistor arranged between the switching element and the gate control circuit has a resistance value of a few $\Omega$ to a few dozen $\Omega$, whereas the current limiting resistor 36 has a resistance value of 100$\Omega$ or greater. In the present embodiment, the current limiting resistor 36 is 500$\Omega$. This reduces the speed at which the IGBT 42 changes from the activation state to the deactivation state. As a result, the speed at which the current flowing to the IGBT 42 changes is reduced, so that the occurrence of a surge voltage is limited.

The present embodiment has the following advantages.

(2-1) The IGBT 42 includes the current sense element 81, to which a current flows in proportion to a current flowing from the emitter of the IGBT 42. The gate control circuit 34 detects a current flowing to the IGBT 42 based on the current flowing to the sense resistor 83 connected to the current sense element 81. When the current is greater than or equal to the threshold value, the IGBT 42 is deactivated. With this configuration, when an overcurrent flows to the IGBT 42, the IGBT 42 is deactivated to block the current. This ensures that the current is blocked in a short time as compared to a mechanical contact type relay and thus dispenses with a fuse. In addition, the size is reduced as compared to a mechanical contact type relay.

(2-2) When the temperature of the IGBT 42 is greater than or equal to the temperature threshold value, the IGBT 42 is deactivated. With this configuration, when a large current flows to the IGBT 42 and results in an increase in the temperature of the IGBT 42, the current flowing to the IGBT 42 is blocked.

Third Embodiment

A third embodiment of a semiconductor unit 41 will be described with reference to FIGS. 23 to 26B. The semiconductor unit 41 of the present embodiment differs from the semiconductor unit 41 of the second embodiment in the configuration of the semiconductor module 40. In the description hereafter, the same reference numerals are given to those components that are the same as the corresponding components of the semiconductor unit 41 of the second embodiment. Such components may not be described in detail.

Figure 25:
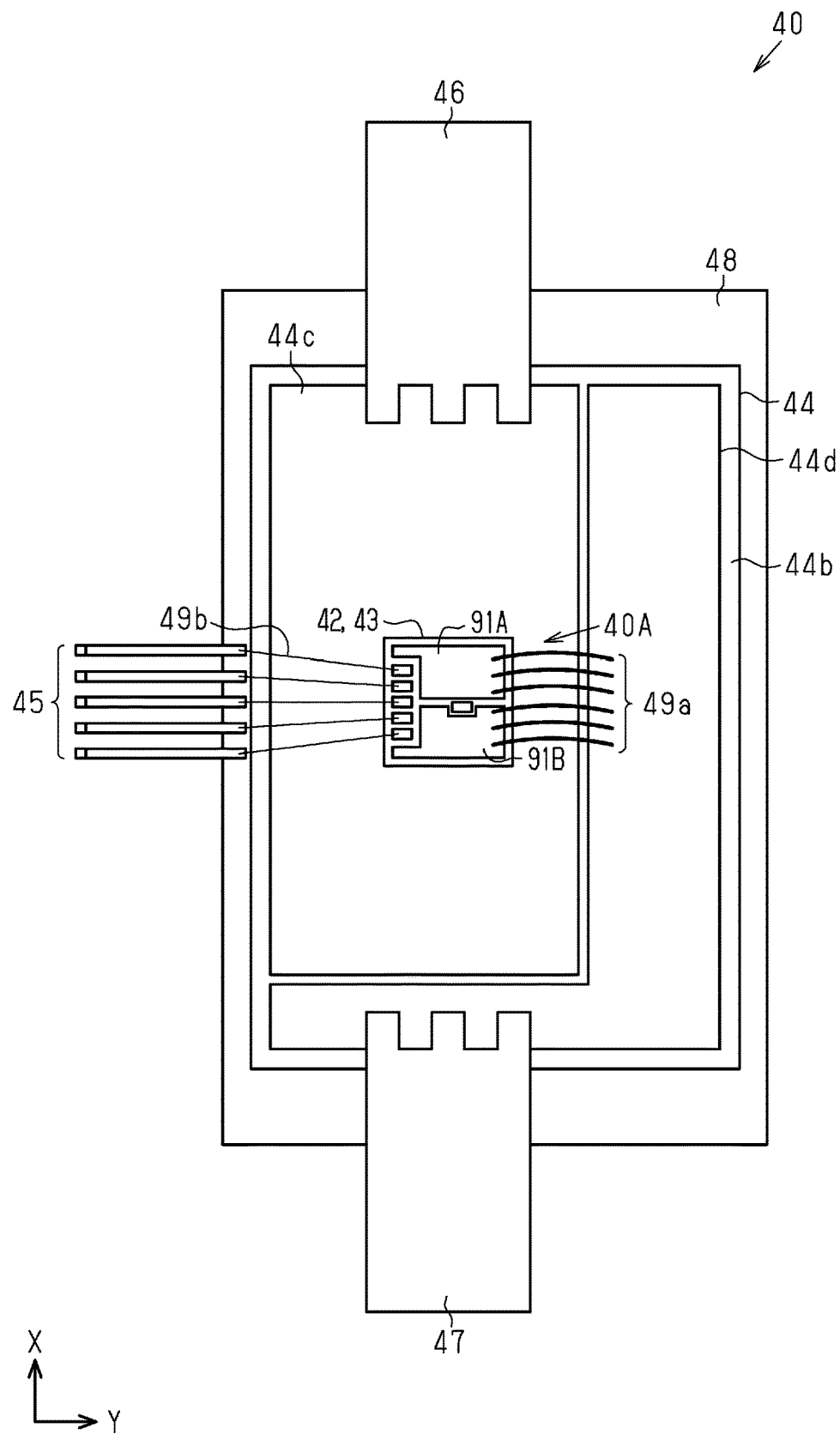
FIG. 25 is a schematic plan view of a semiconductor module showing a layout of a semiconductor device.

FIG. 25 shows the present embodiment of a semiconductor module 40 that includes a reverse-conduction insulated gate bipolar transistor (RC-IGBT) used as the semiconductor device 40A including the IGBT 42 and the diode 43. The layout of electrode pads of the RC-IGBT is the same as the layout of the electrode pads of the IGBT 42 of the second embodiment. The same reference numerals are given to the electrode pads of the semiconductor device 40A that are the same as the electrode pads of the IGBT 42.

Figure 23:
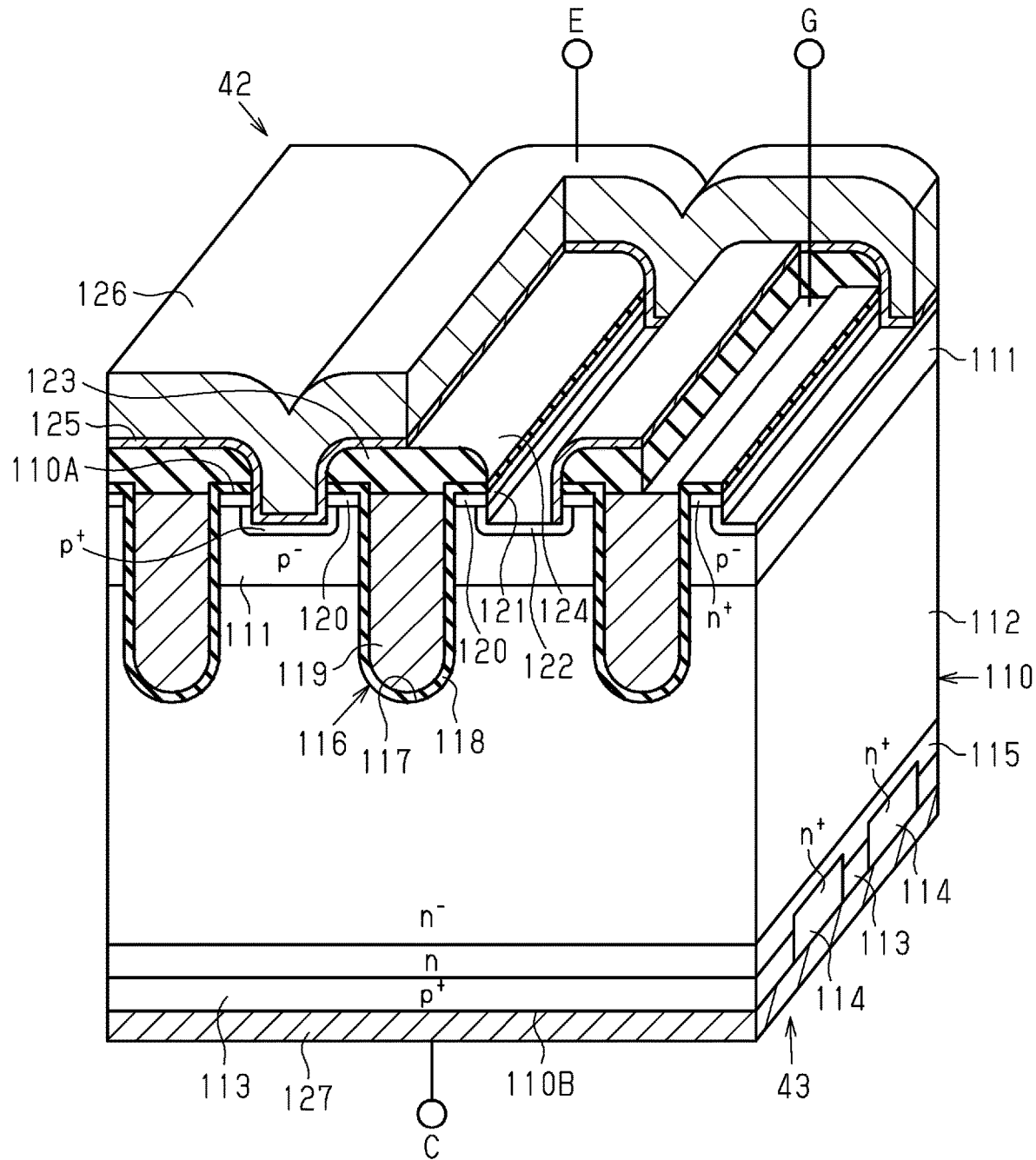
FIG. 23 is a perspective cross-sectional view of an RC-IGBT, which is a third embodiment of a semiconductor device.

FIG. 23 shows an example of a cross-sectional structure of the RC-IGBT including the IGBT 42 and the diode 43 in the semiconductor module 40. As shown in FIG. 23, the IGBT 42 and the diode 43 are formed on the same semiconductor substrate 110. That is, the IGBT 42 and the diode 43 are formed in a single chip.

As shown in FIG. 23, the semiconductor substrate 110 has a front surface 110A, and a p⁻ type channel region 111 is formed on a surface layer portion of the semiconductor substrate 110 located at the side of the front surface 110A. The semiconductor substrate 110 has a rear surface 110B. An n⁻ type drift region 112 is formed on a side of the channel region 111 located at the rear surface 110B so as to be electrically connected to the channel region 111. In the present embodiment, an n⁻ type semiconductor substrate is used as the semiconductor substrate 110, and part of the semiconductor substrate 110 is used to form the drift region 112.

A p⁺ type collector region 113 and an n⁺ type cathode region 114 are formed on a surface layer portion of the semiconductor substrate 110 located at the side of the rear surface 110B so as to be electrically connected to the drift region 112. In the present embodiment, an n type buffer region 115 extends between the drift region 112 and the collector region 113 and between the drift region 112 and the cathode region 114. The collector region 113 and the cathode region 114 are electrically connected to the drift region 112 through the buffer region 115. The collector region 113 and the cathode region 114 are exposed from the rear surface 110B of the semiconductor substrate 110.

The cathode region 114 traverses the boundary of the collector region 113 and the buffer region 115. The end of the cathode region 114 located at the side of the front surface 110A of the semiconductor substrate 110 is located in the buffer region 115.

The surface layer portion of the semiconductor substrate 110 located at the side of the front surface 110A includes trench gate structures 116 extending like belts in plan view. Each trench gate structure 116 includes a gate trench 117 formed by digging the semiconductor substrate 110, a gate electrode 119 embedded in the gate trench 117, and a gate insulation film 118 located between the gate electrode 119 and the wall of the gate trench 117. The gate trench 117 extends through the channel region 111 and has a bottom located in the drift region 112. In the present embodiment, the gate insulation film 118 also covers the front surface 110A of the semiconductor substrate 110.

Beside each trench gate structure 116, an n⁺ type emitter region 120 is formed in a surface layer portion of the channel region 111 and is exposed from the front surface 110A of the semiconductor substrate 110. Thus, beside the trench gate structure 116, the n⁺ type emitter region 120, the p⁻ type channel region 111, and the n⁻ type drift region 112 are formed in order from the side of the front surface 110A of the semiconductor substrate 110 toward the rear surface 110B. The channel region 111 is shared by adjacent ones of the trench gate structures 116. The gate electrode 119 is opposed to the emitter region 120, the channel region 111, and the drift region 112 with the gate insulation film 118 located in between in the gate trench 117.

The surface layer portion of the channel region 111 includes contact recesses 121 arranged between the trench gate structures 116. The contact recesses 121 extend like belts in plan view and extend in the same direction as the trench gate structures 116. The surface layer portion of the semiconductor substrate 110 located at the side of the front surface 110A is dug to form the contact recesses 121 having a bottom located in the channel region 111. In the thicknesswise direction of the semiconductor substrate 110, the depth of the contact recesses 121 is less than the depth of the trench gate structures 116 (gate trench 117).

The emitter region 120 is exposed from side walls of each contact recess 121. In the present embodiment, a p⁺ type contact region 122 extends in the channel region 111 from a lower portion of the emitter region 120 along the side walls and the bottom of the contact recess 121 and has a higher p type impurity concentration than the channel region 111. The emitter region 120 may be exposed from the entirety of the side walls of the contact recess 121, and the contact region 122 may extend along only the bottom of the contact recess 121.

An insulation layer 123 is formed on the front surface 110A of the semiconductor substrate 110 to cover the trench gate structures 116. The insulation layer 123 may have a stacking structure in which insulation films are stacked or may have a monolayer structure formed of only a single insulation film. The insulation layer 123 may include, for example, an oxide film (SiO₂) or a nitride film (SiN). The insulation layer 123 includes contact holes 124 that expose the contact recesses 121 formed in the semiconductor substrate 110.

The contact holes 124 extend like belts in plan view and extend in the same direction as the contact recesses 121 and are in communication with the contact recesses 121 formed in the surface layer portion of the semiconductor substrate 110 located at the side of the front surface 110A. Walls of the contact holes 124 are flush with the walls of the contact recesses 121.

An emitter electrode 126 is formed on the insulation layer 123 with a barrier metal layer 125 located between the emitter electrode 126 and the insulation layer 123. The barrier metal layer 125 inhibits dispersion of the emitter electrode 126 out of the contact holes 124 and the contact recesses 121. In the present embodiment, the barrier metal layer 125 has a stacking structure including a titanium layer and a titanium nitride layer sequentially stacked from the side of the semiconductor substrate 110. The barrier metal layer 125 has a front surface located at the side of the semiconductor substrate 110 and a rear surface located at the opposite side from the front surface. The front surface and the rear surface of the barrier metal layer 125 are formed along the walls of the contact recesses 121, the walls of the contact holes 124, and the surface of the insulation layer 123 located outside the contact holes 124.

The emitter electrode 126 is formed on the barrier metal layer 125 to fill the contact recesses 121 and the contact holes 124 and cover the entire surface of the insulation layer 123. The emitter electrode 126 is electrically connected to, for example, the channel region 111, the emitter region 120, and the contact region 122 through the barrier metal layer 125 in the contact recesses 121.

A collector electrode 127 is formed at the rear surface 110B of the semiconductor substrate 110 and is electrically connected to the collector region 113 and the cathode region 114.

The diode 43 is formed of a p-n junction between the channel region 111 and the drift region 112. The diode 43 includes the channel region 111 as an anode region. The diode 43 is electrically connected to the emitter electrode 126 through the channel region 111 and is electrically connected to the collector electrode 127 through the cathode region 114. As described above, the RC-IGBT of the present embodiment has a configuration in which the diode 43 has an anode electrically connected to the emitter electrode 126 of the IGBT 42 and has a cathode electrically connected to the collector electrode 127 of the IGBT 42.

Figure 24:
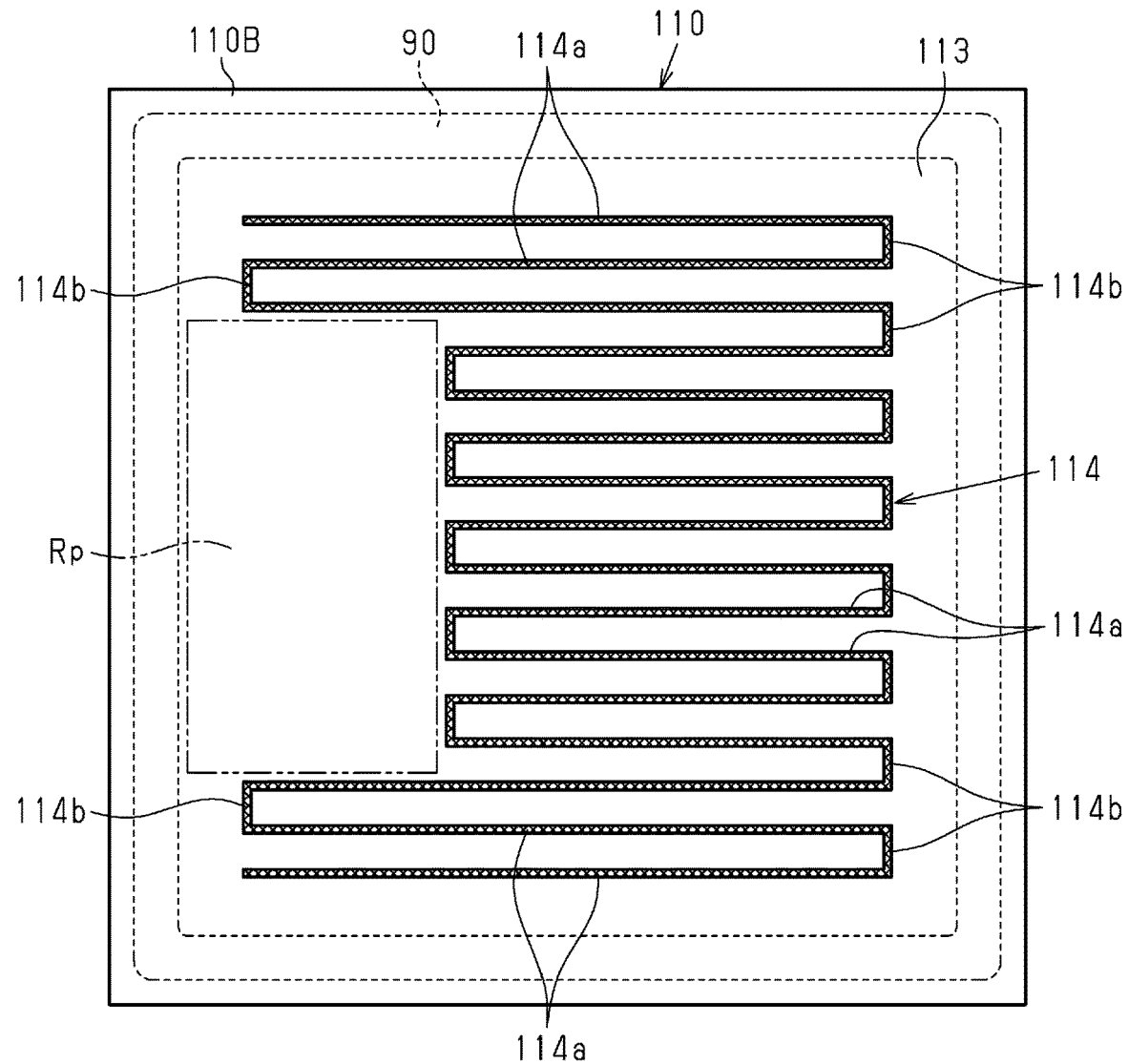
FIG. 24 is a bottom view of the RC-IGBT.

FIG. 24 shows the rear surface 110B of the semiconductor substrate 110. In the description hereafter, for the sake of convenience, a direction extending along the rear surface 110B is defined as "the W direction." As the semiconductor substrate 110 is viewed from the rear surface 110B, a direction orthogonal to the W direction is defined as "the V direction."

As shown in FIG. 24, the surface layer portion of the semiconductor substrate 110 located at the side of the rear surface 110B includes the cathode region 114 (cross-hatched portion) and the collector region 113. In the present embodiment, the n type impurity concentration of the cathode region 114 is higher than the p type impurity concentration of the collector region 113 so that the p type impurity in the collector region 113 is cancelled out by the n type impurity.

The cathode region 114 is formed in a predetermined pattern. More specifically, the cathode region 114 has a linear pattern that is continuously laid out. More specifically, the cathode region 114 includes first lines 114*a* and second lines 114*b*. The first lines 114*a* extend in the W direction and are spaced apart from each other in the V direction. The second lines 114*b* extend in the V direction and connect the first lines 114*a* that are adjacent to each other in the W direction. Some of the first lines 114*a* are longer in the W direction than the remaining first lines 114*a*. Some of the first lines 114*a* are located in a center of the rear surface 110B of the semiconductor substrate 110 in the V direction. The second lines 114*b* that connect adjacent ones of the first lines 114*a* in the V direction at one end in the W direction alternate in the V direction with the second lines 114*b* that connect adjacent ones of the first lines 114*a* in the V direction at the other end of the W direction. In the present embodiment, the cathode region 114 is not formed in a region Rp in which the gate electrode pad 92, the anode electrode pad 93, the cathode electrode pad 94, the current sense pad 95, and the emitter potential pad 96 (refer to FIG. 21) are arranged.

The cathode region 114 has a line width specified by the width of the first line 114*a* in the V direction and the width of the second line 114*b* in the W direction. For example, the line width of the cathode region 114 is preferably greater than or equal to 1 μm and less than or equal to 100 μm, and is more preferably greater than or equal to 10 μm and less than or equal to 50 μm. The cathode region 114 may have a uniform line width as shown in FIG. 24 or may have a nonuniform line width, which is not shown in the drawings. In an example of the nonuniform line width, the line width of the cathode region 114 may differ between some of the first lines 114*a* and the remaining first lines 114*a*. The line width of the cathode region 114 may differ between some of the second lines 114*b* and the remaining second lines 114*b*.

FIG. 25 shows a layout of the semiconductor module 40 of the present embodiment.

In the metal substrate 44, the semiconductor device 40A, which is an RC-IGBT, is mounted on the first wiring portion 44*c* formed on the insulation substrate 44*b*. More specifically, the collector electrode 127 (refer to FIG. 23) of the semiconductor device 40A is electrically connected to the first wiring portion 44*c* by solder or the like.

The emitter electrode pads 91A and 91B of the semiconductor device 40A and the second wiring portion 44*d* are connected by power wires 49*a*. In an example, the number of power wires 49*a* is six.

The semiconductor device 40A is connected to the five control terminals 45 by five control wires 49*b*. More specifically, the gate electrode pad 92, the current sense pad 95, the anode electrode pad 93, the cathode electrode pad 94, and the emitter potential pad 96 (refer to FIG. 21) of the semiconductor device 40A are connected to the five control terminals 45 by the respective control wires 49*b*.

Figure 26A:
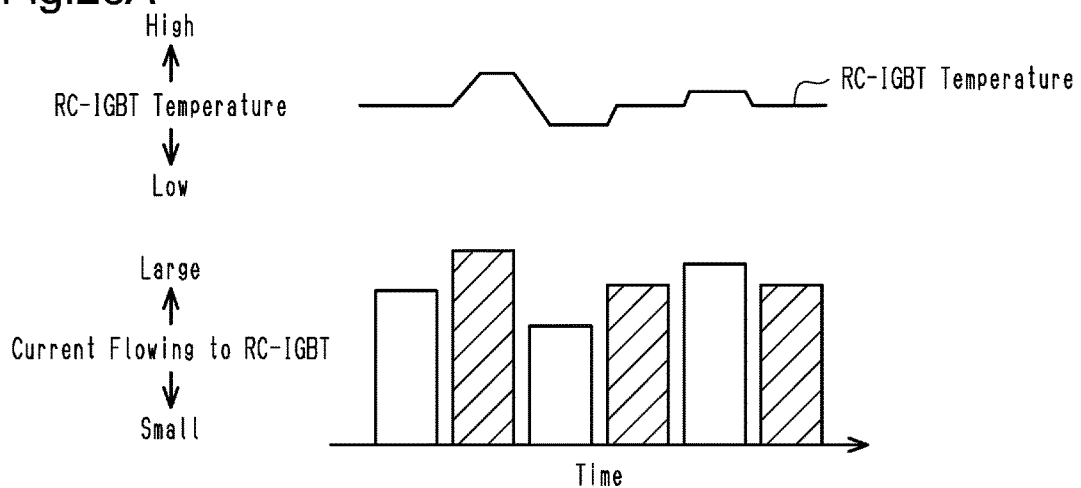
FIG. 26A is a graph showing current flowing to an IGBT and a diode of the RC-IGBT and temperature of the RC-IGBT.
Figure 26B:
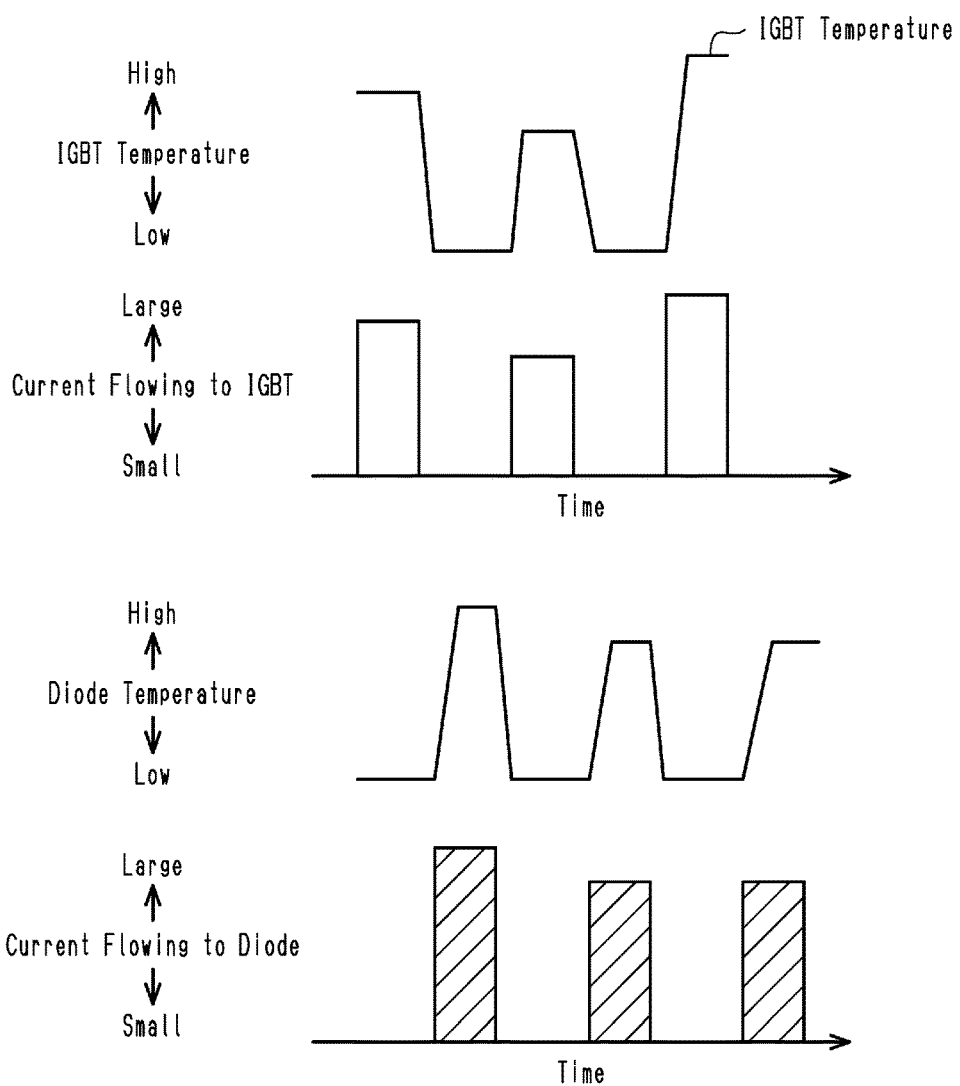
FIG. 26B is a graph of a comparative example in which an IGBT and a diode are separately formed including an upper graph showing current flowing to the IGBT and temperature of the IGBT and a lower graph showing current flowing to the diode and temperature of the diode.

Operation of the present embodiment will be described with reference to FIGS. 26A and 26B. In FIG. 26A, the upper graph schematically shows the temperature of the RC-IGBT including the IGBT 42 and the diode 43. In FIG. 26A, the lower bar chart shows changes in the absolute value of a current flowing to the RC-IGBT. In the lower bar chart in FIG. 26A, hatched bars show a current flowing to the diode 43 in the RC-IGBT, and solid bars show a current flowing to the IGBT 42 in the RC-IGBT. In FIG. 26B, the upper graph show changes in the temperature of the IGBT 42 when the IGBT 42 and the diode 43 are formed of separate semiconductor chips. In FIG. 26B, the upper bar chart shows changes in the current flowing to the IGBT 42. In FIG. 26B, the lower graph shows changes in the temperature of the diode 43 when the IGBT 42 and the diode 43 are formed of separate semiconductor chips. In FIG. 26B, the lower bar chart shows changes in the current flowing to the diode 43.

In a configuration in which semiconductor elements such as an IGBT and a diode are joined to bonding wires, changes in the temperature of the joined portions of the semiconductor elements and the bonding wires cause the semiconductor elements to separate from the bonding wires. The semiconductor elements are more likely to separate from the bonding wires as repetition of changes in the temperature of the joined portions of the semiconductor elements and the bonding wires increases. The relationship between separation of the semiconductor elements from the bonding wires and the number of repetitions of changes in the temperature of the joined portions of the semiconductor elements and the bonding wires is expressed as a power cycle tolerable amount. As a change amount of the temperature of the joined portions of the semiconductor elements and the bonding wires increases, the number of times of repetition of changes in the temperature of the joined portions of the semiconductor elements and the bonding wires decreases until the semiconductor elements separate from the bonding wires. That is, as the change amount of the temperature of the joined portions of the semiconductor elements and the bonding wires increases, the power cycle tolerable amount decreases.

As shown in FIG. 26B, when a driving current flows from the battery module 21 to the inverter circuit 12, the driving current flows to the IGBT 42 but does not flow to the diode 43. Therefore, while the temperature of the IGBT 42 increases, the temperature of the diode 43 does not increase. When a regenerative current flows from the inverter circuit 12 to the battery module 21, the regenerative current flows to the diode 43 but does not flow to the IGBT 42. Therefore, while the temperature of the diode 43 increases, the temperature of the IGBT 42 does not increase.

Thus, when the driving current flows and when the regenerative current flows, changes in the temperature of the IGBT 42 repeat, and changes in the temperature of the diode 43 repeat. When the regenerative current flows, the temperature of the IGBT 42 decreases. This increases the change amount of the temperature of the IGBT 42. When the driving current flows, the temperature of the diode 43 decreases. This increases the change amount of the temperature of the diode 43. As a result, the power cycle tolerable amount decreases.

In this regard, in the present embodiment, the IGBT 42 and the diode 43 are formed on the same semiconductor chip, so that the temperature of the RC-IGBT increases in accordance with both an increase in the temperature of the IGBT 42 and an increase in the temperature of the diode 43. Thus, as shown in FIG. 26A, changes in the temperature of the RC-IGBT are small between when the driving current flows and when the regenerative current flows. In addition, as long as the driving current and the regenerative current flow, changes in the temperature of the IGBT 42 and the diode 43, which affect the power cycle tolerable amount, are small. This reduces the number repetitions of changes in the temperature of the IGBT 42 and the diode 43. As a result, the RC-IGBT is used for a long period.

The present embodiment has the following advantages.

(3-1) The IGBT 42 and the diode 43 are formed on the same semiconductor substrate 110. This configuration eliminates the need for a power wire that electrically connects the IGBT 42 and the diode 43 as compared to a configuration in which the IGBT 42 and the diode 43 are formed on separate semiconductor substrates. This simplifies the configuration of the semiconductor module 40. In addition, changes in the temperature of each semiconductor element are reduced, thereby improving the reliability of power cycles.

Fourth Embodiment

A fourth embodiment of a semiconductor unit 41 will be described with reference to FIGS. 27 to 28. The semiconductor unit 41 of the present embodiment differs from the semiconductor unit 41 of the second embodiment in the configuration of the semiconductor module 40 and the control circuit 33. In the description hereafter, the same reference numerals are given to those components that are the same as the corresponding components of the semiconductor unit 41 of the second embodiment. Such components may not be described in detail.

Figure 27:
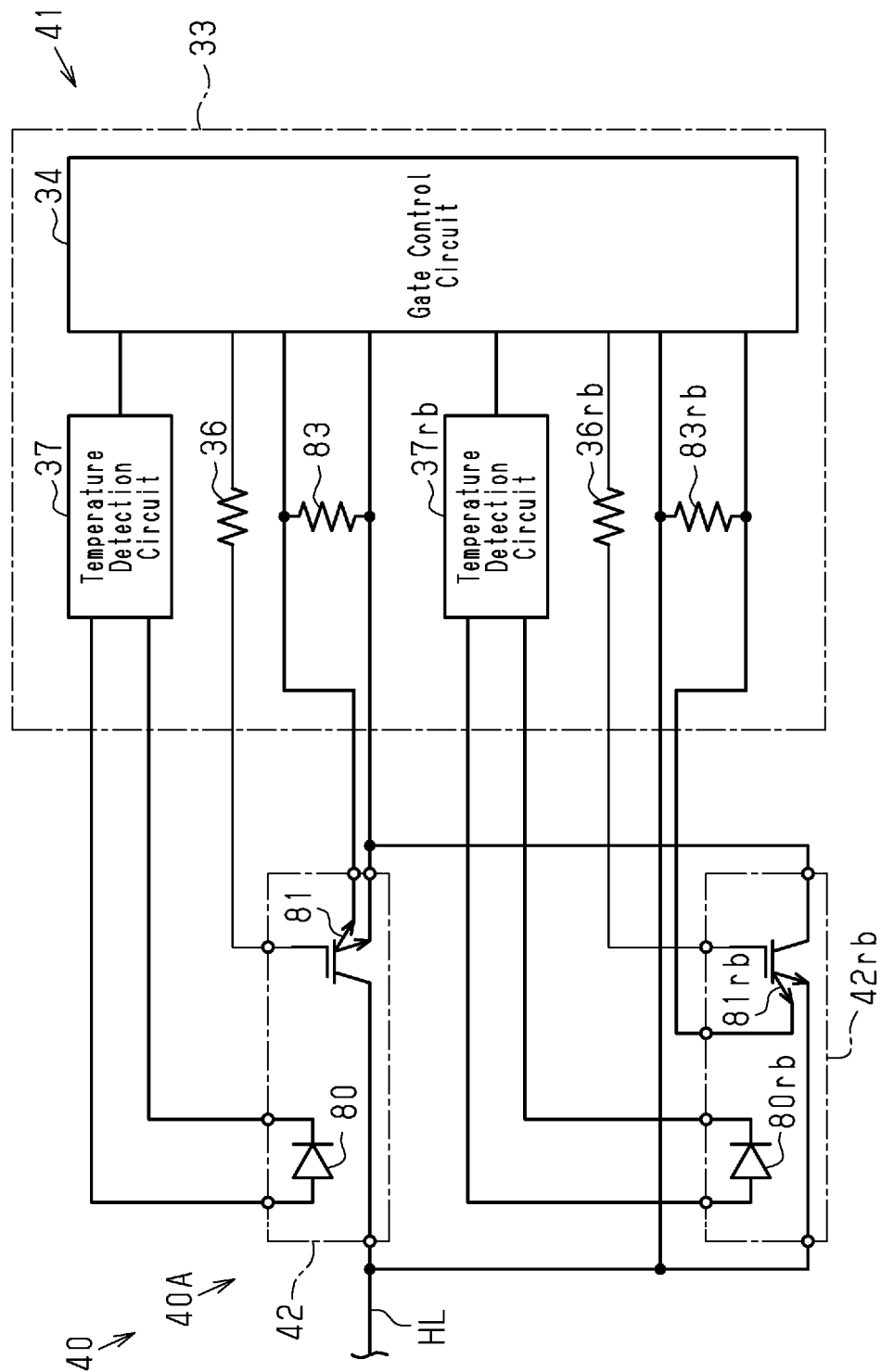
FIG. 27 is a circuit diagram showing a fourth embodiment of a semiconductor unit.

As shown in FIG. 27, the semiconductor device 40A of the semiconductor module 40 includes the IGBT 42 and a reverse blocking insulated gate bipolar transistor 42rb (RB-IGBT) connected in parallel to the IGBT 42. In an example, the emitter of the RB-IGBT 42rb is connected to the collector of the IGBT 42, and the collector of the RB-IGBT 42rb is connected to the emitter of the IGBT 42.

The gate of the IGBT 42 is connected to the current limiting resistor 36. The gate of the IGBT 42rb is connected to the current limiting resistor 36rb. In an example, the resistance value of the current limiting resistor 36 is equal to the resistance value of the current limiting resistor 36rb. The gate drive signal Sg from the gate control circuit 34 is simultaneously supplied to the gate of the IGBT 42 and the gate of the RB-IGBT 42rb via the current limiting resistors 36 and 36rb. Thus, the IGBT 42 and the RB-IGBT 42rb are synchronously operated, for example, simultaneously activated and simultaneously deactivated. The RB-IGBT 42rb has a dielectric strength in two directions, that is, a forward direction and a reverse direction. The resistance value of the current limiting resistor 36 may differ from the resistance value of the current limiting resistor 36rb.

As shown in FIG. 27, the RB-IGBT 42rb includes a temperature-sensing diode 80rb configured to detect a temperature of the RB-IGBT 42rb and a current sense element 81rb configured to detect a current flowing to the RB-IGBT 42rb. The current sense element 81rb is arranged so that a current sense ratio, which is a ratio of a current flowing from the current sense element 81rb to a current flowing from the emitter of the RB-IGBT 42rb, equals, for example, 1/1000.

A sense resistor 83rb is arranged between the gate control circuit 34 and the current sense element 81rb. The gate control circuit 34 is connected to opposite ends of the sense resistor 83rb to detect a current flowing from the emitter of the RB-IGBT 42rb based on a voltage between the opposite ends of the sense resistor 83rb. When the voltage between opposite ends of the sense resistor 83rb is greater than or equal to a first threshold value, the gate control circuit 34 deactivates the RB-IGBT 42rb.

The control circuit 33 includes a temperature detection circuit 37rb. The temperature detection circuit 37rb is connected to an anode and a cathode of the temperature-sensing diode 80rb. The temperature detection circuit 37rb supplies a predetermined current to the temperature-sensing diode 80rb to measure a voltage between opposite ends of the temperature-sensing diode 80rb. The temperature detection circuit 37rb outputs the measured voltage of the temperature-sensing diode 80rb to the gate control circuit 34. The temperature-sensing diode 80rb has a characteristic such that the threshold voltage decreases as the temperature increases. Thus, the temperature of the temperature-sensing diode 80rb, that is, the temperature of the RB-IGBT 42rb, is obtained from the voltage between opposite ends of the temperature-sensing diode 80rb. The temperature detection circuit 37rb, for example, outputs a signal to the gate control circuit 34 when the voltage between opposite ends of the temperature-sensing diode 80rb becomes greater than or equal to a threshold value that corresponds to a temperature threshold value of the IGBT 42rb. The temperature threshold value is a temperature that may lead the IGBT 42rb to break and is determined in advance through tests or the like.

In an example, when the voltage between opposite ends of the temperature-sensing diode 80rb becomes greater than or equal to the threshold value, the control circuit 33 switches the RB-IGBT 42rb from the activation state to the deactivation state. More specifically, the control circuit 33 outputs a gate drive signal Sg (current decrease signal) that deactivates the RB-IGBT 42rb through the gate control circuit 34 to the gate of the RB-IGBT 42rb. Thus, in the present embodiment, when the temperature of at least one of the IGBT 42 and the RB-IGBT 42rb becomes greater than or equal to the temperature threshold value, the IGBT 42 and the RB-IGBT rb are deactivated.

Figure 28:
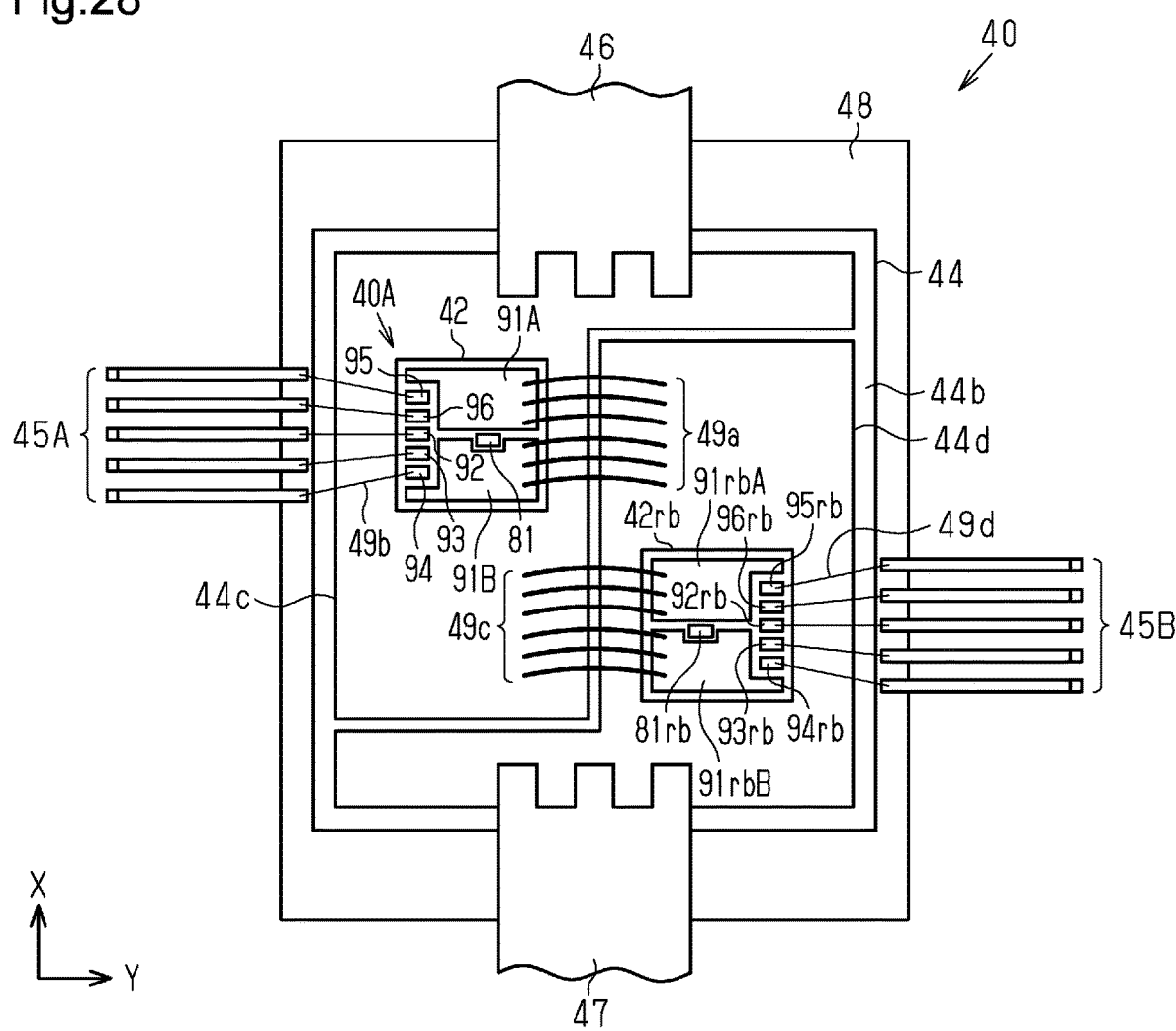
FIG. 28 is a schematic plan view of a semiconductor module showing a layout of a semiconductor device.

FIG. 28 shows a layout of the semiconductor module 40 of the present embodiment. In the description hereafter, the same reference numerals are given to those components that are the same as the corresponding components of the semiconductor module 40 of the second embodiment. Such components may not be described in detail.

As shown in FIG. 28, the first wiring portion 44c and the second wiring portion 44d, which are formed on the insulation substrate 44b of the metal substrate 44, differ in shape from the first wiring portion 44c and the second wiring portion 44d of the second embodiment. In the present embodiment, the first wiring portion 44c and the second wiring portion 44d are identical in shape. In plan view, each of the first wiring portion 44c and the second wiring portion 44d is rectangular so that the long sides extend in the first direction X.

The IGBT 42 is mounted on the first wiring portion 44c. The RB-IGBT 42rb is mounted on the second wiring portion 44d. The mount position of the IGBT 42 differs from the mount position of the RB-IGBT 42rb in the first direction X. In an example, as shown in FIG. 28, the IGBT 42 is located closer to the connection terminal 46 in the first direction X than the RB-IGBT 42rb is.

The emitter electrode pads 91A and 91B of the IGBT 42 and the second wiring portion 44d are connected by power wires 49a. In an example, the number of power wires 49a is six.

In an example, in the same manner as the IGBT 42, a collector electrode (not shown) is formed on a surface (rear surface) of the RB-IGBT 42rb located at the side of the first wiring portion 44c in the third direction Z, and emitter electrode pads 91rbA and 91rbB are formed on a front surface of the RB-IGBT 42rb located at the opposite side from the rear surface in the third direction Z. In addition, in the same manner as the IGBT 42, the gate electrode pad 92, the temperature-sensing diode 80rb, an anode electrode pad 93rb, a cathode electrode pad 94rb, the current sense element 81rb, a current sense pad 95rb, and an emitter potential pad 96rb are formed on the front surface of the RB-IGBT 42rb.

The emitter electrode pads 91rbA and 91rbB of the RB-IGBT 42rb and the first wiring portion 44c are connected by power wires 49c. In an example, the number of power wires 49c is six.

The semiconductor module 40 includes control terminals 45A and 45B. Five control terminals 45A and five control terminals 45B are provided. The control terminals 45A are electrically connected to the IGBT 42. The control terminals 45B are electrically connected to the RB-IGBT 42rb. The mount position of the five control terminals 45A differs from the mount position of the five control terminals 45B in the first direction X. In an example, as shown in FIG. 28, the five control terminals 45A are located closer to the connection terminal 46 in the first direction X than the five control terminals 45B are. The control terminals 45A and the second wiring portion 44d are located at opposite sides of the first wiring portion 44c in the second direction Y. The control terminals 45B and the first wiring portion 44c are located at opposite sides of the second wiring portion 44d in the second direction Y. The five control terminals 45B are arranged to overlap the RB-IGBT 42rb as viewed in the first direction X.

In the IGBT 42, as in the second embodiment, the gate electrode pad 92, the current sense pad 95, the anode electrode pad 93, the cathode electrode pad 94, and the emitter potential pad 96 are connected to the five control terminals 45A by the control wires 49b.

In the RB-IGBT 42rb, in the same manner as the IGBT 42, a gate electrode pad 92rb, a current sense pad 95rb, an anode electrode pad 93rb, a cathode electrode pad 94rb, and an emitter potential pad 96rb are connected to the five control terminals 45B by control wires 49d.

The present embodiment has the following advantages in addition to the advantages of the second embodiment.

(4-1) The RB-IGBT 42rb includes the current sense element 81rb, to which a current flows in proportion to a current flowing from the emitter of the RB-IGBT 42rb. The gate control circuit 34 detects a current flowing to the RB-IGBT 42rb based on a current flowing to the sense resistor 83rb connected to the current sense element 81rb. When the current is greater than or equal to the threshold value, the RB-IGBT 42rb is deactivated. With this configuration, when an overcurrent flows to the RB-IGBT 42rb, the RB-IGBT 42rb is deactivated to block the current. This configuration achieves a reduction in size and ensures the current is blocked in a short time as compared to a mechanical contact type relay.

(4-2) When the temperature of the RB-IGBT 42rb is greater than or equal to the temperature threshold value, the RB-IGBT 42rb is deactivated. With this configuration, when a large current flows to the RB-IGBT 42rb and results in an increase in the temperature of the RB-IGBT 42rb, the current flowing to the RB-IGBT 42rb is blocked. That is, when a regenerative current causes an overcurrent or an excessive temperature increase, the RB-IGBT 42rb blocks the current.

Fifth Embodiment

A fifth embodiment of a semiconductor unit 41 will be described with reference to FIGS. 29 to 31B. The semiconductor unit 41 of the present embodiment differs from the semiconductor unit 41 of the first embodiment in the configuration of the semiconductor module 40. In the description hereafter, the same reference numerals are given to those components that are the same as the corresponding components of the semiconductor unit 41 of the first embodiment. Such components may not be described in detail.

Figure 29:
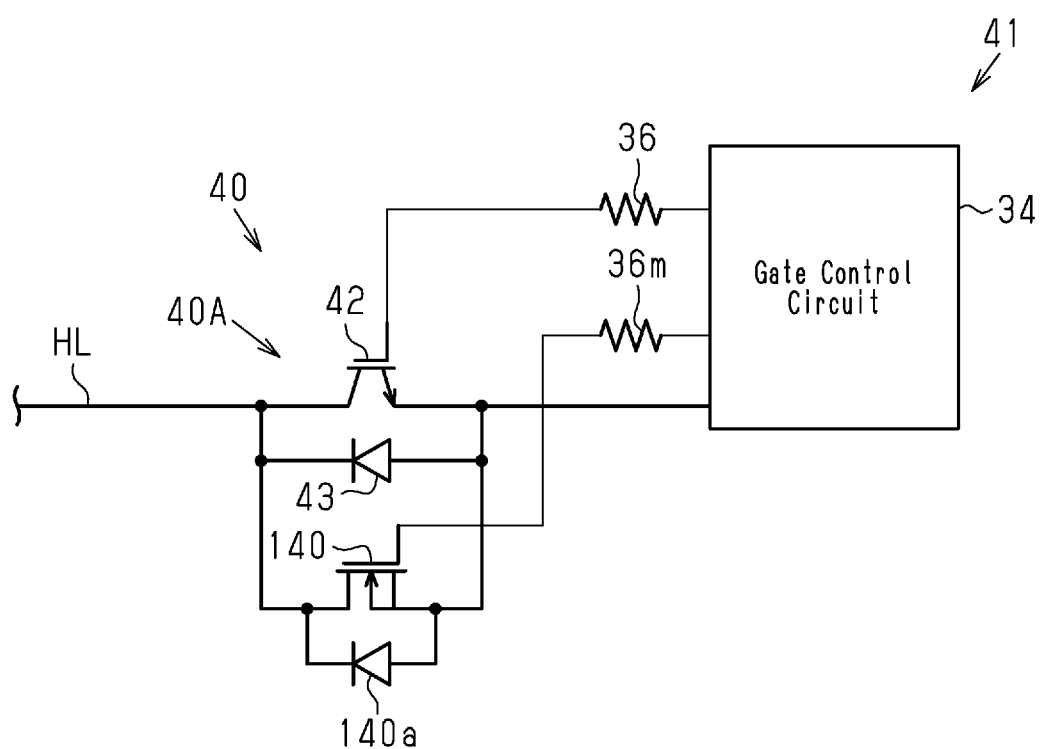
FIG. 29 is a circuit diagram showing a fifth embodiment of a semiconductor unit.

As shown in FIG. 29, in the present embodiment, the semiconductor device 40A of the semiconductor module 40 includes the IGBT 42, the diode 43, and a metal-oxide-semiconductor field-effect transistor 140 (MOSFET). An example of the MOSFET 140 is formed from a silicon carbide (SiC) semiconductor substrate, that is, a wide-bandgap semiconductor. In the present embodiment, the MOSFET 140 is an N-channel MOSFET. The MOSFET 140 includes a body diode 140a. The MOSFET 140 may be a MOSFET formed from a nitride semiconductor such as gallium nitride (GaN).

In the semiconductor device 40A, the diode 43 is connected in antiparallel to the IGBT 42, and the MOSFET 140 is connected in parallel to the IGBT 42. More specifically, an anode of the diode 43 and the source of the MOSFET 140 are connected to the emitter of the IGBT 42. A cathode of the diode 43 and the drain of the MOSFET 140 are connected to the collector of the IGBT 42.

The gate of the IGBT 42 and the gate of the MOSFET 140 are connected to the gate control circuit 34. The current limiting resistor 36 is arranged between the gate of the IGBT 42 and the gate control circuit 34. A current limiting resistor 36m is arranged between the gate of the MOSFET 140 and the gate control circuit 34. The gate control circuit 34 outputs a gate drive signal Sg to each of the gate of the IGBT 42 and the gate of the MOSFET 140. The gate drive signal Sg is a common signal to the IGBT 42 and the MOSFET 140. Thus, the IGBT 42 and the MOSFET 140 are synchronously operated based on the gate drive signal Sg.

Figure 30:
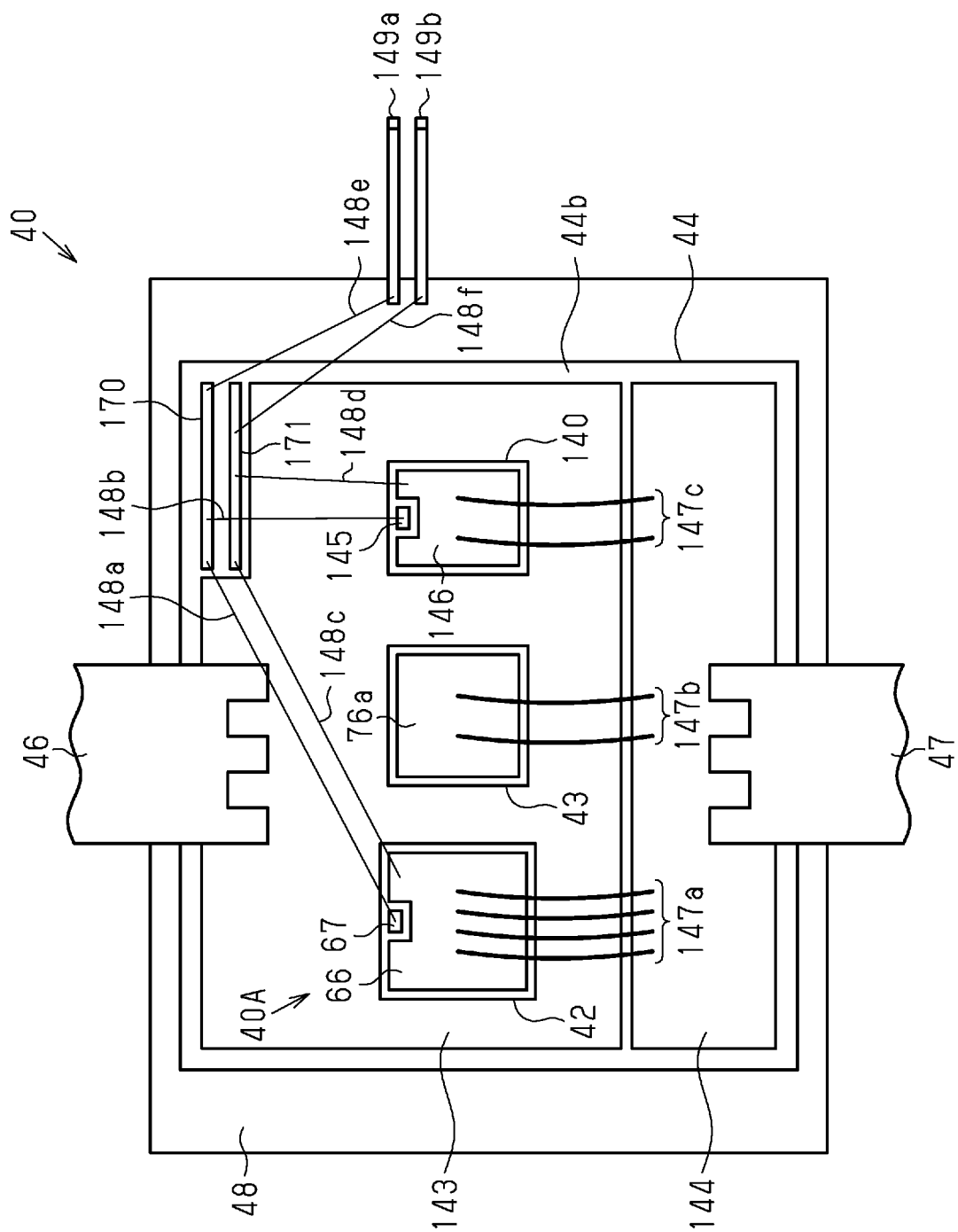
FIG. 30 is a schematic plan view of a semiconductor module showing a layout of a semiconductor device.

FIG. 30 shows a layout of the semiconductor module 40 of the present embodiment.

As shown in FIG. 30, a first wiring portion 143, a second wiring portion 144, and two third wiring portions 170 and 171 are arranged on the insulation substrate 44b of the metal substrate 44. In an example, the first wiring portion 143 and the second wiring portion 144 are spaced apart and opposed to each other in the first direction X. The connection terminal 46 is connected to the first wiring portion 143. The connection terminal 47 is connected to the second wiring portion 144. In an example, the third wiring portions 170 and 171 are arranged to overlap the connection terminal 46 as viewed in the second direction Y.

The IGBT 42, the diode 43, and the MOSFET 140 are arranged on the first wiring portion 143 and spaced apart from each other in the second direction Y. The collector electrode 64 of the IGBT 42, the cathode electrode pad 77 of the diode 43, and a drain electrode of the MOSFET 140 are electrically connected to the first wiring portion 143 by solder or the like.

The IGBT 42 includes the emitter electrode pad 66 and the gate electrode pad 67. Although not included in the IGBT 42 of the present embodiment, the anode electrode pad 93, the cathode electrode pad 94, the current sense pad 95, and the emitter potential pad 96 may be used as pads. The diode 43 includes the anode electrode pad 76*a*. The MOSFET 140 includes a source electrode pad 145 and a gate electrode pad 146. The emitter electrode pad 66 of the IGBT 42 and the second wiring portion 144 are connected by power wires 147*a*. The anode electrode pad 76*a* of the diode 43 and the second wiring portion 144 are connected by power wires 147*b*. The source electrode pad 145 of the MOSFET 140 and the second wiring portion 144 are connected by power wires 147*c*. In an example, the number of power wires 147*a* is four, the number of power wires 147*b* is two, and the number of power wires 147*c* is two.

The semiconductor module 40 includes control terminals 149*a* and 149*b*. The gate and the emitter of the IGBT 42 and the gate and the source of the MOSFET 140 are electrically connected to the control terminals 149*a* and 149*b*. More specifically, the gate electrode pad 67 of the IGBT 42 is electrically connected to the third wiring portion 170 by a control wire 148*a*. The gate electrode pad 146 of the MOSFET 140 is electrically connected to the third wiring portion 170 by a control wire 148*b*. The emitter electrode pad 66 of the IGBT 42 is electrically connected to the third wiring portion 171 by a control wire 148*c*. The source electrode pad 145 of the MOSFET 140 is electrically connected to the third wiring portion 171 by a control wire 148*d*. The third wiring portion 170 is connected to the control terminal 149*a* by a control wire 148*e*. The third wiring portion 171 is connected to the control terminal 149*b* by a control wire 148*f*.

The MOSFET 140 has a characteristic that allows a current to flow in a voltage range where the collector-emitter voltage of the IGBT 42 is lower than an offset voltage. The current flowing to the MOSFET 140 is smaller than a current flowing to the IGBT 42. In addition, an increase amount of the current flowing to the MOSFET 140 in relation to increases in the drain-source voltage of the MOSFET 140 is smaller than an increase amount of the current flowing to the IGBT 42 in relation to increases in the collector-emitter voltage of the IGBT 42.

When the gate of the MOSFET 140 is turned on, the MOSFET 140 is used as a path through which the regenerative current flows from the source to the drain. The MOSFET 140 has a reverse conduction characteristic that allows a current to flow at a voltage lower than an activating voltage of the diode 43. The current flowing to the MOSFET 140 in the reverse direction is smaller than the current flowing to the diode 43. In addition, an increase amount of the current flowing to the MOSFET 140 in the reverse direction in relation to increases in the source-drain voltage of the MOSFET 140 is smaller than an increase amount of the current flowing to the diode 43 in relation to increases in the voltage between terminals of the diode 43.

Figure 31A:
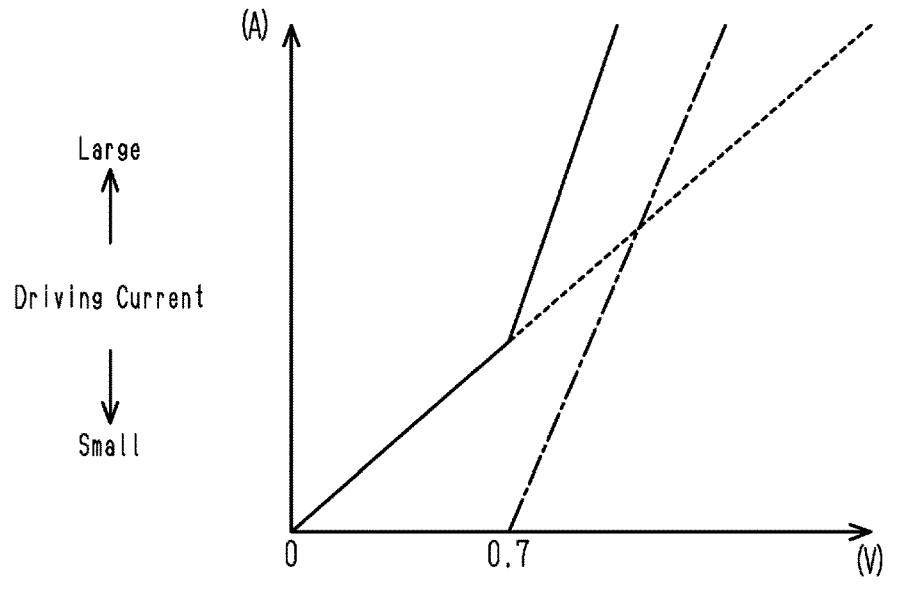
FIG. 31A is a graph showing a relationship between a driving current flowing to an IGBT and a MOSFET and a terminal-to-terminal voltage of a semiconductor module.

When a driving current is supplied from the battery module 21 to the inverter circuit 12, the driving current flows to the IGBT 42 and the MOSFET 140. FIG. 31A shows a relationship between the driving current flowing to the IGBT 42 and the MOSFET 140 and a terminal-to-terminal voltage of the semiconductor module 40. In the graph shown in FIG. 31A, the broken line indicates changes in the current flowing to the MOSFET 140, the single-dashed line indicates changes in the current flowing to the IGBT 42, the solid line indicates changes in the total current (driving current) of the MOSFET 140 and the IGBT 42.

As shown in FIG. 31A, when the collector-emitter voltage of the IGBT 42 is less than the offset voltage (In FIG. 31A, 0.7 V), the driving current flows to the MOSFET 140 and does not flow to the IGBT 42. When the collector-emitter voltage of the IGBT 42 is greater than or equal to the offset voltage, the driving current flows to the IGBT 42 in addition to the MOSFET 140.

Figure 31B:
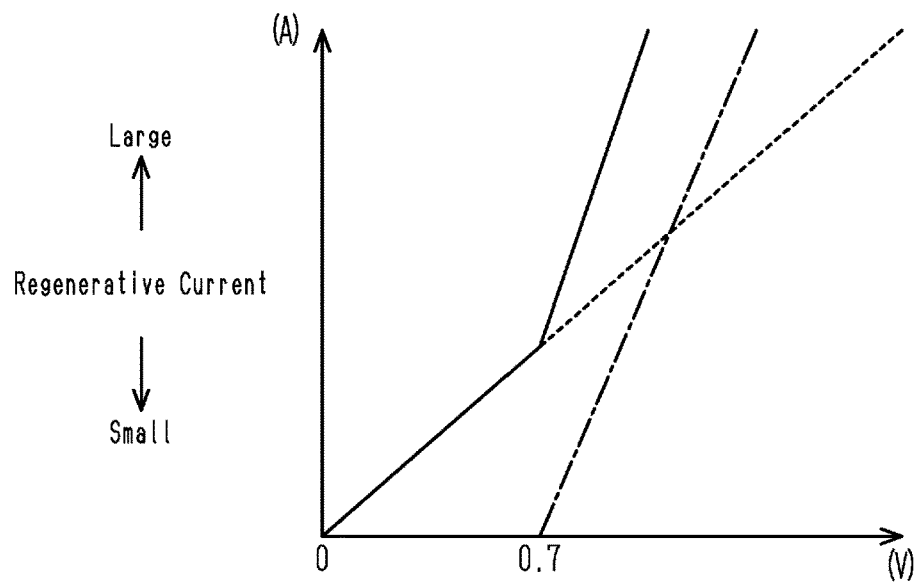
FIG. 31B is a graph showing a relationship between a current flowing to a diode of the semiconductor device and a forward voltage during regenerative operation of the vehicle.

When a regenerative current is supplied from the inverter circuit 12 to the battery module 21, the regenerative current flows to the diode 43 and the MOSFET 140. FIG. 31B shows a relationship between the regenerative current flowing to the diode 43 and the MOSFET 140 in the reverse direction and a terminal-to-terminal voltage of the semiconductor module 40. In the graph shown in FIG. 31B, the broken line indicates changes in the current flowing to the MOSFET 140 in the reverse direction, the single-dashed line indicates changes in the current flowing to the diode 43*a*, and the solid line indicates changes in the total current (regenerative current) of the diode 43*a* and the MOSFET 140.

As shown in FIG. 31B, when the terminal-to-terminal voltage of the diode 43*a* is less than the activating voltage (in FIG. 31B, 0.7 V), the regenerative current flows to the MOSFET 140 and does not flow to the diode 43*a*. When the terminal-to-terminal voltage of the diode 43*a* is greater than or equal to the activating voltage, the regenerative current flows to the diode 43*a* in addition to the MOSFET 140. Thus, addition of the MOSFET 140 to the semiconductor device 40A reduces the conduction loss when the driving current and the regenerative current are low.

The present embodiment has the following advantages.

(5-1) The semiconductor device 40A includes the IGBT 42, the diode 43 connected in antiparallel to the IGBT 42, and the MOSFET 140 connected in parallel to the IGBT 42. In this configuration, when a driving current is supplied from the battery module 21 to the inverter circuit 12, the driving current flows through the MOSFET 140 in a voltage range where the collector-emitter voltage of the IGBT 42 is less than the offset voltage. When a regenerative current is supplied from the inverter circuit 12 to the battery module 21, the regenerative current flows to the MOSFET 140 in a voltage range that is lower than the activating voltage of the diode 43*a*. Thus, the driving current is more promptly supplied from the battery module 21 to the inverter circuit 12, and the regenerative current is more promptly supplied from the inverter circuit 12 to the battery module 21.

Sixth Embodiment

A sixth embodiment of the semiconductor unit 41 will now be described with reference to FIGS. 32 and 33. The semiconductor unit 41 of the present embodiment differs from the semiconductor unit 41 of the first embodiment in the configuration of the control circuit 33 and control of the semiconductor unit 41. In the description hereafter, the same reference numerals are given to those components that are the same as the corresponding components of the semiconductor unit 41 of the first embodiment. Such components may not be described in detail.

Figure 32:
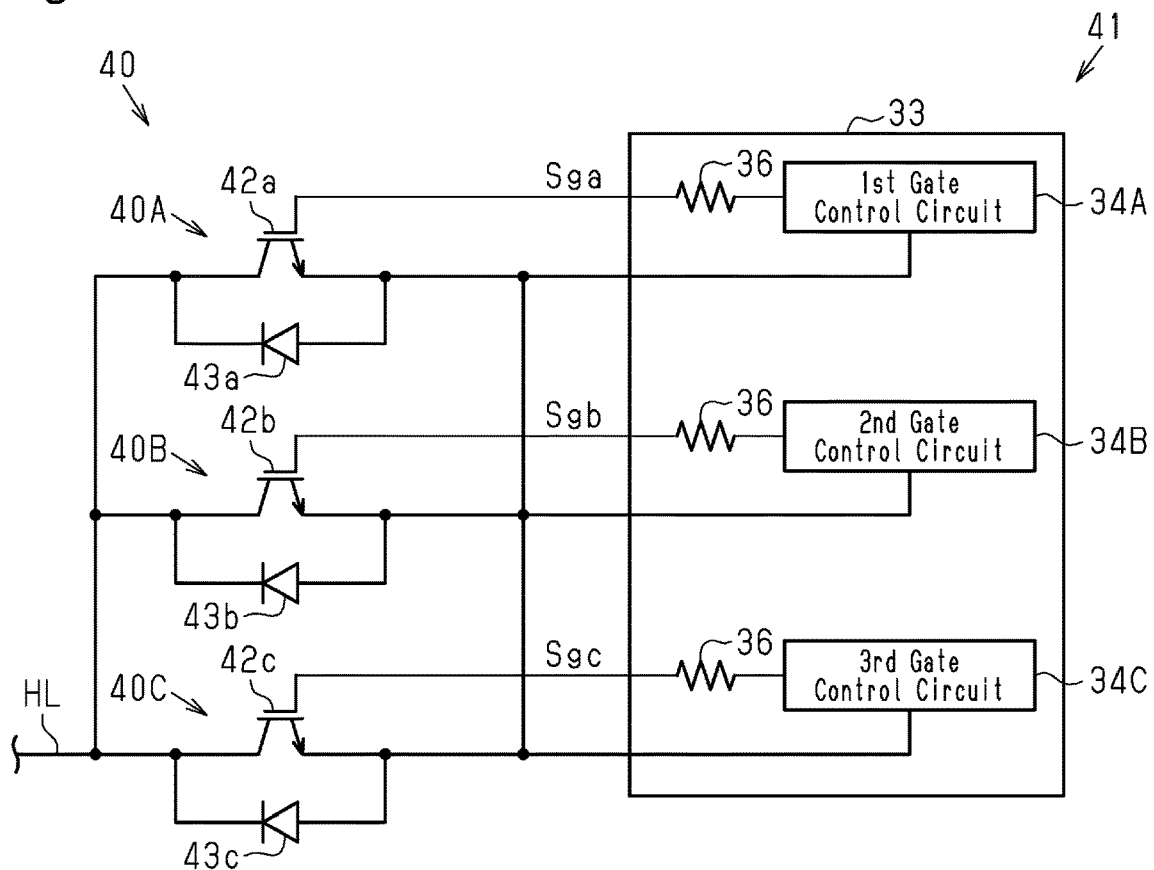
FIG. 32 is a circuit diagram showing a sixth embodiment of a semiconductor unit.

As shown in FIG. 32, the semiconductor unit 41 of the present embodiment includes a first semiconductor device 40A, a second semiconductor device 40B, and a third semiconductor device 40C. The first semiconductor device 40A includes an IGBT 42*a* and the diode 43*a*. The second semiconductor device 40B includes an IGBT 42*b* and a diode 43*b*. The third semiconductor device 40C includes an IGBT 42*c* and a diode 43*c*. The IGBTs 42*a* to 42*c* are connected in parallel. The diodes 43*a* to 43*c* are connected in parallel.

In the first semiconductor device 40A, the diode 43*a* is connected in antiparallel to the IGBT 42*a*. More specifically, an anode of the diode 43*a* is connected to the emitter of the IGBT 42*a*, and a cathode of the diode 43*a* is connected to the collector of the IGBT 42*a*.

In the second semiconductor device 40B, the diode 43*b* is connected in antiparallel to the IGBT 42*b*. More specifically, an anode of the diode 43*b* is connected to the emitter of the IGBT 42*b*, and a cathode of the diode 43*b* is connected to the collector of the IGBT 42*b*.

In the third semiconductor device 40C, the diode 43*c* is connected in antiparallel to the IGBT 42*c*. More specifically, an anode of the diode 43*c* is connected to the emitter of the IGBT 42*c*, and a cathode of the diode 43*c* is connected to the collector of the IGBT 42*c*.

The control circuit 33 includes a first gate control circuit 34A, a second gate control circuit 34B, and a third gate control circuit 34C. The first gate control circuit 34A is electrically connected to the gate of the IGBT 42*a*. The second gate control circuit 34B is connected to the gate of the IGBT 42*b*. The third gate control circuit 34C is connected to the gate of the IGBT 42*c*. Current limiting resistors 36 are arranged between the first gate control circuit 34A and the gate of the IGBT 42*a*, between the second gate control circuit 34B and the gate of the IGBT 42*b*, and between the third gate control circuit 34C and the gate of the IGBT 42*c*. The three current limiting resistors 36 have the same resistance value. Preferably, the resistance value of the current limiting resistors 36 is greater than or equal to 100Ω. In the present embodiment, the resistance value of the current limiting resistors 36 is 500Ω.

The first gate control circuit 34A outputs a gate drive signal Sga to the gate of the IGBT 42*a*. The second gate control circuit 34B outputs a gate drive signal Sgb to the gate of the IGBT 42*b*. The third gate control circuit 34C outputs a gate drive signal Sgc to the gate of the IGBT 42*c*. Thus, the IGBTs 42*a* to 42*c* are separately controlled by the gate control circuits 34A to 34C.

Figure 33:
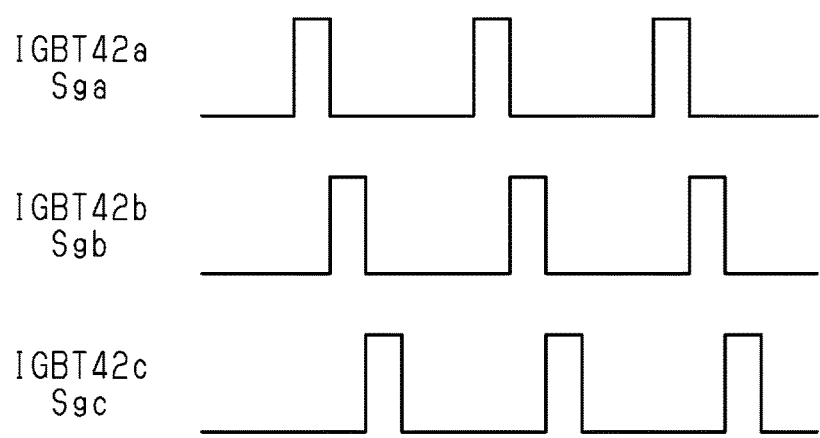
FIG. 33 is a graph showing a gate drive signal of each IGBT.

As shown in FIG. 33, during pre-charge control of the present embodiment, a time at which the gate drive signal Sga is input to the gate of the IGBT 42*a*, a time at which the gate drive signal Sgb is input to the gate of the IGBT 42*b*, and a time at which the gate drive signal Sgc is input to the gate of the IGBT 42*c* differ from each other. More specifically, first, the gate drive signal Sga is input to the gate of the IGBT 42*a*. After the IGBT 42*a* is deactivated again, the gate drive signal Sgb is input to the gate of the IGBT 42*b*. After the IGBT 42*b* is deactivated again, the gate drive signal Sgc is input to the gate of the IGBT 42*c*. After the IGBT 42*c* is deactivated again, the gate drive signal Sga is input to the gate of the IGBT 42*a*. Pre-charge control is executed by repeating this cycle.

The present embodiment has the following advantages.

(6-1) During pre-charge control, the control circuit 33 separately controls the IGBTs 42*a* to 42*c*. More specifically, during pre-charge control, the control circuit 33 applies a voltage to the gate of each of the IGBTs 42*a* to 42*c* at a time that differs between the IGBTs 42*a* to 42*c*. In this configuration, since the times at which a current flows to the IGBTs 42*a* to 42*c* differ from each other, heat is generated by the current flowing to the IGBTs 42*a* to 42*c* at different points in time. Thus, pre-charge control limits an excessive increase in the temperature of the IGBTs 42*a* to 42*c*. In addition, since the IGBTs 42*a* to 42*c* are not driven by a single gate drive circuit, that is, the IGBTs 42*a* to 42*c* are not simultaneously activated and deactivated, a concentrated flow of the current to one of the IGBTs 42*a* to 42*c* is avoided. In addition, as compared to a configuration in which the semiconductor unit 41 includes a single IGBT 42, the amount of current that is blocked by each of the IGBTs 42*a* to 42*c* is approximately ⅓. The non-simultaneous activation and deactivation of the IGBTs 42*a* to 42*c* avoid an overlap of surge voltages, thereby reducing a surge voltage of the collector of each of the IGBTs 42*a* to 42*c*.

MODIFIED EXAMPLES

The description related to the above embodiments exemplifies, without any intention to limit, applicable forms of a semiconductor device, a semiconductor module, a semiconductor unit, a relay unit, a battery unit, and a vehicle according to the present disclosure. In addition to the above embodiments, the semiconductor device, the semiconductor module, the semiconductor unit, the relay unit, the battery unit, and the vehicle according to the present disclosure can be applied to modified examples that are described below and at least two of the modified examples that do not contradict each other.

In the first to fifth embodiments, the number of IGBTs 42 in the semiconductor device 40A may be changed in any manner. For example, the semiconductor device 40A may include multiple IGBTs 42 that are connected in parallel. In this modified example, the configuration of the control circuit 33 may be changed to the configuration of the control circuit 33 in the sixth embodiment.

Figure 34:
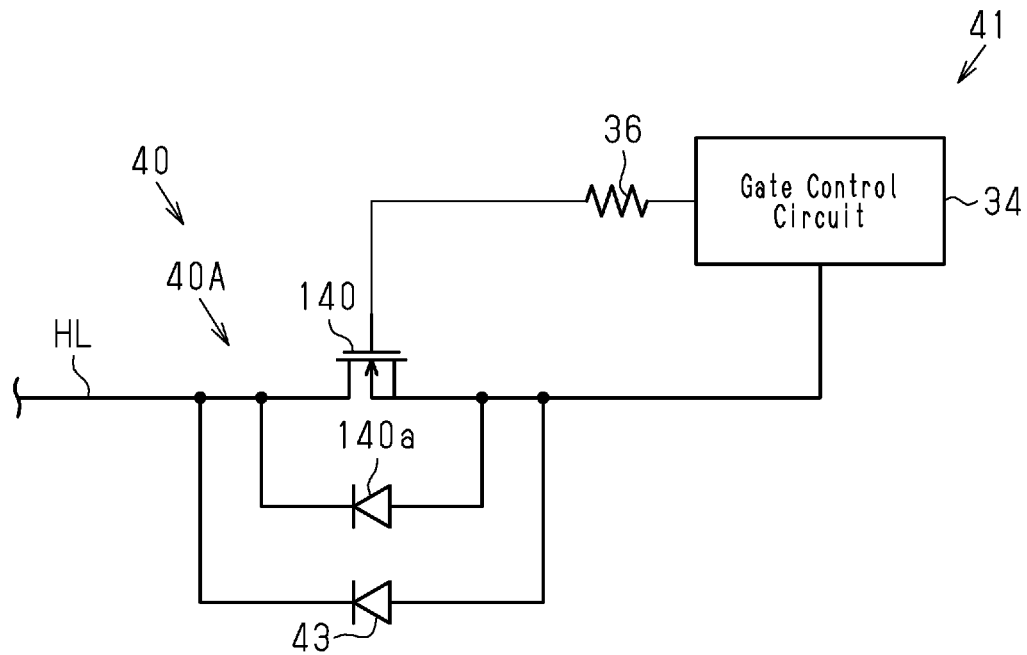
FIG. 34 is a circuit diagram showing a modified example of a semiconductor unit.
Figure 35:
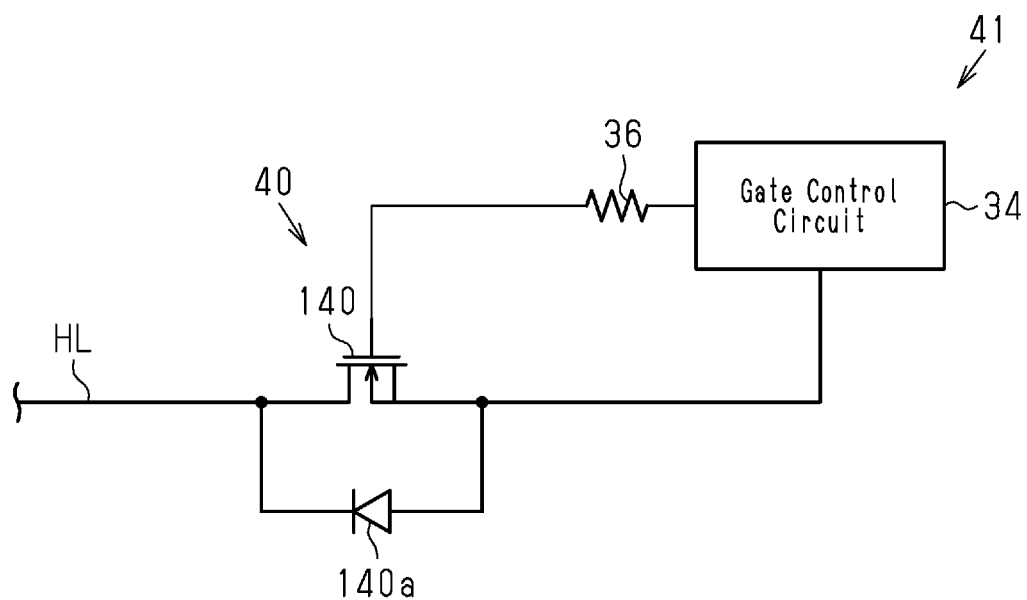
FIG. 35 is a circuit diagram showing a modified example of a semiconductor unit.

The configuration of the semiconductor device 40A is not limited to those of the above embodiments and may be, for example, configurations shown in FIGS. 34 and 35.

As shown in FIG. 34, the semiconductor device 40A includes a MOSFET 140 and a diode 43 that is connected in antiparallel to the MOSFET 140. More specifically, an anode of the diode 43 is connected to the source of the MOSFET 140, and a cathode of the diode 43 is connected to the drain of the MOSFET 140. The source and the drain of the MOSFET 140 are connected to the high-voltage line HL. The MOSFET 140 is, for example, an N-channel MOSFET. The drain of the MOSFET 140 corresponds to a first terminal of the semiconductor device 40A that is connected to the positive electrode of the battery module 21. The source of the MOSFET 140 corresponds to a second terminal of the semiconductor device 40A that is connected to the inverter circuit 12. The gate of the MOSFET 140 is connected to the gate control circuit 34. The MOSFET 140 may be a MOSFET formed from a silicon (Si) semiconductor substrate or a MOSFET formed from a silicon carbide (SiC) or gallium nitride (GaN) semiconductor substrate. The silicone (Si) MOSFET may have a super junction structure. The gallium nitride (GaN) MOSFET may have a high electron mobility transistor (HEMT) structure.

When a current flows from the battery module 21 toward the inverter circuit 12, the current flows to the MOSFET 140. When a current flows from the inverter circuit 12 toward the battery module 21, the current flows to the diode 43 and the MOSFET 140 in the reverse direction and flows to the body diode 140*a*.

As shown in FIG. 35, the semiconductor device 40A includes a MOSFET 140 including a body diode 140*a*. The source and the drain of the MOSFET 140 are connected to the high-voltage line HL. The gate of the MOSFET 140 is connected to the gate control circuit 34. The MOSFET 140 is, for example, an N-channel MOSFET. The drain of the MOSFET 140 corresponds to a first terminal of the semiconductor device 40A that is connected to the positive electrode of the battery module 21. The source of the MOSFET 140 corresponds to a second terminal of the semiconductor device 40A that is connected to the inverter circuit 12.

When a current flows from the battery module 21 toward the inverter circuit 12, the current flows to the MOSFET 140. When a current flows from the inverter circuit 12 toward the battery module 21, the current flows to the MOSFET 140 in the reverse direction and flows to the body diode 140*a*.

In the modified examples shown in FIGS. 34 and 35, the MOSFET 140 may have a current sense element configured to detect a current flowing to the MOSFET. A current flows to the current sense element in proportion to a current flowing to the MOSFET. In this case, it is preferred that the MOSFET including the current sense element includes the current sense pad 95.

In the modified examples shown in FIGS. 34 and 35, the MOSFET 140 may have a temperature-sensing diode configured to detect the temperature of the MOSFET. In this case, it is preferred that the MOSFET including the temperature-sensing diode includes the anode electrode pad 93 and the cathode electrode pad 94.

In the modified examples shown in FIGS. 34 and 35, the configuration of the gate control circuit 34 may be changed to the configuration of the gate control circuit 34 in the sixth embodiment.

The number of semiconductor devices in the semiconductor module 40 may be changed in any manner. In an example, the semiconductor module 40 includes multiple semiconductor devices. In this case, the semiconductor devices are connected in parallel to each other.

Figure 36:
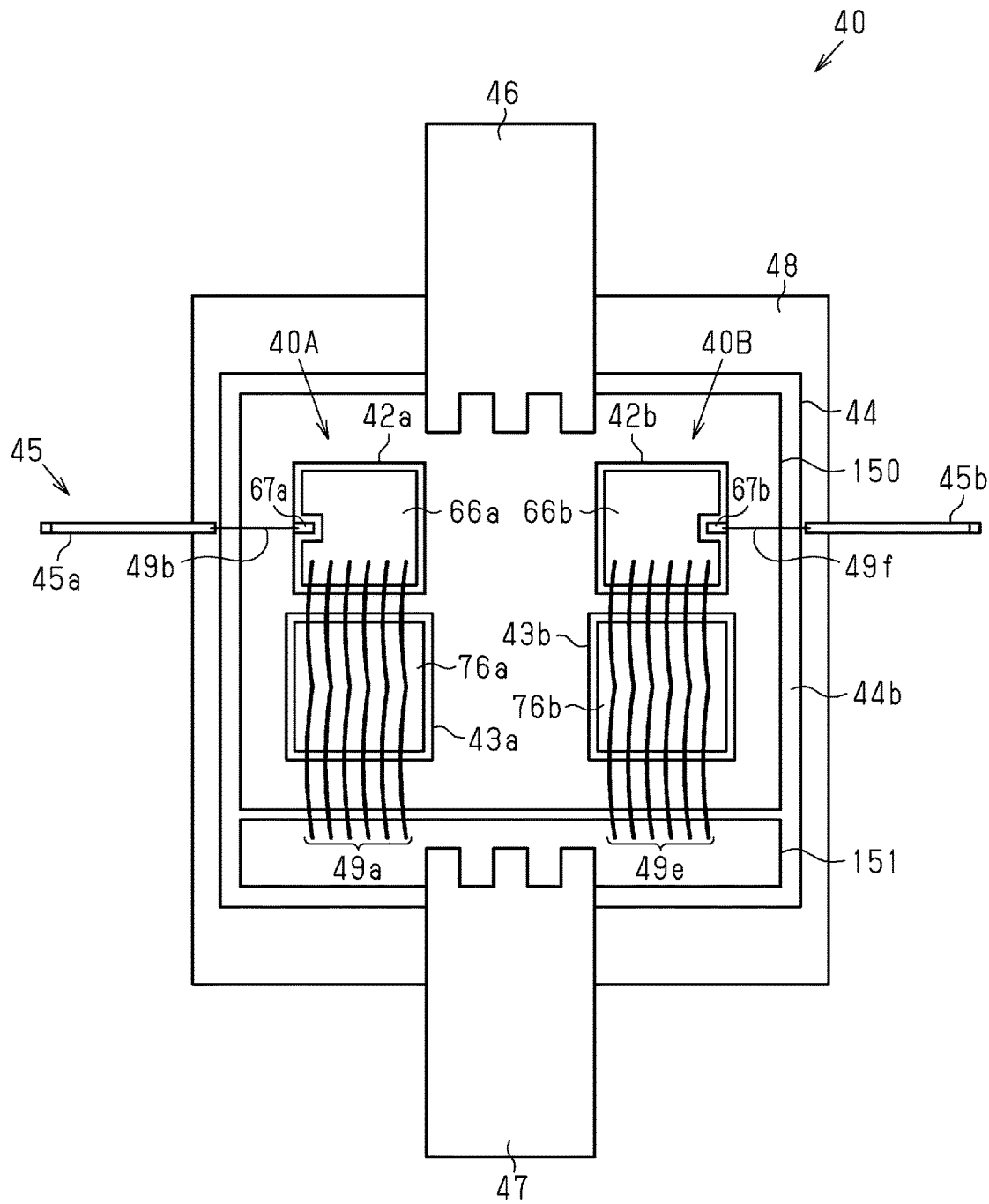
FIG. 36 is a schematic plan view of a modified example of a semiconductor module showing a layout of a semiconductor device.

FIG. 36 shows a configuration of the semiconductor module 40 including two semiconductor devices 40A and 40B.

A first wiring portion 150 and a second wiring portion 151 are arranged on the insulation substrate 44*b* of the metal substrate 44. The first wiring portion 150 and the second wiring portion 151 are arranged in the first direction X. The connection terminal 46 is connected to an end of the first wiring portion 150 located at the opposite side from the second wiring portion 151 in the first direction X. The connection terminal 47 is connected to the second wiring portion 151.

The IGBT 42*a* and the diode 43*a* of the semiconductor device 40A and the IGBT 42*b* and the diode 43*b* of the semiconductor device 40A are mounted on the first wiring portion 150. The IGBT 42*a* is spaced apart from the diode 43*a* in the first direction X. The IGBT 42*b* is spaced apart from the diode 43*b* in the first direction X. The IGBT 42*a* is spaced apart from the IGBT 42*b* in the second direction Y. The diode 43*a* is spaced apart from the diode 43*b* in the second direction Y.

The emitter electrode pad 66*a* of the IGBT 42*a*, the anode electrode pad 76*a* of the diode 43*a*, and the second wiring portion 151 are connected by multiple power wires 49*a* (in FIG. 36, six power wires 49*a*). The emitter electrode pad 66*b* of the IGBT 42*b*, the anode electrode pad 76*b* of the diode 43*b*, and the second wiring portion 151 are connected by multiple power wires 49*e* (in FIG. 36, six power wires 49*e*).

The semiconductor module 40 includes two control terminals 45*a* and 45*b*. The control terminal 45*a* is electrically connected to the gate electrode pad 67*a* of the IGBT 42*a* by the control wire 49*b*. The control terminal 45*b* is electrically connected to the gate electrode pad 67*b* of the IGBT 42*b* by a control wire 49*f*.

Figure 37:
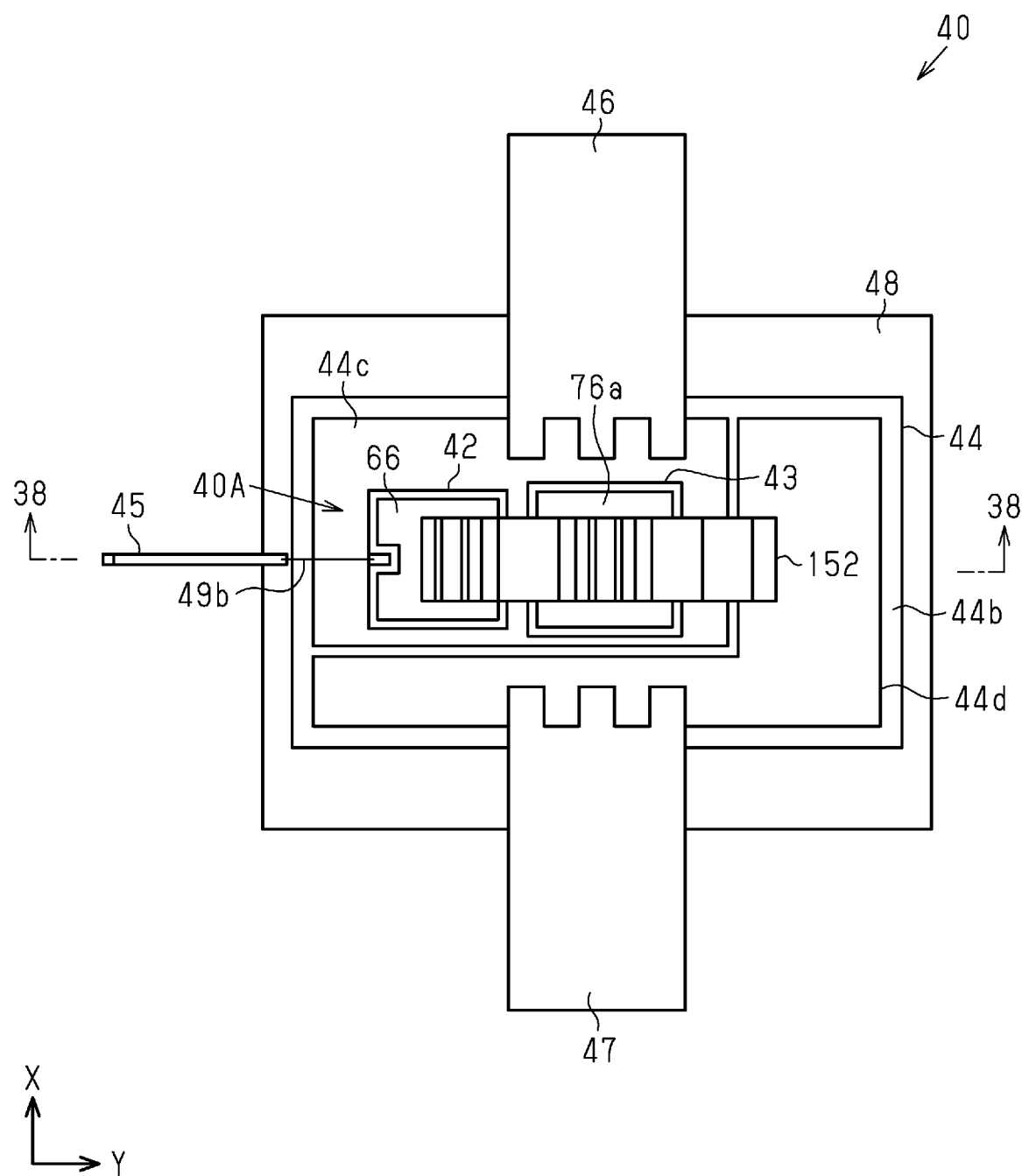
FIG. 37 is a schematic plan view of a modified example of a semiconductor module showing a layout of a semiconductor device.
Figure 38:
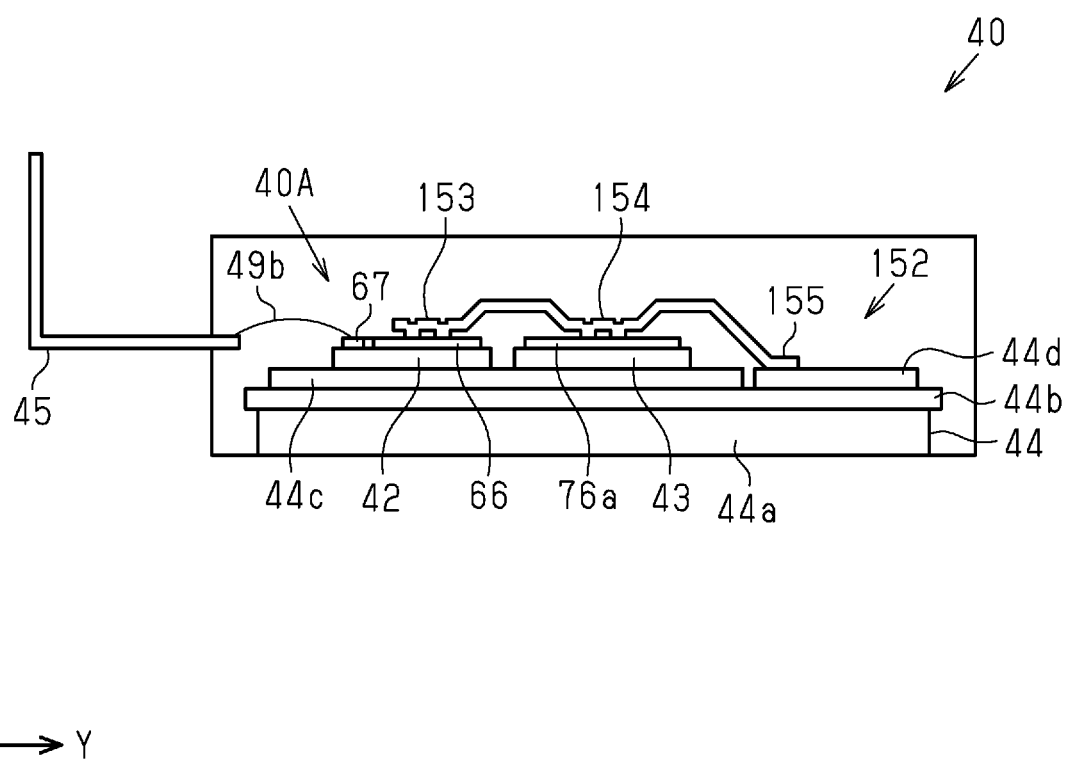
FIG. 38 is a cross-sectional view of the semiconductor module taken along line 38-38 in FIG. 37.

In the semiconductor device 40A, the IGBT 42, the diode 43, and the second wiring portion 44*d* may be connected using a plate clip instead of power wires. More specifically, as shown in FIG. 37, a clip 152 is connected to the emitter electrode pad 66 of the IGBT 42, the anode electrode pad 76*a* of the diode 43, and the second wiring portion 44*d*. In an example, the clip 152 is formed from copper (Cu). As shown in FIG. 38, the clip 152 includes a first contact 153 configured to contact the emitter electrode pad 66, a second contact 154 configured to contact the anode electrode pad 76*a*, and a third contact 155 configured to contact the second wiring portion 44*d*.

Figure 39:
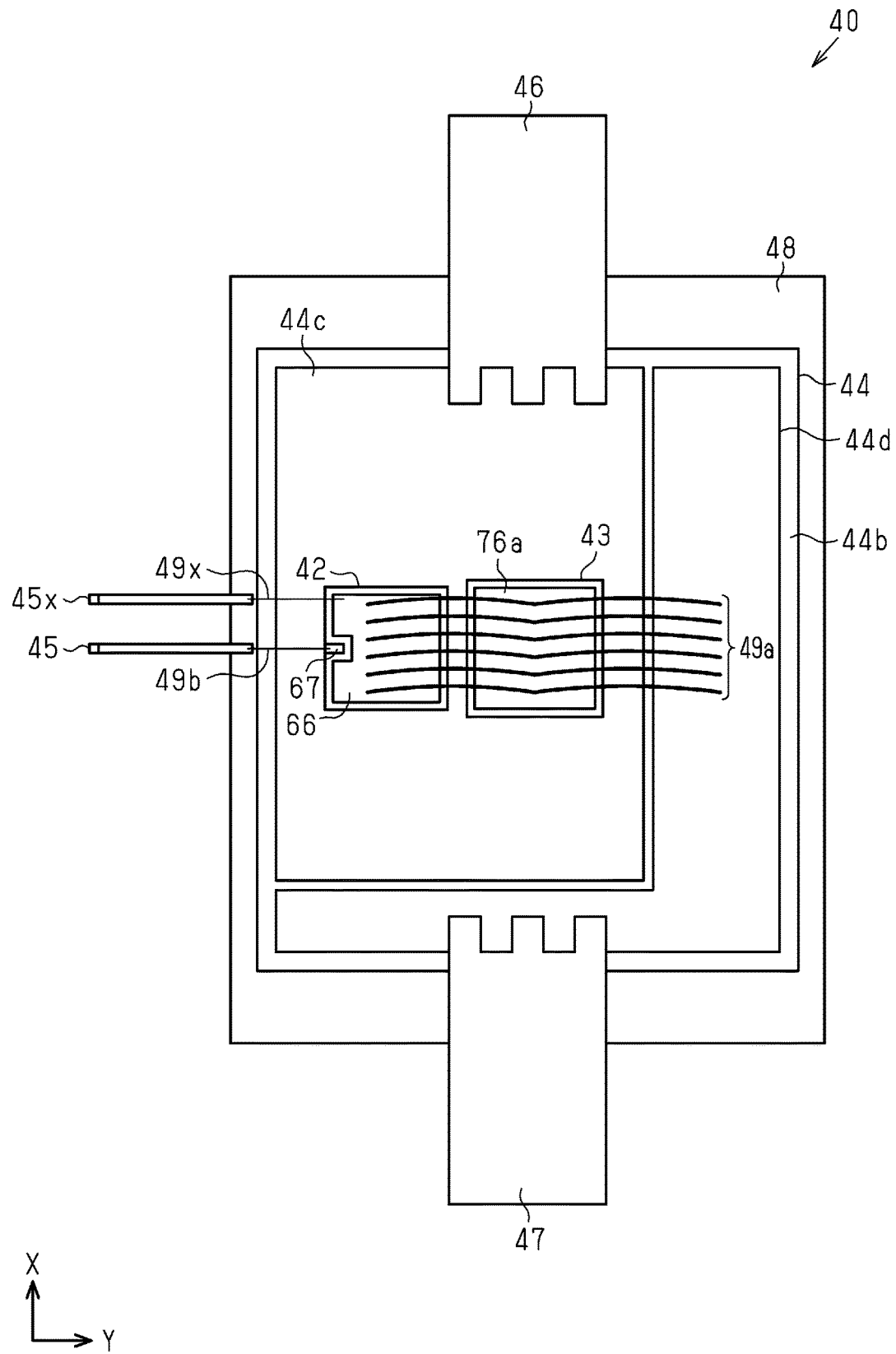
FIG. 39 is a schematic plan view of a modified example of a semiconductor module.

In the first embodiment, for example, as shown in FIG. 39, the semiconductor module 40 may include an emitter terminal 45*x* electrically connected to the emitter of the IGBT 42 in addition to the control terminal 45 connected to the gate of the IGBT 42. The emitter terminal 45*x* is connected to the emitter electrode pad 66 of the IGBT 42 by a wire 49*x*. The emitter terminal 45*x* is, for example, identical in shape to the control terminal 45.

In the first embodiment, the layout of the control terminal 45 may be changed in any manner. In an example, in a plan view of the semiconductor module 40, the control terminal 45 may be arranged adjacent to one of the connection terminal 46 and the connection terminal 47 in the second direction Y. The control terminals 45 (45A, 45B) of the second to sixth embodiments may be changed in the same manner.

In the third embodiment, the layout of the cathode region 114 in the RC-IGBT of the semiconductor device 40A may be changed in any manner. In an example, the cathode region 114 may have one of the layouts shown in FIGS. 40 to 42.

Figure 40:
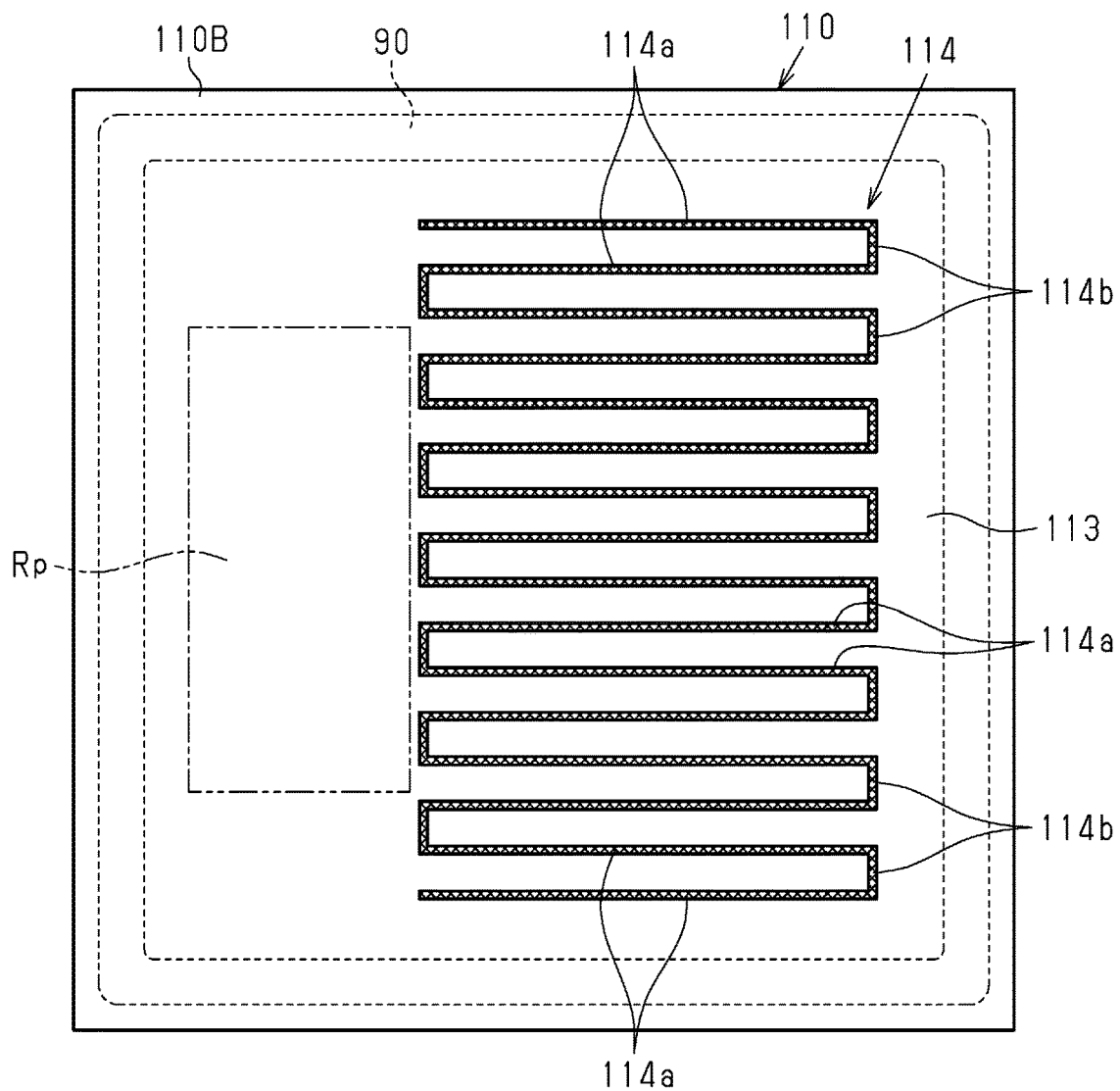
FIG. 40 is a bottom view of an RC-IGBT of a modified example of a semiconductor device.

FIG. 40 shows a first modified example of a cathode region 114 that includes the first lines 114*a* extending in the W direction and spaced apart from each other in the V direction and the second lines 114*b* extending in the V direction and connecting the first lines 114*a* that are adjacent to each other in the V direction as in the third embodiment. In the cathode region 114 shown in FIG. 40, the first lines 114*a* have the same length in the W direction. Also, the second lines 114*b* have the same length in the V direction. As shown in FIG. 40, the cathode region 114 is located closer to one end of the rear surface 110B of the semiconductor substrate 110 in the W direction than the region Rp is.

Figure 41:
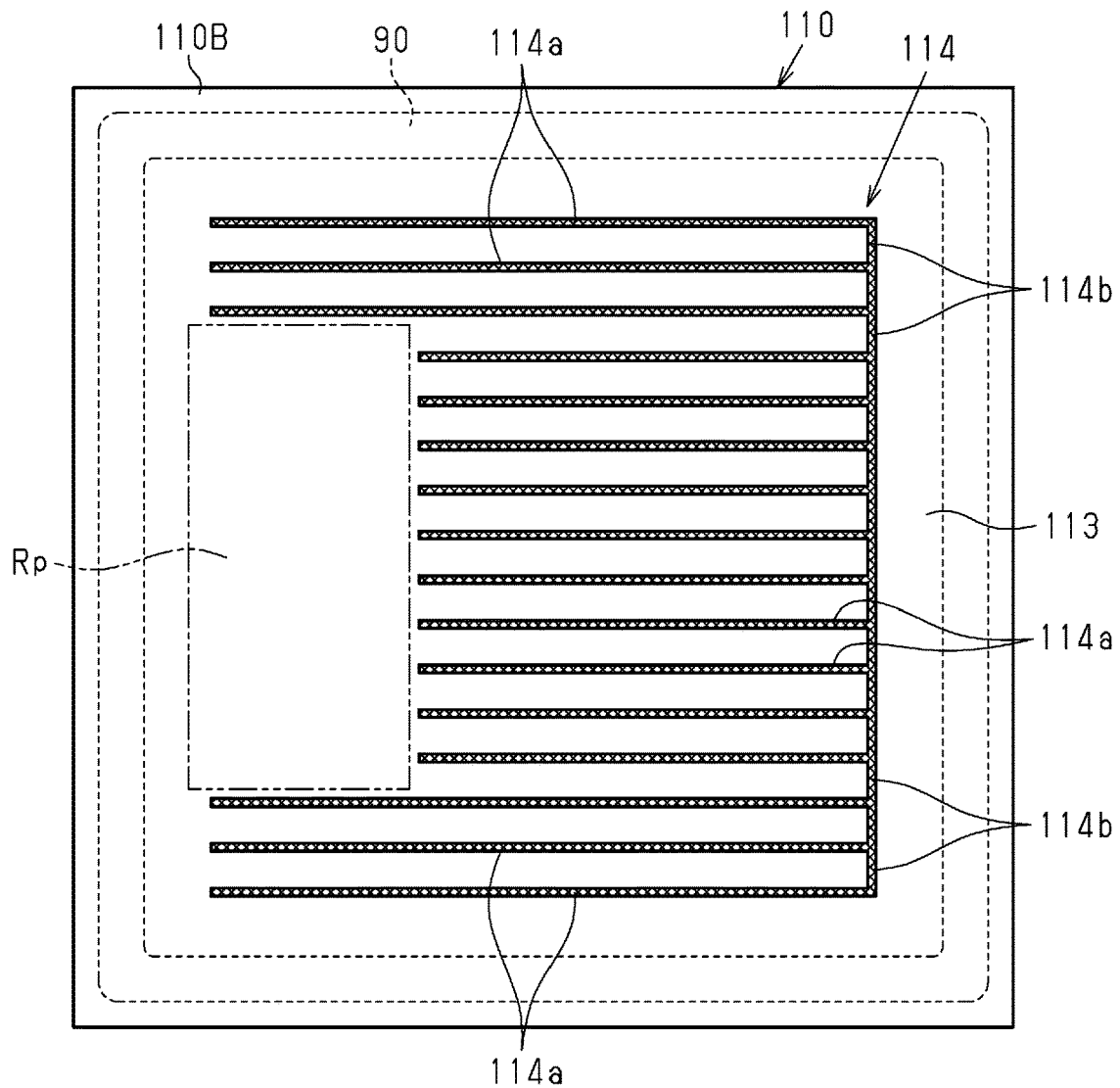
FIG. 41 is a bottom view of an RC-IGBT of a modified example of a semiconductor device.

FIG. 41 shows a second modified example of a cathode region 114 that includes the first lines 114*a* extending in the W direction and spaced apart from each other in the V direction and the second lines 114*b* extending in the V direction and connecting the first lines 114*a* that are adjacent to each other in the V direction as in the third embodiment. In the cathode region 114 of the second modified example, the second lines 114*b* connect the first lines 114*a* that are adjacent to each other in the V direction at one end in the W direction.

Figure 42:
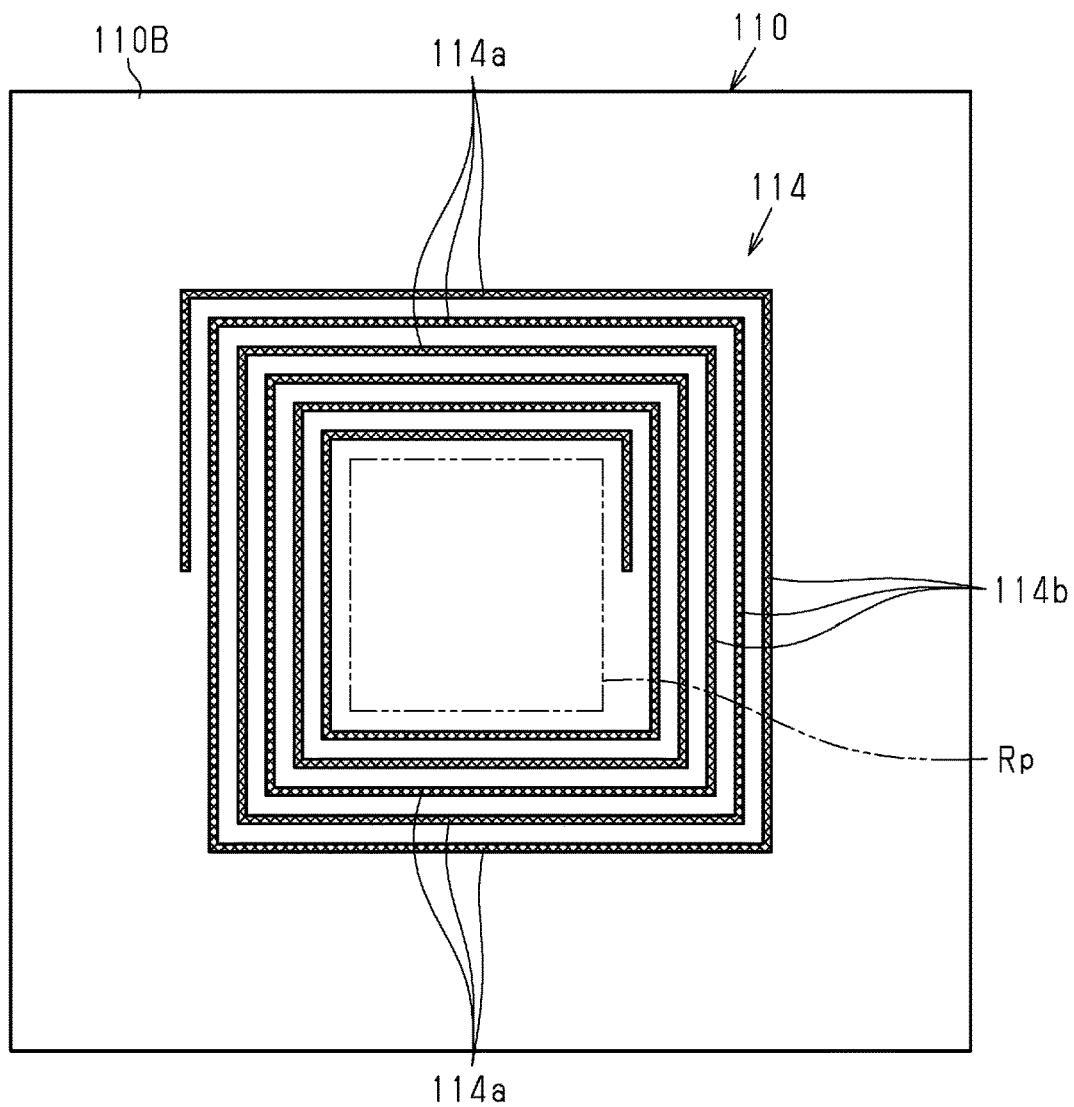
FIG. 42 is a bottom view of an RC-IGBT of a modified example of a semiconductor device.

FIG. 42 shows a third modified example in which the region Rp is located in a center of the semiconductor substrate 110. The cathode region 114 of the third modified example is shaped as a tetragonal loop extending around the region Rp in plan view. The cathode region 114 of the third modified example includes the first lines 114*a* extending in the W direction and spaced apart from each other in the V direction and the second lines 114*b* extending in the V direction and connecting the first lines 114a that are adjacent to each other in the V direction.

In the second to fourth embodiments, the order of arranging the gate electrode pad 92 of the IGBT 42, the anode electrode pad 93, the cathode electrode pad 94, the current sense pad 95, and the emitter potential pad 96 in the first direction X may be changed in any manner.

In the second to fourth embodiments, the layout of the temperature-sensing diode 80 of the IGBT 42 may be changed in any manner.

In the second to fourth embodiments, one of the temperature-sensing diode 80 and the current sense element 81 may be omitted from the IGBT 42. When the temperature-sensing diode 80 is omitted from the IGBT, the anode electrode pad 93 and the cathode electrode pad 94 may also be omitted. When the current sense element 81 is omitted from the IGBT, the current sense pad 95 may also be omitted.

Figure 43:
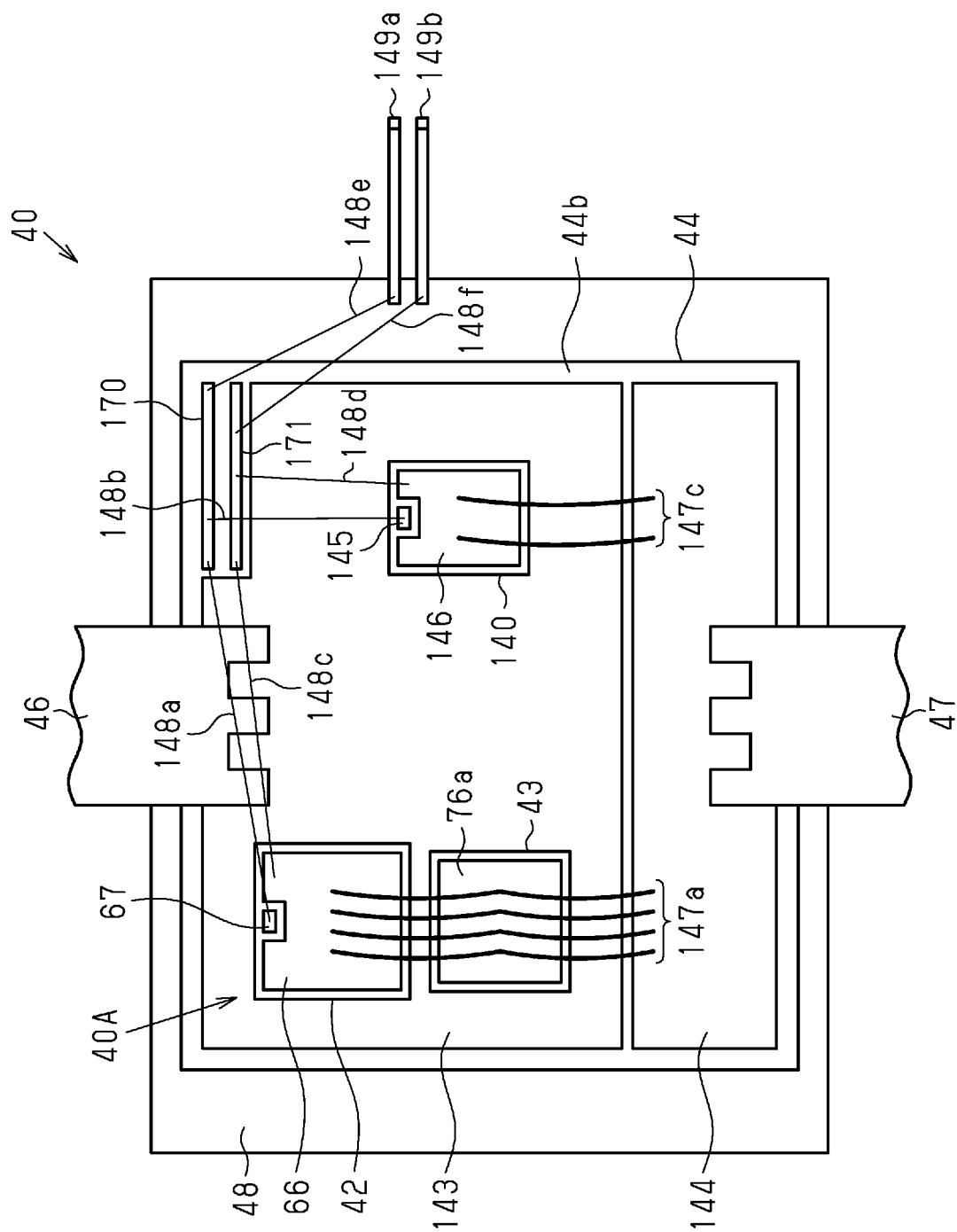
FIG. 43 is a schematic plan view of a modified example of a semiconductor module. Each of FIGS. 44A and 44B is a map showing a relationship between a terminal-to-terminal voltage of a capacitor and a frequency during an intermittent operation of an IGBT in a modified example of a semiconductor unit.

In the fifth embodiment, the layout of the IGBT 42, the diode 43, and the MOSFET 140 in the semiconductor module 40 may be changed in any manner. In an example, as shown in FIG. 43, as viewed in the first direction X, the IGBT 42 and the diode 43 may be arranged so that the IGBT 42 overlaps the diode 43. In this case, the emitter electrode pad 66 of the IGBT 42, the anode electrode pad 76a of the diode 43, and the second wiring portion 144 are connected by the power wires 147a.

In the sixth embodiment, in the first semiconductor device 40A, the IGBT 42a and the diode 43a may be formed from an RC-IGBT as in the third embodiment. In the second semiconductor device 40B, the IGBT 42b and the diode 43b may be formed from an RC-IGBT as in the third embodiment. In the third semiconductor device 40C, the IGBT 42c and the diode 43c may be formed of an RC-IGBT as in the third embodiment.

In each of the embodiments, the IGBTs 42 and 42a to 42c may be a planar gate IGBT instead of a trench gate IGBT.

In the sixth embodiment, the control circuit 33 may apply a voltage to the gates of the IGBTs 42a to 42c so that the time at which the voltage is applied to the gate of one of the IGBTs 42a to 42c differs from the time at which the voltage is applied to the gates of the other IGBTs 42a to 42c. For example, the time at which a voltage is applied to the gate of the IGBT 42b may differ from the time at which a voltage is applied to the gates of the IGBTs 42a and 42c. The IGBT 42a and the IGBT 42c are located at opposite sides of the IGBT 42b, that is, the IGBT 42a and the IGBT 42c are spaced apart from each other. Therefore, thermal effects produced by the IGBT 42a and the IGBT 42c on each other are small. An excessive increase in the temperature of the IGBTs 42a to 42c is limited by applying a voltage to the IGBT 42b at a different time.

When the current flowing to the IGBT 42 is greater than or equal to the threshold value or the temperature of the IGBT 42 is greater than or equal to the temperature threshold value, the control circuit 33 deactivates the IGBT 42. The process of deactivating the IGBT 42 may be changed as described in (A1) and (A2).

(A1) The number and diameter of each type of power wires 49a are set so that the power wires 49a are broken when the current flowing to the IGBT 42 is greater than or equal to a threshold value. The number and diameter of each type of power wires 49a are set within a range that does not excessively increase the conduction loss of the semiconductor module 40. The number and diameter of power wires 49a are set so that when a driving current and a regenerative current are greater than or equal to the rated current and less than two times the rated current, the power wires 49a will not break even if the current flows for a certain time or longer. Preferably, the threshold value is greater than or equal to two times the rated current and less than or equal to the four times the rated current. In an example, the rated current is a current flowing from the battery module 21 to the capacitor 13 when the battery module 21 is fully charged and the amount of charge stored in the capacitor 13 is zero. In an example, the number and diameter of power wires 49a are set so that the power wires 49a break when the threshold value is a current that is two times a predetermined rerated current and the current flows for a certain time. In another example, the number and diameter of power wires 49a may be set so that the power wires 49a break when the threshold value is a current that is three times the rated current and the current flows for a certain time.

In this configuration, when a large current flows from the battery module 21 toward the inverter circuit 12, if the large current flows to the semiconductor module 40, the power wires 49a break to block the supply of the large current to the inverter circuit 12. This deactivates the IGBT 42. Since the power wires 49a are used as fuses, fuses may be omitted.

The modified example described in (A1) may be applied to the configurations of the semiconductor units 41 shown in FIGS. 34 and 35. In this case, the number and diameter of power wires are set so that the power wires connected to the MOSFET 140 break when a current flowing to the MOSFET 140, instead of the IGBT 42, is greater than or equal to a threshold value. The settings of the number and diameter of power wires are the same as the settings of the number and diameter of power wires 49a described in (A1).

(A2) A voltage applied to the gate of the IGBT 42 is set to be less than or equal to a voltage applied to the gate at which the collector current Ic is saturated at a predetermined current. More specifically, the control circuit 33 controls the voltage between the emitter and the gate of the IGBT 42 to be less than or equal to a voltage at which the current flowing to the IGBT 42 is saturated at the predetermined current. An example of the voltage applied to the gate of the IGBT 42 at which the collector current Ic is saturated at the predetermined current is 10 V.

With this configuration, even when a large current flows from the battery module 21 toward the inverter circuit 12, the current flowing from the semiconductor module 40 to the inverter circuit 12 is limited to a current corresponding to the voltage applied to the gate of the IGBT 42 that is set as described above. This avoids a situation in which a large current flows to the inverter circuit 12 and breaks the inverter circuit 12, thereby dispensing with a fuse.

The modified example described in (A2) may be applied to the configurations of the semiconductor units 41 shown in FIGS. 34 and 35. In this case, the voltage applied to the gate of the MOSFET 140, instead of the IGBT 42, is set to be less than or equal to a voltage when the voltage is applied to the gate and the drain current is saturated at the predetermine current.

In the modified examples described in (A1) and (A2), the number of IGBTs 42 (the number of each kind of MOSFETs 140) may be changed in any manner. In an example, the semiconductor module 40 includes multiple IGBTs (multiple MOSFETs).

In each of the embodiments, pre-charge control may be changed as described in (B1) to (B6). Moreover, (B1) to (B6) may be combined with one another as long as there is no technical inconsistency.

Figure 44A:
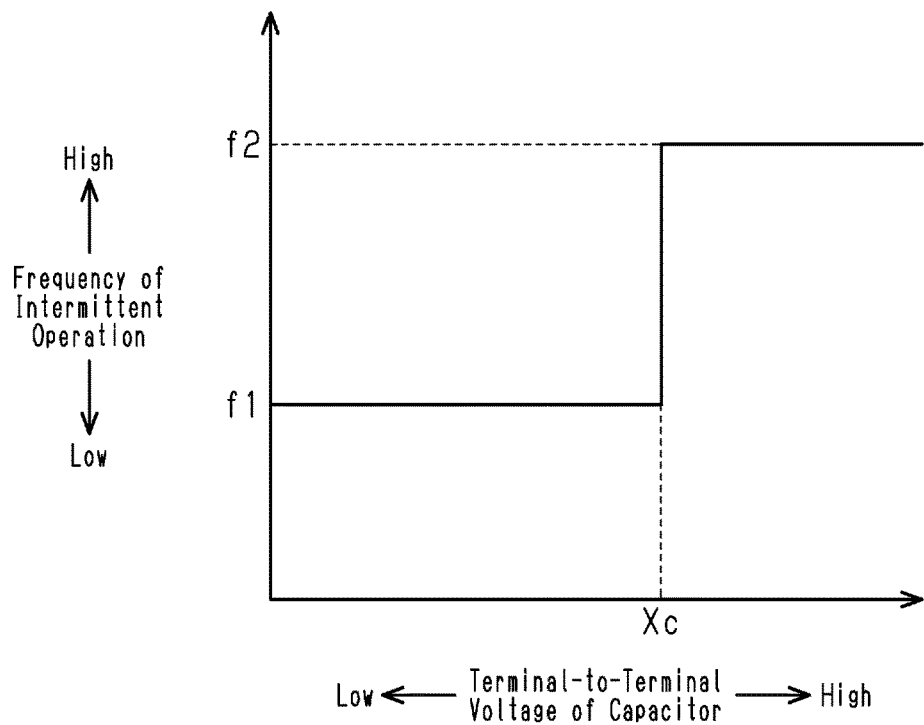
Figure 44B:
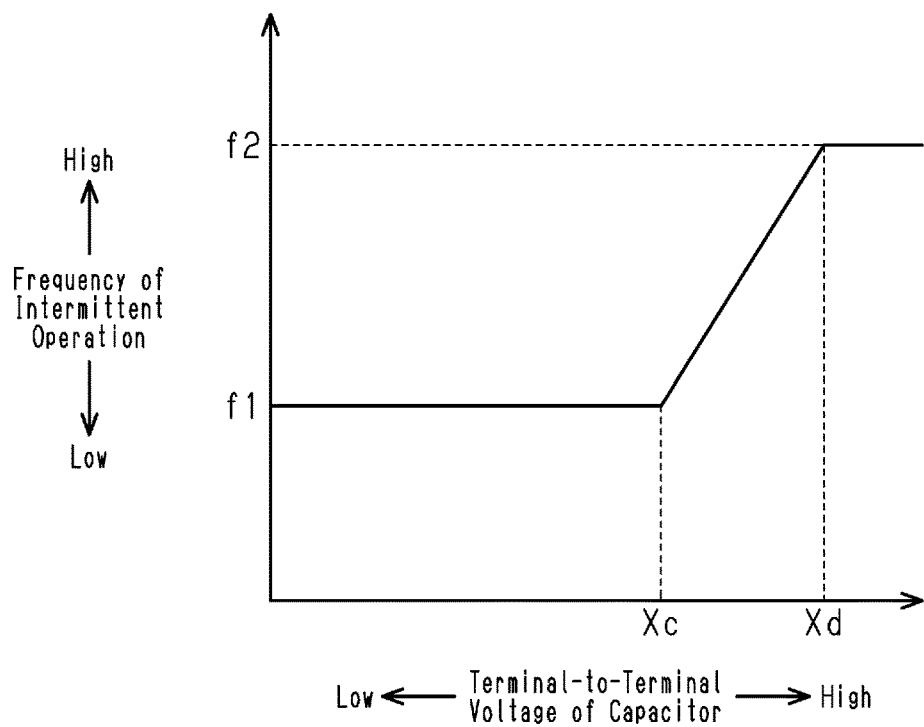

(B1) The control circuit 33 sets a frequency at which the IGBT 42 intermittently operates when the terminal-to-terminal voltage of the capacitor 13 is greater than or equal to a threshold value Xc to be higher than a frequency at which the IGBT 42 intermittently operates when the terminal-to-terminal voltage of the capacitor 13 is less than the threshold value Xc. The threshold value Xc is a value set in advance by tests or the like to determine that a large current caused by the difference in potential between the battery module 21 and the capacitor 13 will not flow. The control circuit 33 sets a frequency at which the IGBT 42 intermittently operates from the terminal-to-terminal voltage of the capacitor 13 using a map or a function that is information showing a relationship between the terminal-to-terminal voltage of the capacitor 13 and the frequency at which the IGBT 42 intermittently operates. FIG. 44A is a map showing a first example of information showing a relationship between the terminal-to-terminal voltage of the capacitor 13 and the frequency at which the IGBT 42 intermittently operates. As shown in FIG. 44A, when the terminal-to-terminal voltage of the capacitor 13 is in a range that is less than the threshold value Xc, the frequency at which the IGBT 42 intermittently operates is set to a first frequency f1. When the terminal-to-terminal voltage of the capacitor 13 is in a range that is greater than or equal to the threshold value Xc, the frequency at which the IGBT 42 intermittently operates is set to a second frequency f2, which is higher than the first frequency f1. FIG. 44B is a map showing a second example of information showing a relationship between the terminal-to-terminal voltage of the capacitor 13 and the frequency at which the IGBT 42 intermittently operates. As shown in FIG. 44B, when the terminal-to-terminal voltage of the capacitor 13 is in a range that is less than the threshold value Xc, the frequency at which the IGBT 42 intermittently operates is set to the first frequency f1. When the terminal-to-terminal voltage of the capacitor 13 is in a range that is greater than or equal to the threshold value Xc and less than or equal to an upper limit value Xd, which is greater than the threshold value Xc, the frequency at which the IGBT 42 intermittently operates increases as the terminal-to-terminal voltage of the capacitor 13 increases. When the terminal-to-terminal voltage of the capacitor 13 is in a range that is greater than or equal to the threshold value Xd, the frequency at which the IGBT 42 intermittently operates is set to the second frequency f2. The threshold value Xd is changed in any manner within a range that is greater than the threshold value Xc and less than or equal to the terminal-to-terminal voltage when the capacitor 13 is fully charged.

In a configuration that uses the map shown in FIG. 44A, the IGBT 42 intermittently operates at the second frequency f2 to increase the charging speed of the capacitor 13. In a configuration that uses the map shown in FIG. 44B, at the threshold value Xc or greater, as the speed of intermittent operation of the IGBT 42 increases, the charging speed of the capacitor 13 increases. As a result, the capacitor 13 is fully charged more quickly than a configuration in which the first frequency f1 is constantly maintained and the capacitor 13 is charged during pre-charge control.

Figure 45:
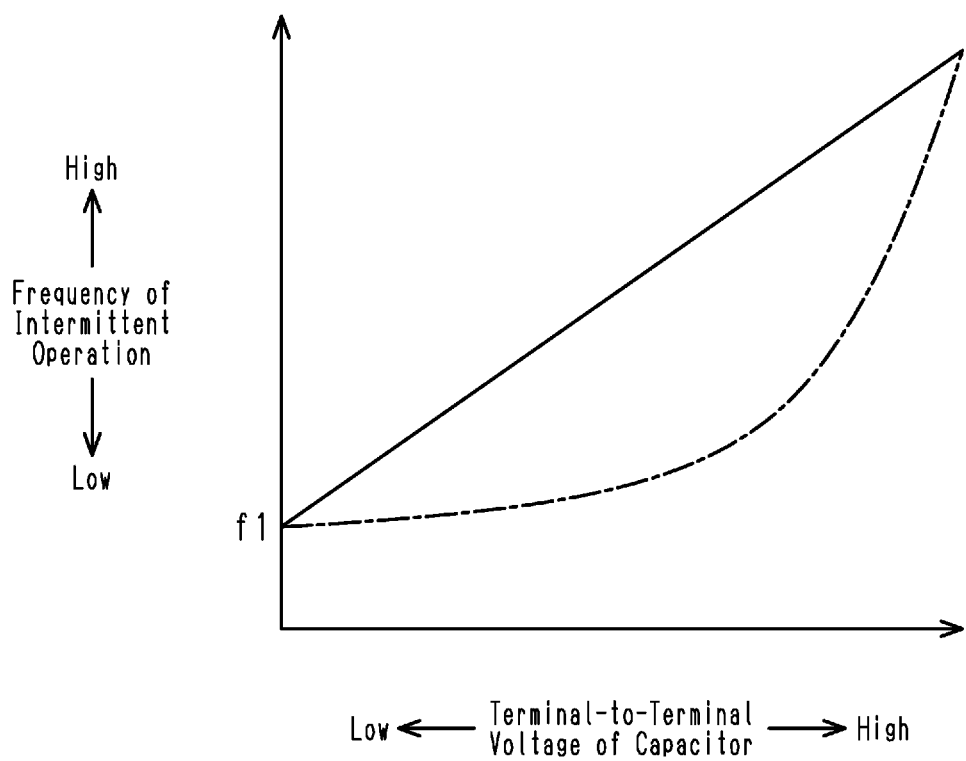
FIG. 45 is a map showing a relationship between a terminal-to-terminal voltage of a capacitor and a frequency during an intermittent operation of an IGBT in a modified example of a semiconductor unit.

(B2) As the terminal-to-terminal voltage of the capacitor 13 increases, the control circuit 33 increases the frequency at which the IGBT 42 intermittently operates. The control circuit 33 sets a frequency at which the IGBT 42 intermittently operates from the terminal-to-terminal voltage of the capacitor 13 using a map or a function that is information showing a relationship between the terminal-to-terminal voltage of the capacitor 13 and the frequency at which the IGBT 42 intermittently operates. FIG. 45 is a map that is information showing a relationship between the terminal-to-terminal voltage of the capacitor 13 and the frequency at which the IGBT 42 intermittently operates in the configuration (B2). In a first example, as indicated by the solid line in FIG. 45, the relationship between the terminal-to-terminal voltage of the capacitor 13 and the frequency at which the IGBT 42 intermittently operates is expressed by a linear function. In a second example, as indicated by the single-dashed line in FIG. 45, the relationship between the terminal-to-terminal voltage of the capacitor 13 and the frequency at which the IGBT 42 intermittently operates is expressed by a quadratic function. In the second example, when the terminal-to-terminal voltage of the capacitor 13 is in a low range, the frequency at which the IGBT 42 intermittently operates is generally the first frequency f1. When the terminal-to-terminal voltage of the capacitor 13 is in a high range, the frequency at which the IGBT 42 intermittently operates steeply increases as the terminal-to-terminal voltage increases.

This configuration increases the speed of intermittent operation of the IGBT 42 as the terminal-to-terminal voltage of the capacitor 13 increases, thereby increasing the charging speed of the capacitor 13. As a result, the capacitor 13 is fully charged more quickly than a configuration in which the first frequency f1 is constantly maintained and the capacitor 13 is charged during pre-charge control.

(B3) The control circuit 33 sets a voltage Vge applied to the gate of the IGBT 42 when the terminal-to-terminal voltage of the capacitor 13 is greater than or equal to the threshold value Xc to be higher than a voltage Vge applied to the gate of the IGBT 42 when the terminal-to-terminal voltage of the capacitor 13 is less than the threshold value Xc. The control circuit 33 sets the voltage Vge applied to the gate of the IGBT 42 from the terminal-to-terminal voltage of the capacitor 13 using a map or a function that is information showing a relationship between the terminal-to-terminal voltage of the capacitor 13 and the voltage Vge applied to the gate of the IGBT 42. FIG. 46A is a map showing a first example of information showing a relationship between the terminal-to-terminal voltage of the capacitor 13 and the voltage Vge applied to the gate of the IGBT 42. As shown in FIG. 46A, when the terminal-to-terminal voltage of the capacitor 13 is in a range that is less than the threshold value Xc, the voltage Vge applied to the gate of the IGBT 42 is set to a first voltage Vge1. When the terminal-to-terminal voltage of the capacitor 13 is in a range that is greater than or equal to the threshold value Xc, the voltage Vge applied to the gate of the IGBT 42 is set to a second voltage Vge2, which is higher than the first voltage Vge1. FIG. 46B is a map showing a second example of information showing a relationship between the terminal-to-terminal voltage of the capacitor 13 and the voltage Vge applied to the gate of the IGBT 42. As shown in FIG. 46B, when the terminal-to-terminal voltage of the capacitor 13 is in a range that is less than the threshold value Xc, the voltage Vge applied to the gate of the IGBT 42 is set to the first voltage Vge1. When the terminal-to-terminal voltage of the capacitor 13 is in a range that is greater than or equal to the threshold value Xc and less than or equal to the upper limit value Xd, the voltage Vge applied to the gate of the IGBT 42 increases as the terminal-to-terminal voltage of the capacitor 13 increases. When the terminal-to-terminal voltage of the capacitor 13 is in a range that is greater than or equal to the threshold value Xd, the voltage Vge applied to the gate of the IGBT 42 is set to the second voltage Vge2.

In a configuration that uses the map shown in FIG. 46A, when the second voltage Vge2 is applied to the gate of the IGBT 42, the current flowing to the IGBT 42 increases. This increases the charging speed of the capacitor 13. In a configuration that uses the map shown in FIG. 46B, at the threshold value Xc or greater, the current flowing to the IGBT 42 increases. This increases the charging speed of the capacitor 13. As a result, the capacitor 13 is fully charged more quickly than a configuration in which the voltage applied to the gate of the IGBT 42 is constantly maintained at the first voltage Vge1 and the capacitor 13 is charged during pre-charge control.

(B4) The control circuit 33 increases the voltage Vge applied to the gate of the IGBT 42 as the terminal-to-terminal voltage of the capacitor 13 increases. The control circuit 33 sets the voltage Vge applied to the IGBT 42 from the terminal-to-terminal voltage of the capacitor 13 using a map or a function that is information showing a relationship between the terminal-to-terminal voltage of the capacitor 13 and the voltage Vge applied to the gate of the IGBT 42. FIG. 47 is a map that is information showing a relationship between the terminal-to-terminal voltage of the capacitor 13 and the voltage Vge applied to the gate of the IGBT 42 in (B4). In a first example, as indicated by the solid line in FIG. 47, the relationship between the terminal-to-terminal voltage of the capacitor 13 and the voltage Vge applied to the gate of the IGBT 42 is expressed by a linear function. In a second example, as indicated by the single-dashed line in FIG. 47, the relationship between the terminal-to-terminal voltage of the capacitor 13 and the voltage Vge applied to the gate of the IGBT 42 is expressed by a quadratic function. In the second example, when the terminal-to-terminal voltage of the capacitor 13 is in a low range, the voltage Vge applied to the gate of the IGBT 42 is generally the first voltage Vge1. When the terminal-to-terminal voltage of the capacitor 13 is in a high range, the voltage Vge applied to the gate of the IGBT 42 steeply increases as the terminal-to-terminal voltage increases.

This configuration increases the voltage applied to the gate of the IGBT 42 as the terminal-to-terminal voltage of the capacitor 13 increases, thereby increasing the charging speed of the capacitor 13. As a result, the capacitor 13 is fully charged more quickly than a configuration in which the voltage applied to the gate of the IGBT 42 is constantly maintained at the first voltage Vge1 and the capacitor 13 is charged during pre-charge control.

(B5) The control circuit 33 sets a duty ratio of the IGBT 42 when the terminal-to-terminal voltage of the capacitor 13 is greater than or equal to the threshold value Xc to be higher than a duty ratio of the IGBT 42 when the terminal-to-terminal voltage of the capacitor 13 is less than the threshold value Xc. The control circuit 33 sets the duty ratio of the IGBT 42 from the terminal-to-terminal voltage of the capacitor 13 using a map or a function that is information showing a relationship between the terminal-to-terminal voltage of the capacitor 13 and the duty ratio of the IGBT 42. FIG. 48A is a map showing a first example of information showing a relationship between the terminal-to-terminal voltage of the capacitor 13 and the duty ratio of the IGBT 42. As shown in FIG. 48A, when the terminal-to-terminal voltage of the capacitor 13 is in a range that is less than the threshold value Xc, the duty ratio of the IGBT 42 is set to a first duty ratio D1. When the terminal-to-terminal voltage of the capacitor 13 is in a range that is greater than or equal to the threshold value Xc, the duty ratio of the IGBT 42 is set to a second duty ratio D2, which is higher than the first duty ratio D1. FIG. 48B is a map showing a second example of information showing a relationship between the terminal-to-terminal voltage of the capacitor 13 and the duty ratio of the IGBT 42. As shown in FIG. 48B, when the terminal-to-terminal voltage of the capacitor 13 is in a range that is less than the threshold value Xc, the duty ratio of the IGBT 42 is set to the first duty ratio D1. When the terminal-to-terminal voltage of the capacitor 13 is in a range that is greater than or equal to the threshold value Xc and less than or equal to an upper limit value Xd, which is greater than the threshold value Xc, the duty ratio of the IGBT 42 increases as the terminal-to-terminal voltage of the capacitor 13 increases. When the terminal-to-terminal voltage of the capacitor 13 is in a range that is greater than or equal to the threshold value Xd, the duty ratio of the IGBT 42 is set to the second duty ratio D2.

In a configuration that uses the map shown in FIG. 48A, when the duty ratio of the IGBT 42 is set to the second duty ratio D2, the current flowing to the IGBT 42 increases. This increases the charging speed of the capacitor 13. In a configuration that uses the map shown in FIG. 48B, at the threshold value Xc or greater, the duty ratio of the IGBT 42 increases. This increases the charging speed of the capacitor 13. Thus, the capacitor 13 is fully charged more quickly than a configuration in which the duty ratio of the IGBT 42 is constantly maintained at the first duty ratio D1 and the capacitor 13 is charged during pre-charge control.

(B6) The control circuit 33 increases the duty ratio of the IGBT 42 as the terminal-to-terminal voltage of the capacitor 13 increases. The control circuit 33 sets the duty ratio of the IGBT 42 from the terminal-to-terminal voltage of the capacitor 13 using a map or a function that is information showing a relationship between the terminal-to-terminal voltage of the capacitor 13 and the duty ratio of the IGBT 42. FIG. 49 is a map that is information showing a relationship between the terminal-to-terminal voltage of the capacitor 13 and the duty ratio of the IGBT 42 in (B6). In a first example, as indicated by the solid line in FIG. 49, the relationship between the terminal-to-terminal voltage of the capacitor 13 and the duty ratio of the IGBT 42 is expressed by a linear function. In a second example, as indicated by the single-dashed line in FIG. 49, the relationship between the terminal-to-terminal voltage of the capacitor 13 and the duty ratio of the IGBT 42 is expressed by a quadratic function. In the second example, when the terminal-to-terminal voltage of the capacitor 13 is in a low range, the duty ratio of the IGBT 42 is generally the first duty ratio D1. When the terminal-to-terminal voltage of the capacitor 13 is in a high range, the duty ratio of the IGBT 42 steeply increases as the terminal-to-terminal voltage increases.

This configuration increases the duty ratio of the IGBT 42 as the terminal-to-terminal voltage of the capacitor 13 increases, thereby increasing the charging speed of the capacitor 13. Thus, the capacitor 13 is fully charged more quickly than a configuration in which the duty ratio of the IGBT 42 is constantly maintained at the first duty ratio D1 and the capacitor 13 is charged during pre-charge control.

In (B1) to (B6) described above, the terminal-to-terminal voltage of the capacitor 13 is monitored to control the IGBT 42. Instead, for example, the control may be executed based on, for example, a collector-emitter voltage of the IGBT 42. In this case, control in (B1) to (B6) may be changed as described in (C1) to (C6). Even when the control in (B1) to (B6) is changed as described in (C1) to (C6), the same advantages as (B1) to (B6) are obtained.

(C1) The control circuit 33 sets a frequency at which the IGBT 42 intermittently operates when the collector-emitter voltage of the IGBT 42 is less than a threshold value to be higher than a frequency at which the IGBT 42 intermittently operates when the collector-emitter voltage of the IGBT 42 is greater than or equal to the threshold value. The control circuit 33 sets the frequency at which the IGBT 42 intermittently operates from the collector-emitter voltage of the IGBT 42 using a map or a function that is information showing a relationship between the collector-emitter voltage of the IGBT 42 and the frequency at which the IGBT 42 intermittently operates.

(C2) As the collector-emitter voltage of the IGBT 42 decreases, the control circuit 33 increases the frequency at which the IGBT 42 intermittently operates. The control circuit 33 sets the frequency at which the IGBT 42 intermittently operates from the collector-emitter voltage of the IGBT 42 using a map or a function that is information showing a relationship between the collector-emitter voltage of the IGBT 42 and the frequency at which the IGBT 42 intermittently operates.

(C3) The control circuit 33 sets the voltage Vge applied to the gate of the IGBT 42 when the collector-emitter voltage of the IGBT 42 is less than a threshold value to be higher than the voltage Vge applied to the gate of the IGBT 42 when the collector-emitter voltage of the IGBT 42 is greater than or equal to the threshold value. The control circuit 33 sets the voltage Vge applied to the gate of the IGBT 42 from the collector-emitter voltage of the IGBT 42 using a map or a function that is information showing a relationship between the collector-emitter voltage of the IGBT 42 and the voltage Vge applied to the gate of the IGBT 42.

(C4) The control circuit 33 increases the voltage Vge applied to the gate of the IGBT 42 as the collector-emitter voltage of the IGBT 42 decreases. The control circuit 33 sets the voltage Vge applied to the gate of the IGBT 42 from the collector-emitter voltage of the IGBT 42 using a map or a function that is information showing a relationship between the collector-emitter voltage of the IGBT 42 and the voltage Vge applied to the gate of the IGBT 42.

(C5) When the collector-emitter voltage of the IGBT 42 is less than a threshold value, the control circuit 33 increases the duty ratio of the IGBT 42 as compared to when the collector-emitter voltage of the IGBT 42 is greater than or equal to the threshold value. The control circuit 33 sets the duty ratio of the IGBT 42 from the collector-emitter voltage of the IGBT 42 using a map or a function that is information showing a relationship between the collector-emitter voltage of the IGBT 42 and the duty ratio of the IGBT 42.

(C6) The control circuit 33 increases the duty ratio of the IGBT 42 as the collector-emitter voltage of the IGBT 42 decreases. The control circuit 33 sets the duty ratio of the IGBT 42 from the collector-emitter voltage of the IGBT 42 using a map or a function that is information showing a relationship between the collector-emitter voltage of the IGBT 42 and the duty ratio of the IGBT 42.

In each of the embodiments, the configuration of the relay unit 30 may be changed as described in (D1) and (D2).

(D1) As shown in FIG. 50, the second relay 32 is omitted from the relay unit 30. That is, the low-voltage line LL directly connects the negative electrode of the battery module 21 and a lower switching element of the inverter circuit 12.

(D2) As shown in FIG. 51, the second relay 32 includes the semiconductor module 40 including a semiconductor device including a transistor such as an IGBT or a MOSFET instead of a mechanical contact type relay. In this modified example, the relay unit 30 is a relay unit that includes a positive-side semiconductor module arranged between the positive electrode of the battery module 21 and the inverter circuit 12 and a negative-side semiconductor module arranged between the negative electrode of the battery module 21 and the inverter circuit 12. In other words, the relay unit 30 of this modified example is a relay unit that includes a positive-side semiconductor device arranged between the positive electrode of the battery module 21 and the inverter circuit 12 and a negative-side semiconductor device arranged between the negative electrode of the battery module 21 and the inverter circuit 12. The semiconductor module 40 of the second relay 32 may have the same configuration as the semiconductor module 40 of the first relay 31 or may differ in the configuration from the semiconductor module 40. The semiconductor device of the second relay 32 may have the same configuration as the semiconductor device 40A or may differ in the configuration from the semiconductor device 40A. The number of semiconductor devices in the semiconductor module of the second relay 32 may differ from the number of semiconductor devices in the semiconductor module 40 of the first relay 31.

In each of the embodiments, the semiconductor device, the semiconductor module, and the semiconductor unit are included in the relay unit 30 arranged between the battery module 21 and the inverter circuit 12. However, the semiconductor device, the semiconductor module, and the semiconductor unit may be included in other locations. For example, as shown in FIG. 52, multiple relays mounted on the vehicle 1 may include the semiconductor device, the semiconductor module, and the semiconductor unit of each embodiment.

More specifically, the vehicle 1 shown in FIG. 52 is configured to charge the battery module 21 from a quick charging station SQC, which is an external power supply. The vehicle 1 includes a normal charging plug 4 and a DC-AC conversion device 5 electrically connected to the normal charging plug 4. For example, when the normal charging plug 4 is connected to a commercial AC power supply, AC power is supplied to the normal charging plug 4 and converted by the DC-AC conversion device 5 into DC power to charge the battery module 21. In the vehicle 1 having such a configuration, relays 161 and 162 may be arranged between the battery module 21 and a connection port 160 for a charging plug (not shown) of the quick charging station SQC. The relays 161 and 162 may include the semiconductor device, the semiconductor module, and the semiconductor unit of each embodiment. In addition, relays 163 and 164 may be arranged between the DC-AC conversion device 5 and the battery module 21. The relays 163 and 164 may include the semiconductor device, the semiconductor module, and the semiconductor unit of each embodiment. In addition, a relay 165 may be arranged between the battery module 21 and an on-board device (e.g., accessory device 6) supplied with power from the battery module 21. The relay 165 may include the semiconductor device, the semiconductor module, and the semiconductor unit of each embodiment. The accessory device 6 is, for example, an audio device or a car navigation device. In addition, in the modified example shown in FIG. 52, when the relays 161 to 164 include the semiconductor device of each embodiment, the relays 161 to 164 may be included in a single package.

CLAUSES

The technical aspects that are understood from the embodiments and the modified examples will be described below.

Clause A1. A semiconductor device including a first terminal for a battery, a second terminal for an inverter circuit, and a transistor. The semiconductor device is configured to control a voltage applied to a control terminal of the transistor to allow supply of a current from the first terminal to the second terminal and allow supply of a current from the second terminal to the first terminal. A withstand voltage between the first terminal and the second terminal is greater than or equal to a voltage between the battery and the inverter circuit.

Clause A2. The semiconductor device according to clause A1, in which the transistor is an insulated gate bipolar transistor (IGBT), the semiconductor device further includes a diode connected in antiparallel to the IGBT, and the IGBT includes a collector used as the first terminal and an emitter used as the second terminal.

Clause A3. The semiconductor device according to clause A2, in which the IGBT and the diode are provided as separate semiconductor chips.

Clause A4. The semiconductor device according to clause A2, in which the IGBT and the diode are formed on a same semiconductor substrate.

Clause A5. The semiconductor device according to any one of clauses A2 to A4 further includes a metal-oxide-semiconductor field-effect transistor (MOSFET) connected in parallel to the IGBT, in which the MOSFET includes a body diode used as a flyback diode.

Clause A6. The semiconductor device according to clause A5, in which the IGBT and the MOSFET are simultaneously activated and simultaneously deactivated.

Clause A7. The semiconductor device according to clause A1, in which the transistor is an IGBT, the semiconductor device further includes a MOSFET connected in parallel to the IGBT, the MOSFET includes a body diode used as a flyback diode, and when the pressure is less than the threshold value, the frequency is increased as compared to when the transistor intermittently operates.

Clause A8. The semiconductor device according to clause A7, in which the IGBT and the MOSFET are simultaneously activated and simultaneously deactivated.

Clause A9. The semiconductor device according to clause A1, in which the transistor is a MOSFET, and the semiconductor device further includes a diode connected in antiparallel to the MOSFET.

Clause A10. The semiconductor device according to clause A9, in which the MOSFET and the diode are provided as separate semiconductor chips.

Clause A11. The semiconductor device according to clause A9 or A10, in which the MOSFET includes a body diode used as a flyback diode.

Clause A12. The semiconductor device according to clause A1, in which the transistor is a MOSFET including a body diode used as a flyback diode.

Clause A13. A semiconductor device including a positive electrode of a battery, an IGBT arranged between the battery and an inverter circuit electrically connected, and a reverse blocking insulated gate bipolar transistor (RB-IGBT) connected in antiparallel to the IGBT.

Clause A14. The semiconductor device according to clause A13, in which the IGBT and the RB-IGBT are simultaneously activated and simultaneously deactivated.

Clause A15. A semiconductor module including semiconductor devices connected in parallel to each other, in which each of the semiconductor devices is the semiconductor device according to any one of clauses A1 to A14.

Clause A16. A relay unit including the semiconductor module according to clause A15.

Clause A17. A relay unit including the semiconductor device according to any one of clauses A1 to A14.

Clause A18. The relay unit according to clause A16 or A17 further including a mechanical contact type relay arranged between a negative electrode of the battery and the inverter circuit.

Clause A19. A relay unit including a positive-side semiconductor device arranged between a positive electrode of the battery and the inverter circuit, and a negative-side semiconductor device arranged between a negative electrode of the battery and the inverter circuit, in which the positive-side semiconductor device is the semiconductor device according to any one of clauses A1 to A14.

Clause A20. A relay unit including a positive-side semiconductor module arranged between a positive electrode of the battery and the inverter circuit, and a negative-side semiconductor module arranged between a negative electrode of the battery and the inverter circuit, in which the positive-side semiconductor module is the semiconductor module according to clause A15.

Clause A21. A battery unit including the battery and the relay unit according to any one of clauses A16 to A20.

Clause A22. A vehicle including the battery unit according to clause A21, the inverter circuit, and a motor driven by the inverter circuit.

Clause B1. A semiconductor unit including a semiconductor device including a transistor arranged between a positive electrode of a battery and an inverter circuit electrically connected to the battery, a controller connected to a control terminal of the transistor and configured to control the transistor, and a resistor arranged between the control terminal and the controller, in which the controller controls the transistor so that when a current flowing to the transistor is greater than or equal to a threshold value, the transistor is deactivated, and the resistor has a resistance value that is greater than or equal to 100Ω.

Clause B2. The semiconductor unit according to clause B1, in which the transistor includes a current sense element through which a current flows in proportion to the current flowing to the transistor.

Clause B3. The semiconductor unit according to clause B1 or B2, in which the transistor further includes a temperature-sensing diode.

Clause B4. The semiconductor unit according to clause B3, in which the controller further includes a temperature detection circuit that detects a temperature of the transistor from the temperature-sensing diode, and when the temperature detected by the temperature detection circuit is greater than or equal to a temperature threshold value, the controller provides a current decrease signal to the control terminal of the transistor.

Clause B5. The semiconductor unit according to clause B3 or B4, in which the transistor is provided as a semiconductor chip, and the temperature-sensing diode is arranged in a center of the semiconductor chip of the transistor.

Clause B6. The semiconductor unit according to clause B5, in which the transistor is an insulated-gate bipolar transistor (IGBT), the IGBT includes a semiconductor chip having a front surface and a rear surface, the front surface of the semiconductor chip includes an emitter electrode pad, the rear surface of the semiconductor chip includes a collector electrode, the emitter electrode pad is separated into two emitter electrode pads at a center of the front surface of the semiconductor chip, and the temperature-sensing diode is arranged between the two emitter electrode pads.

Clause B7. The semiconductor unit according to clause B6, in which the transistor includes a current sense element through which a current flows in proportion to the current flowing to the transistor, the front surface of the semiconductor chip includes a gate electrode pad, a current sense pad electrically connected to the current sense element, an anode electrode pad electrically connected to an anode of the temperature-sensing diode, and a cathode electrode pad electrically connected to a cathode of the temperature-sensing diode, the two emitter electrode pads include a cutaway portion cut away in a direction orthogonal to an arrangement direction of the two emitter electrode pads in a plan view of the transistor, the cutaway portion defines a region recessed in the direction orthogonal to the arrangement direction, and the gate electrode pad, the current sense pad, the anode electrode pad, and the cathode electrode pad are arranged in a direction parallel to the arrangement direction in the region.

Clause B8. The semiconductor unit according to any one of clauses B1 to B7, in which the semiconductor unit includes multiple of the semiconductor device, and the transistors of the multiple semiconductor devices are connected in parallel to each other.

Clause B9. The semiconductor unit according to clause B8, in which each of the transistors of the multiple semiconductor devices includes a temperature-sensing diode.

Clause B10. The semiconductor unit according to clause B9, in which the controller includes temperature detection circuits, the temperature detection circuits respectively detect temperatures of the transistors of the multiple semiconductor devices from the temperature-sensing diodes of the multiple semiconductor devices, and when at least one of the temperatures detected by the temperature detection circuits is greater than or equal to a temperature threshold value, the controller provides a current decrease signal to each of the control terminals of the transistors of the multiple semiconductor devices.

Clause B11. A battery unit including the battery and the semiconductor unit according to any one of clauses B1 to B10.

Clause B12. A vehicle including the battery unit according to clause B11, the inverter circuit, and a motor driven by the inverter circuit.

Clause C1. A semiconductor unit including a semiconductor device including a transistor arranged between a positive electrode of a battery and an inverter circuit electrically connected to the battery, and a controller connected to a control terminal of the transistor and configured to control the transistor, in which the transistor is an IGBT or a MOSFET, the controller controls a voltage between an emitter or a source of the transistor and a gate of the transistor to be less than or equal to a voltage at which a current flowing to the transistor is less than or equal to a saturation current.

Clause C2. The semiconductor unit according to clause C1, in which the semiconductor unit includes multiple of the semiconductor device, and the transistors of the multiple semiconductor devices are connected in parallel to each other.

Clause C3. The semiconductor unit according to clause C2, in which the controller controls a voltage between an emitter or a source and a gate of each of the transistors of the multiple semiconductor devices so that a current flowing to each of the transistors is less than or equal to the saturation current.

Clause C4. A battery unit including the battery and the semiconductor unit according to any one of clauses C1 to C3.

Clause C5. A vehicle including the battery unit according to clause C4, the inverter circuit, and a motor driven by the inverter circuit.

Clause D1. A semiconductor device including a transistor arranged between a positive electrode of a battery and an inverter circuit electrically connected to the battery and at least one bonding wire connected to the transistor, in which the number of bonding wires and a diameter of the bonding wire are set so that the bonding wire breaks when a current flowing to the transistor is greater than or equal to a threshold value.

Clause D2. The semiconductor device according to clause D1, in which the threshold value is two or more times a rated current of the transistor and four or less times the rated current of the transistor.

Clause D3. A semiconductor unit including the semiconductor device according to clause D1 or D2 and a controller that controls the semiconductor device.

Clause D4. The semiconductor unit according to clause D3, in which the semiconductor unit includes multiple of the semiconductor device, and the transistors of the multiple semiconductor devices are connected in parallel to each other.

Clause D5. A battery unit including the battery and the semiconductor unit according to clause D3 or D4.

Clause D6. A vehicle including the battery unit according to clause D5, the inverter circuit, and a motor driven by the inverter circuit.

DESCRIPTION OF THE REFERENCE NUMERALS 1) vehicle, 11) motor, 12) inverter circuit, 13) capacitor, 20) battery unit, 21) battery module (battery), 30) relay unit, 32) second relay (mechanical contact type relay), 33) control circuit (controller), 34) gate control circuit, 36) current limiting resistor, 37) temperature detection circuit, 40) semiconductor module, 40A) first semiconductor device (semiconductor device), 40B) second semiconductor device (semiconductor device), 40C) third semiconductor device (semiconductor device), 41) semiconductor unit 42, 42*rb*, 42*a*, 42*b*, 42*c*) IGBT, 43, 43*a*, 43*b*, 43*c*) diode, 49*a*) power wire, 50, 110) semiconductor substrate, 64) collector electrode, 66) emitter electrode pad, 67) gate electrode pad, 76*a*) anode electrode pad, 80) temperature-sensing diode, 81) current sense element, 91A, 91B) emitter electrode pad, 92) gate electrode pad, 93) anode electrode pad, 94) cathode electrode pad, 95) current sense pad, 97) cutaway portion, 101) anode electrode pad, 102) current sense pad, 140) MOSFET, 140*a*) body diode, X) first direction (arrangement direction), Y) second direction (direction orthogonal to an arrangement direction)

The invention claimed is:
1. A semiconductor unit comprising:
 a transistor including:
  a first terminal configured for connection to a battery;
  a second terminal configured for connection to an inverter circuit; and
  a control terminal; and
 a controller connected to the control terminal of the transistor, the controller outputting a control voltage for controlling on-off operations of the transistor, wherein
 when power starts to be supplied from the first terminal to the second terminal, the controller controls the control voltage to intermittently operate the transistor and also decreases the control voltage to be lower than the control voltage at which the transistor is fully activated,
 the transistor is provided as a semiconductor chip, the semiconductor unit further comprises a temperature-sensing diode arranged in a central portion of a front surface of the semiconductor chip, and a current sense element, the front surface of the semiconductor chip includes a first pad, a second pad electrically connected to a gate electrode, a third pad electrically connected to the current sense element, a fourth pad electrically connected to an anode of the temperature-sensing diode, and a fifth pad electrically connected to a cathode of the temperature-sensing diode, the first pad includes a cutaway portion that is cut away inwardly from an outer circumference of the first pad in a plan view of the transistor, and the second pad, the third pad, the fourth pad, and the fifth pad are arranged in a region defined by the cutaway portion.

2. The semiconductor unit according to claim 1, wherein the control voltage at which the transistor intermittently operates is approximately one-half of the control voltage at which the transistor is to fully activated.

3. The semiconductor unit according to claim 1, wherein a frequency at which the transistor intermittently operates is less than or equal to 1000 Hz.

4. The semiconductor unit according to claim 1, wherein a duty ratio at which the transistor intermittently operates is less than 50%.

5. The semiconductor unit according to claim 1, wherein
a capacitor is arranged between the second terminal and the inverter circuit electrically connected to the second terminal, the capacitor connected in parallel to the inverter circuit, and
the controller sets a frequency at which the transistor intermittently operates when the terminal-to-terminal voltage of the capacitor is greater than or equal to a threshold value to be higher than a frequency at which the transistor intermittently operates when the terminal-to-terminal voltage of the capacitor is less than the threshold value.

6. The semiconductor unit according to claim 5, wherein the controller increases the frequency at which the transistor intermittently operates as the terminal-to-terminal voltage of the capacitor increases.

7. The semiconductor unit according to claim 1, wherein
a capacitor is arranged between the second terminal and the inverter circuit electrically connected to the second terminal, the capacitor connected in parallel to the inverter circuit, and
the controller sets the control voltage of the capacitor when the terminal-to-terminal voltage of the capacitor is greater than or equal to a threshold value to be higher than a control voltage of the capacitor when the terminal-to-terminal voltage of the capacitor is less than the threshold value.

8. The semiconductor unit according to claim 7, wherein the controller increases the control voltage of the transistor as the terminal-to-terminal voltage of the capacitor increases.

9. The semiconductor unit according to claim 1, wherein
a capacitor is arranged between the second terminal and the inverter circuit electrically connected to the second terminal, the capacitor connected in parallel to the inverter circuit, and
the controller controls the control voltage applied when the capacitor is fully charged to be equal to the control voltage at which the transistor is fully activated.

10. The semiconductor unit according to claim 1, comprising:
multiple of the transistor;
wherein the multiple transistors are connected in parallel to each other.

11. The semiconductor unit according to claim 10, wherein the controller separately controls the multiple transistors.

12. The semiconductor unit according to claim 11, wherein the controller controls the control voltage so that the control voltage is applied to each of the multiple transistors at a time that differs between the multiple transistors.

13. A battery unit, comprising:
the battery electrically connected to the first terminal; and
the semiconductor unit according to claim 1.

14. A vehicle, comprising:
the battery unit according to claim 13;
the inverter circuit electrically connected to the second terminal;
a capacitor connected in parallel to the inverter circuit; and
a motor driven by the inverter circuit.

15. The semiconductor unit according to claim 1, wherein
the transistor is a semiconductor chip including an insulated-gate bipolar transistor (IGBT),
the first pad is an emitter electrode pad,
the second pad is a gate electrode pad,
the third pad is a current sense pad,
a rear surface of the semiconductor chip includes a collector electrode,
the emitter electrode pad is separated into two emitter electrode pads at a center of the front surface of the semiconductor chip, and
the temperature-sensing diode is arranged between the two emitter electrode pads.

16. The semiconductor unit according to claim 15, wherein
the cutaway portion is cut away inwardly in a direction orthogonal to an arrangement direction of the two emitter electrode pads in the plan view of the transistor, and
in the region defined by the cutaway portion, the second pad, the third pad, the fourth pad, and the fifth pad are arranged in a direction parallel to the arrangement direction.

17. The semiconductor unit according to claim 1, wherein the controller applies the control voltage to the control terminal, the control voltage varying in a stepped manner as time elapses.

18. The semiconductor unit according to claim 1, wherein the control terminal is connected to a current limiting resistor.

19. The semiconductor unit according to claim 1, wherein the semiconductor chip includes a silicon carbide (SiC) semiconductor substrate.

20. The semiconductor unit according to claim 1, wherein
the transistor is a semiconductor chip including a metal-oxide-semiconductor field-effect transistor (MOSFET),
the first pad is a source electrode pad,
the second pad is a gate electrode pad,
the third pad is a current sense pad,
a rear surface of the semiconductor chip includes a drain electrode,
the source electrode pad is separated into two source electrode pads at a center of the front surface of the semiconductor chip, and the temperature-sensing diode is arranged between the two source electrode pads.

21. The semiconductor unit according to claim 20, wherein the cutaway portion is cut away inwardly in a direction orthogonal to an arrangement direction of the two source electrode pads in the plan view of the transistor, and in the region defined by the cutaway portion, the second pad, the third pad, the fourth pad, and the fifth pad are arranged in a direction parallel to the arrangement direction.

\* \* \* \* \*